(12) United States Patent
Kim et al.

(10) Patent No.: US 12,375,598 B2
(45) Date of Patent: Jul. 29, 2025

(54) DISPLAY APPARATUS AND ELECTRONIC DEVICE INCLUDING THE DISPLAY APPARATUS

(71) Applicant: Samsung Display Co., Ltd., Yongin-si (KR)

(72) Inventors: Jongseok Kim, Yongin-si (KR); Semyung Kwon, Yongin-si (KR); Yunkyeong In, Yongin-si (KR); Yunsik Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 536 days.

(21) Appl. No.: 17/841,164

(22) Filed: Jun. 15, 2022

(65) Prior Publication Data
US 2022/0416001 A1    Dec. 29, 2022

(30) Foreign Application Priority Data

Jun. 29, 2021 (KR) .................. 10-2021-0084871

(51) Int. Cl.
| | |
|---|---|
| H01L 27/32 | (2006.01) |
| G09G 3/3233 | (2016.01) |
| H04M 1/02 | (2006.01) |
| H10K 50/86 | (2023.01) |
| H10K 59/131 | (2023.01) |
| H10K 59/80 | (2023.01) |

(Continued)

(52) U.S. Cl.
CPC ........ *H04M 1/0266* (2013.01); *G09G 3/3233* (2013.01); *H10K 50/865* (2023.02); *H10K 59/131* (2023.02); *H10K 59/8792* (2023.02); *G09G 3/035* (2020.08); *G09G 2300/0426* (2013.01); *G09G 2300/0819* (2013.01); *G09G 2300/0842* (2013.01); *H10K 59/122* (2023.02); *H10K 59/871* (2023.02); *H10K 59/8722* (2023.02); *H10K 59/873* (2023.02)

(58) Field of Classification Search
None
See application file for complete search history.

(56) References Cited

U.S. PATENT DOCUMENTS

| | | |
|---|---|---|
| 10,756,136 B1 | 8/2020 | Ma et al. |
| 11,115,514 B2 | 9/2021 | Lee et al. |

(Continued)

FOREIGN PATENT DOCUMENTS

| | | |
|---|---|---|
| CN | 110890412 | 3/2020 |
| KR | 10-2020-0115772 | 10/2020 |

*Primary Examiner* — William C Trapanese
(74) *Attorney, Agent, or Firm* — KILE PARK REED & HOUTTEMAN PLLC

(57) ABSTRACT

A display apparatus includes a pixel circuit on a display area of a substrate; a first signal line on the display area transmitting a first signal to the pixel circuit; a first connection line disposed on a first line area, electrically connected to the first signal line, and disposed on a different layer from the first signal line; a first bridge metal that electrically connects the first signal line to the first connection line; a second signal line disposed on the display area and transmitting a second signal to the pixel circuit; a second connection line disposed on the first line area, electrically connected to the second signal line, and disposed on a different layer from the second signal line; and a second bridge metal that connects the second signal line to the second connection line.

30 Claims, 16 Drawing Sheets

(51) Int. Cl.
  *G09G 3/00* (2006.01)
  *H10K 59/122* (2023.01)

(56) References Cited

U.S. PATENT DOCUMENTS

2020/0176527 A1* 6/2020 An .................... H10K 59/1213
2020/0312248 A1 10/2020 Shin et al.
2021/0159286 A1 5/2021 Ma et al.

* cited by examiner

DISPLAY APPARATUS AND ELECTRONIC DEVICE INCLUDING THE DISPLAY APPARATUS

CROSS-REFERENCE TO RELATED APPLICATION(S)

This application claims priority to and benefits of Korean Patent Application No. 10-2021-0084871 under 35 U.S.C. § 119, filed on Jun. 29, 2021, in the Korean Intellectual Property Office, the entire contents of which are incorporated herein by reference.

BACKGROUND

1. Technical Field

One or more embodiments relate to a display apparatus and an electronic device including the display apparatus, and, to a display apparatus including an area having improved transmittance, and an electronic device including the display apparatus.

2. Description of the Related Art

Recently, the usage of display apparatuses has diversified. Also, display apparatuses have become thinner and more lightweight, and thus, the use of display apparatuses has expanded.

By increasing the area occupied by an active area in display apparatuses, various functions have been connected to or linked to the display apparatuses. In order to further increase the area and add various functions, studies have been conducted into a display apparatus having, in an active area, an area for adding various functions other than an image displaying function.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include an electronic device in which a camera module and/or a sensor module are disposed below a display apparatus.

Additional aspects will be set forth in part in the description which follows and, in part, will be apparent from the description, or may be learned by practice of the embodiments of the disclosure.

According to one or more embodiments, an electronic device may include a housing including a rear side and a lateral side; a cover window disposed above the housing; a display apparatus disposed below the cover window; and a camera module disposed below the display apparatus, wherein the display apparatus may include a substrate including a first area and a second area adjacent to the first area, the first area including a line area, a display area, and a transmission area, the line area including a first line area extending in a first direction and a second line area extending in a second direction intersecting the first direction; a pixel circuit disposed on the display area of the first area; a first signal line disposed on the display area of the first area and transmitting a first signal to the pixel circuit; a first connection line disposed on the first line area of the first area, and electrically connected to the first signal line, the first connection line and the first signal line being disposed on a different layer; a first bridge metal that electrically connects the first signal line to the first connection line; a second signal line disposed on the display area of the first area transmitting a second signal to the pixel circuit; a second connection line disposed on the first line area of the first area, electrically connected to the second signal line, and the second connection line and the second signal line being disposed on a different layer; and a second bridge metal that electrically connects the second signal line to the second connection line, wherein the first connection line and the second connection line at least partially overlap each other in a third direction perpendicular to the substrate.

In an embodiment, the electronic device may further include a third signal line disposed on the display area of the first area and transmitting a third signal to the pixel circuit; and a third connection line disposed on the first line area of the first area, electrically connected to the third signal line, the third connection line and the third signal line being disposed on a same layer.

In an embodiment, the electronic device may further include a data line disposed on the display area of the first area transmitting a data signal to the pixel circuit; and a data connection line disposed on the second line area of the first area, electrically connected to the data line, the data connection line and the data line being disposed on a different layer.

In an embodiment, the data line and the data connection line may be electrically connected to each other by a third bridge metal.

In an embodiment, the electronic device may further include a voltage line disposed on the display area of the first area and transmitting a voltage to the pixel circuit, and a voltage connection line disposed on the second line area of the first area and electrically connected to the voltage line.

In an embodiment, the data connection line and the voltage connection line may at least partially overlap each other in the third direction.

In an embodiment, the electronic device may further include a first thin-film transistor disposed on the substrate, the first thin-film transistor including a first semiconductor layer including a silicon semiconductor and a first gate electrode insulated from the first semiconductor layer; an upper electrode insulated from the first gate electrode; an insulating layer overlapping the upper electrode in the third direction; a second thin-film transistor disposed on the insulating layer, the second thin-film transistor including a second semiconductor layer and a second gate electrode; the second semiconductor layer including an oxide semiconductor and the second gate electrode being insulated from the second semiconductor layer; a first connection electrode disposed on the second gate electrode; and a second connection electrode disposed on the first connection electrode.

In an embodiment, the first signal line, the second signal line, and at least one of the first gate electrode, the upper electrode, and the second gate electrode may be disposed on a same layer.

In an embodiment, the data line, the voltage line, and at least one of the first connection electrode and the second connection electrode may be disposed on a same layer.

In an embodiment, the first connection line and the second connection line may extend in the first direction, and the data connection line and the voltage connection line may extend in the second direction.

In an embodiment, the electronic device may further include a light blocking layer disposed on the display area, the first line area, and the second line area of the first area, the light blocking layer including a first hole corresponding to the transmission area.

In an embodiment, an edge of the light blocking layer forming the first hole may include concave portions.

In an embodiment, the electronic device may further include a light-emitting element disposed on the display area of the first area; a pixel defining layer disposed on the display area of the first area and forming an emission area of the light-emitting element, and a black matrix disposed on the display area, the first line area, and the second line area of the first area.

In an embodiment, the black matrix may include a second hole corresponding to the transmission area.

In an embodiment, the light blocking layer may be disposed below the first connection line, and the black matrix may be disposed above the first connection line.

According to one or more embodiments, a display apparatus may include a substrate including a first area and a second area adjacent to the first area, the first area including a line area, a display area, and a transmission area, the line area including a first line area extending in a first direction and a second line area extending in a second direction intersecting the first direction; a pixel circuit disposed on the display area of the first area; a first signal line disposed on the display area of the first area and transmitting a first signal to the pixel circuit; a first connection line disposed on the first line area of the first area, electrically connected to the first signal line, the first connection line and the first signal line being disposed on a different layer; a first bridge metal that electrically connects the first signal line to the first connection line; a second signal line disposed on the display area of the first area and transmitting a second signal to the pixel circuit; a second connection line disposed on the first line area of the first area, electrically connected to the second signal line, the second connection line and the second signal line being disposed on a different layer; and a second bridge metal that electrically connects the second signal line to the second connection line, wherein the first connection line and the second connection line at least partially overlap each other in a third direction perpendicular to the substrate.

In an embodiment, the display apparatus may further include a third signal line disposed on the display area of the first area and transmitting a third signal to the pixel circuit; and a third connection line disposed on the first line area of the first area, electrically connected to the third signal line, the third connection line and the third signal line being disposed on a same layer.

In an embodiment, the display apparatus may further include a data line disposed on the display area of the first area and transmitting a data signal to the pixel circuit; and a data connection line disposed on the second line area of the first area, electrically connected to the data line, the data connection line and the data line being disposed on a different layer.

In an embodiment, the data line and the data connection line may be electrically connected to each other by a third bridge metal.

In an embodiment, the display apparatus may further include a voltage line disposed on the display area of the first area and transmitting a voltage to the pixel circuit; and a voltage connection line disposed on the second line area of the first area and electrically connected to the voltage line.

In an embodiment, the data connection line and the voltage connection line may at least partially overlap each other in the third direction.

In an embodiment, the display apparatus may further include a first thin-film transistor disposed on the substrate, the first thin-film transistor including a first semiconductor layer including a silicon semiconductor and a first gate electrode insulated from the first semiconductor layer; an upper electrode insulated from the first gate electrode; an insulating layer overlapping the upper electrode in the third direction; a second thin-film transistor disposed on the insulating layer, the second thin-film transistor including a second semiconductor layer including an oxide semiconductor; and a second gate electrode insulated from the second semiconductor layer; a first connection electrode disposed on the second gate electrode, and a second connection electrode disposed on the first connection electrode.

In an embodiment, the first signal line, the second signal line, and at least one of the first gate electrode, the upper electrode, and the second gate electrode may be disposed on a same layer In an embodiment, the data line and the voltage line, and at least one of the first connection electrode and the second connection electrode may be disposed on a same layer as.

In an embodiment, the first connection line and the second connection line may extend in the first direction; and the data connection line and the voltage connection line may extend in the second direction.

In an embodiment, the display apparatus may further include a light blocking layer disposed on the display area, the first line area, and the second line area of the first area, the light blocking layer including a first hole corresponding to the transmission area.

In an embodiment, an edge of the light blocking layer forming the first hole may include convex portions.

In an embodiment, the display apparatus may further include a light-emitting element disposed on the display area of the first area; a pixel defining layer disposed on the display area of the first area and forming an emission area of the light-emitting element; and a black matrix disposed on the display area, the first line area, and the second line area of the first area.

In an embodiment, the black matrix may include a second hole corresponding to the transmission area.

In an embodiment, the light blocking layer may be disposed below the first connection line, and the black matrix may be disposed above the first connection line.

Other aspects, features and advantages of the disclosure will become better understood through the accompanying drawings, the claims and the detailed description.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
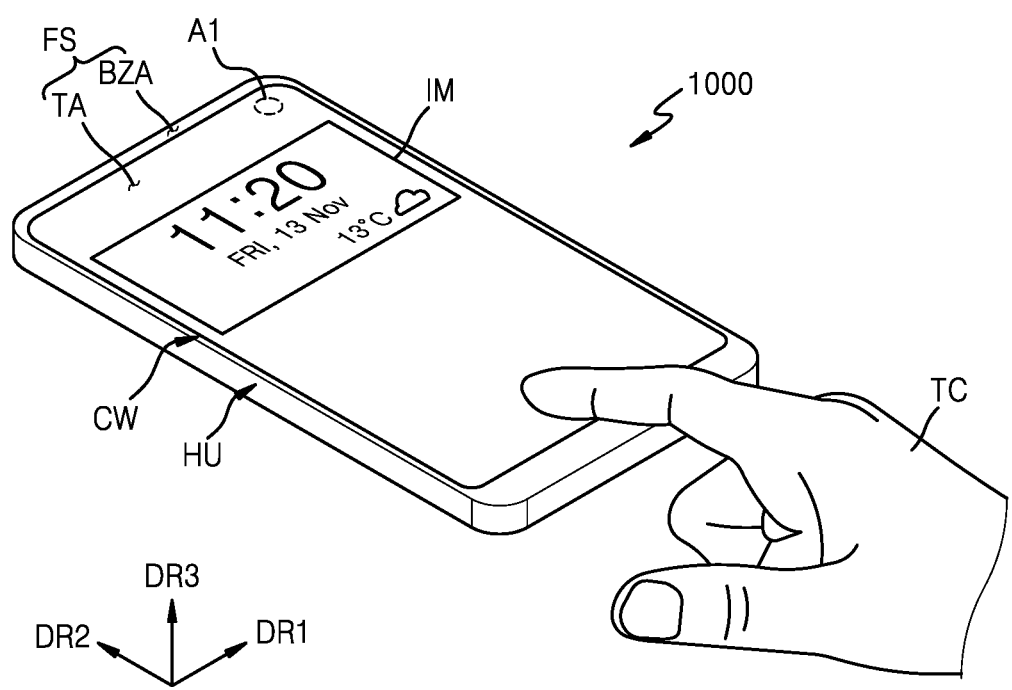
FIG. 1 is a schematic perspective view schematically illustrating an electronic device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects of the description In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

As the description allows for various changes and numerous embodiments, embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

It will be understood that although the terms "first," "second," etc. may be used herein to describe various elements, these elements should not be limited by these terms. These terms are only used to distinguish one element from another. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The singular forms "a," "an," and "the" as used herein are intended to include the plural forms as well unless the context clearly indicates otherwise.

It will be further understood that the terms ""comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be further understood that, when a layer, region, or element is referred to as being "on" another layer, region, or element, it can be directly or indirectly on the other layer, region, or element. For example, intervening layers, regions, or elements may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Also, sizes of elements in the drawings may be exaggerated or reduced for convenience of explanation. In addition, because sizes and thicknesses of elements in the drawings are arbitrarily illustrated for convenience of explanation, the disclosure is not limited thereto.

In the following embodiments, the expression "a line extends in a first direction or a second direction" may include a case in which "a line extends in a linear shape" and a case in which "a line extends in a zigzag or curved shape in a first direction or a second direction." It is to be understood that shapes disclosed herein may include shapes substantial to the shapes disclosed herein.

In the following embodiments, the term "in a plan view" means seeing a target portion from above, and the term "in a cross-sectional view" means seeing a vertically cut cross-section of a target portion from side. In the following embodiments, the term "overlapping" may include overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings. When describing embodiments with reference to the accompanying drawings, the same or corresponding elements are denoted by the same reference numerals.

Figure 2A:
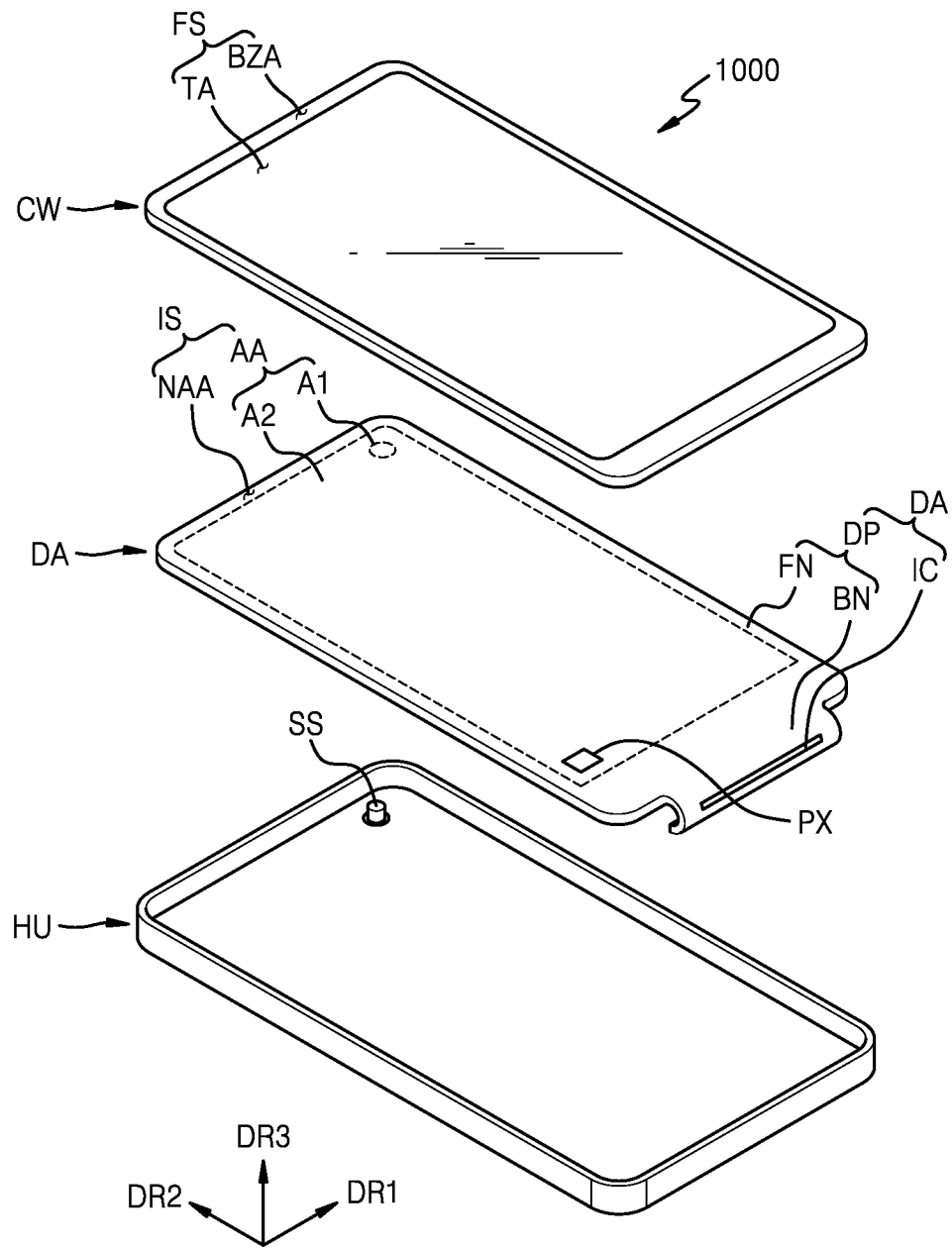
FIG. 2A is an exploded perspective view of an electronic device according to an embodiment.
Figure 2B:
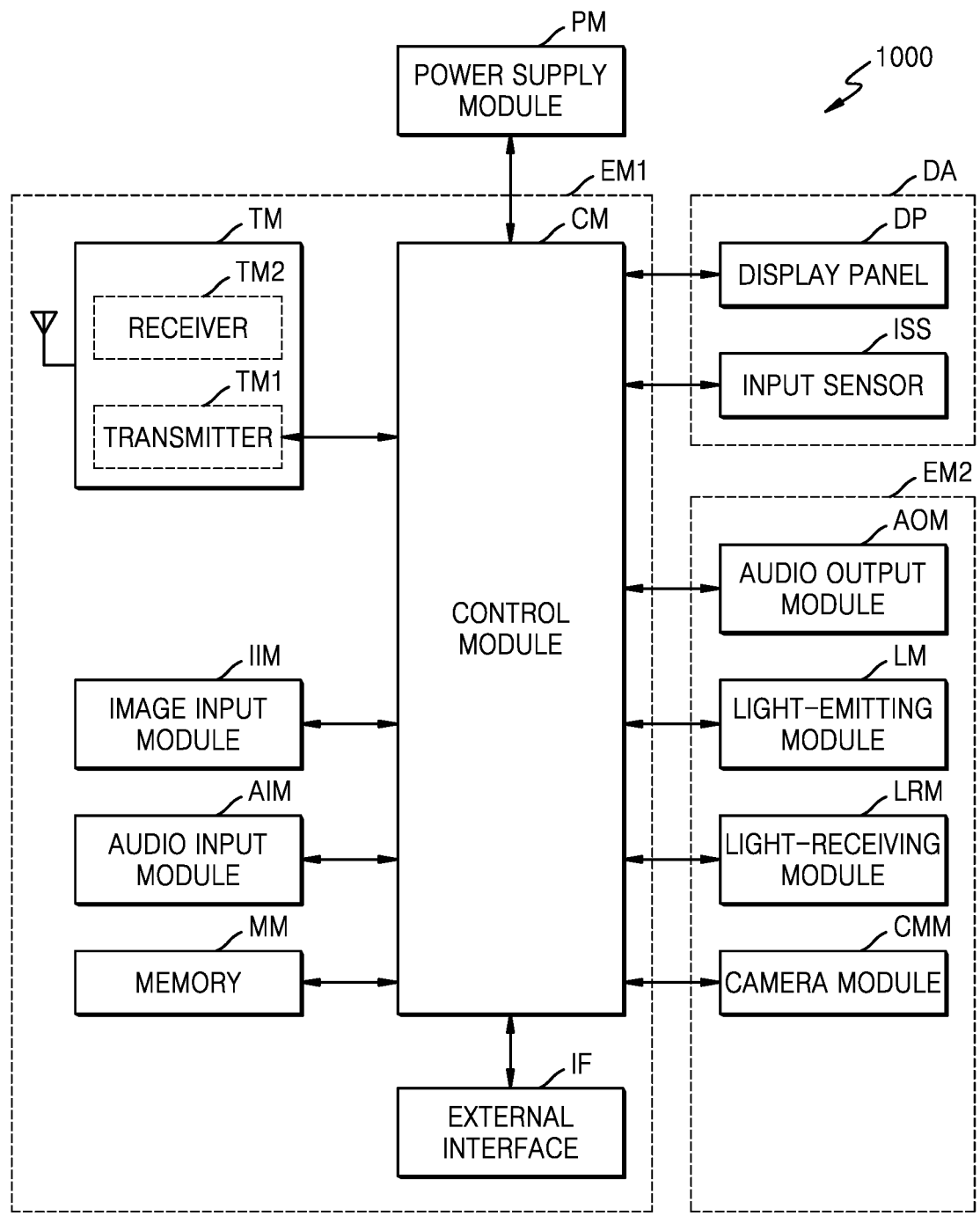
FIG. 2B is a block diagram of an electronic device according to an embodiment.

FIG. 1 is a schematic perspective view schematically illustrating an electronic device 1000 according to an embodiment, FIG. 2A is an exploded perspective view of the electronic device 1000 according to an embodiment, and FIG. 2B is a block diagram of the electronic device 1000 according to an embodiment.

In an embodiment, the electronic device 1000 may display a moving image or a still image, and may be portable electronic devices such as mobile phones, smart phones, tablet personal computers (PCs), mobile communication terminals, electronic organizers, e-books, portable multimedia players (PMPs), navigations, and ultra mobile PCs (UMPCs). The electronic device 1000 may be televisions, laptops, monitors, billboards, internet of things (IoT) devices, and the like within the spirit and the scope of the disclosure. In an embodiment, the electronic device 1000 may be wearable devices such as smart watches, watch phones, glasses-type displays, and head mounted displays (HMDs). Also, in an embodiments, the electronic device 1000 may also be used in dashboards of automobiles, center information displays (CIDs) on the center fascia or dashboards of automobiles, room mirror displays replacing side mirrors of automobiles, and displays on the rear sides of front seats to serve as entertainment devices for backseat passengers of automobiles. FIG. 1 illustrates that the electronic device 1000 is used as a smart phone for convenience of explanation.

Referring to FIGS. 1, 2A, and 2B, the electronic device 1000 may display an image IM in a third direction DR3 on a display surface IS parallel to each of a first direction DR1 and a second direction DR2. A display surface FS on which the image IM is displayed may correspond to a front side of the electronic device 1000, and may correspond to a front side FS of a cover window CW.

Hereinafter, the display surface of the electronic device 1000, the front side of the electronic device 1000, and the front side of the cover window CW are denoted by the same reference numeral. The image IM may include a still image as well as a moving image. FIG. 1 illustrates a clock as an embodiment of the image IM.

In an embodiment, a front surface (or an upper surface) and a rear surface (or a lower surface) of each member are defined based on a direction in which the image IM is displayed. The front surface and the rear surface are opposed to each other in the third direction DR3, and a normal direction of each of the front surface and the rear surface may be parallel to the third direction DR3. The distance between the front surface and the rear surface in the third direction DR3 may correspond to the thickness of the display apparatus DA in the third direction DR3.

The electronic device 1000 according to an embodiment may sense a user input TC applied from the outside. The user input TC may include various types of external inputs, such as a part of a user's body, light, heat, or pressure. In an embodiment, the user input TC is illustrated as the user's hand applied to the front surface. However, the disclosure is not limited thereto. The user input TC may be provided in various forms, and the electronic device 1000 may sense the user input TC applied to the lateral side or the rear surface of the electronic device 1000 according to the structure of the electronic device 1000.

On the other hand, in an embodiment, a first area A1 may be defined inside a light-transmitting area TA. The first area A1 may be an area that overlaps at least a portion of an electronic module SS. Although FIG. 1 illustrates that the first area A1 has a circular shape at the upper right side of the electronic device 1000, the disclosure is not limited thereto. The first area A1 may be provided in various numbers and shapes according to the number and shape of electronic modules SS.

The electronic device 1000 may receive an external signal required for the electronic module SS through the first area A1, or may provide a signal output from the electronic module SS to the outside. In an embodiment, because the first area A1 is provided to overlap the light-transmitting area TA, the area of a bezel area BZA for forming the light-transmitting area TA may be reduced.

The electronic device 1000 may include the cover window CW, a housing HU, the display apparatus DA, and the electronic module SS. In an embodiment, the cover window CW and the housing HU may be connected or coupled to each other to constitute the appearance of the electronic device 1000.

The cover window CW may include an insulating panel. For example, the cover window CW may include glass, plastic, or any combination thereof.

The front side FS of the cover window CW may define the front side of the electronic device 1000. The light-transmitting area TA may be an optically transparent area. For example, the light-transmitting area TA may be an area having a visible light transmittance of about 90% or more.

The bezel area BZA may define the shape of the light-transmitting area TA. The bezel area BZA may be adjacent to the light-transmitting area TA and may surround the light-transmitting area TA. The bezel area BZA may be an area having relatively lower transmittance than the light-transmitting area TA. The bezel area BZA may include an opaque material that blocks light. The bezel area BZA may have a certain or a given color. The bezel area BZA may be defined by a bezel layer provided separately from a transparent substrate defining the light-transmitting area TA, or may be defined by an ink layer inserted into or colored on the transparent substrate.

The display apparatus DA may include a display panel DP that displays the image IM, an input sensor (see ISS of FIG. 2B) that senses an external input TC, and a driving circuit IC. The display apparatus DA may include the front side IS including an active area AA and a peripheral area NAA. The active area AA may be an area that is activated according to an electrical signal.

In an embodiment, the active area AA may be an area in which the image IM is displayed, and may also be an area in which the external input TC is sensed. The active area AA may be an area in which pixels PX, which will be described later, are arranged (or disposed).

The light-transmitting area TA may overlap at least a portion of the active area AA. For example, the light-transmitting area TA may overlap the front side of the active area AA, or may overlap at least a portion of the active area AA. Therefore, a user may visually recognize the image IM through the light-transmitting area TA, or may provide the external input TC. However, the disclosure is not limited thereto. For example, the area in which the image IM is displayed and the area in which the external input TC is sensed may be separated from each other in the active area AA.

The peripheral area NAA may overlap at least a portion of the bezel area BZA. The peripheral area NAA may be an area that may be covered or overlapped by the bezel area BZA. The peripheral area NAA may be adjacent to the active area AA. The peripheral area NAA may surround or may be adjacent to the active area AA. The peripheral area NAA may be an area in which the image IM is not displayed. A driving circuit or a driving line to drive the active area AA may be arranged in the peripheral area NAA.

In an embodiment, the display apparatus DA may be assembled in a flat state in which the active area AA and the peripheral area NAA face the cover window CW. However, the disclosure is not limited thereto. A portion of the peripheral area NAA of the display apparatus DA may be bent. A portion of the peripheral area NAA faces the rear surface of the electronic device 1000, so that the bezel area BZA shown on the front surface of the electronic device 1000 may be reduced. By way of example, the display apparatus DA may be assembled in a state in which a portion of the active area AA is bent. By way of example, the peripheral area NAA may be omitted in the display apparatus DA.

The active area AA may include a first area A1 and a second area A2. The first area A1 may have relatively higher transmittance than the second area A2. Also, the first area 1A may have a relatively smaller area than the second area A2. The first area A1 may be defined as an area overlapping an area in which the electronic module SS of the display apparatus DA may be arranged or disposed inside of the housing HU. In an embodiment, the first area A1 is illustrated in a circular shape, but the disclosure is not limited thereto. The first area A1 may have various shapes, for example, a polygonal shape, an elliptical shape, or a figure having at least one curve.

The second area A2 may be adjacent to the first area A1. In an embodiment, the second area A2 may completely surround the first area A1. However, the disclosure is not limited thereto. The second area A2 may partially surround the first area A1.

Referring to FIG. 2B, the display apparatus DA may include the display panel DP and the input sensor ISS. The display panel DP may generate the image IM. The image IM, which is generated by the display panel DP, may be displayed on the display surface IS through the light-transmitting area TA, so that the user may visually recognize the image IM at the outside.

The input sensor ISS may sense the external input TC applied from the outside. The input sensor ISS may sense the external input TC provided to the cover window CW.

Referring back to FIG. 2A, the display panel DP may include a flat portion FN and a bending portion BN. The flat portion FN may be assembled in a state substantially parallel to a plane defined by the first direction DR1 and the second direction DR2. The active area AA may be provided in the flat portion FN.

The bending portion BN may extend from the flat portion FN, and at least a portion of the bending portion BN may be bent. The bending portion BN may be bent from the flat portion FN and assembled to be positioned on the rear side of the flat portion FN. In case that the bending portion BN is assembled, the bending portion BN overlaps the flat portion FN in a plan view, and thus, the bezel area BZA of the electronic device 1000 may be reduced. However, the disclosure is not limited thereto. For example, the bending portion BN may be omitted.

The driving circuit IC may be mounted on the bending portion BN. The driving circuit IC may be provided in the form of a chip. However, the disclosure is not limited thereto. The driving circuit IC may be provided on a separate circuit board and electrically connected to an electronic panel EP through a flexible film or the like within the spirit and the scope of the disclosure.

The driving circuit IC may be electrically connected to the active area AA and transmit an electrical signal to the active area AA. For example, the driving circuit IC may include a data driving circuit, and may provide data signals to the pixels PX arranged in the active area AA. By way of example, the driving circuit IC may include a touch driving circuit, and may be electrically connected to the input sensor ISS arranged in the active area AA. On the other hand, the driving circuit IC may include, in addition to the above-described circuits, various circuits, or may be designed to provide various electrical signals to the active area AA.

The electronic device 1000 may further include a main circuit board electrically connected to the display panel DP and the driving circuit IC. The main circuit board may include various driving circuits to drive the electronic panel EP, a connector to supply power, and the like within the spirit and the scope of the disclosure. The main circuit board may include a rigid printed circuit board (PCB) or a flexible circuit board.

The electronic module SS may be below the display apparatus DA. The electronic module SS may receive an external input transmitted through the first area A1, or may output a signal through the first area A1. In an embodiment, because the first area A1 having relatively high transmittance is provided inside the active area AA, the electronic module SS may be arranged to overlap the active area AA, and accordingly, the area (or size) of the bezel area BZA may be reduced.

Referring to FIG. 2B, the electronic device 1000 may include a display apparatus DA, a power supply module PM, a first electronic module EM1, and a second electronic module EM2. The display apparatus DA, the power supply module PM, the first electronic module EM1, and the second electronic module EM2 may be electrically connected to each other. FIG. 2B illustrates a display panel DP and an input sensor ISS in the configuration of the display apparatus DA.

The power supply module PM may supply power required for overall operations of the electronic device 1000. The power supply module PM may include a battery module.

The first electronic module EM1 and the second electronic module EM2 may include various functional modules to operate the electronic device 1000. The first electronic module EM1 may be mounted on or directly mounted on a motherboard electrically connected to the display panel DP or mounted on a separate substrate, and may be electrically connected to the motherboard through a connector (not illustrated).

The first electronic module EM1 may include a control module CM, a wireless communication module TM, an image input module IIM, an audio input module AIM, a memory MM, and an external interface IF. Some or a number of modules may not be mounted on the motherboard, and may be electrically connected to the motherboard through a flexible circuit board.

The control module CM may control overall operations of the electronic device 1000. The control module CM may include a microprocessor. For example, the control module CM activates or deactivates the display panel DP. The control module CM may control other modules such as the image input module IIM or the audio input module AIM, based on a touch signal received from the display panel DP.

The wireless communication module TM may transmit and receive wireless signals to and from other terminals by using Bluetooth or Wi-Fi lines. The wireless communication module TM may transmit and receive voice signals by using a general communication line. The wireless communication module TM may include a transmitter TM1 that modulates and transmits a signal to be transmitted, and a receiver TM2 that demodulates a received signal.

The image input module IIM may convert an image signal into image data that is displayable on the display apparatus DA. The audio input module AIM may receive an external audio signal through a microphone in a recording mode, a voice recognition mode, or the like and convert the received external audio signal into electrical voice data.

The external interface IF may act as an interface connected to an external charger, a wired or wireless data port, a card socket (for example, a memory card, a subscriber identity module or user identity module (SIM/UIM) card), and the like within the spirit and the scope of the disclosure.

The second electronic module EM2 may include an audio output module AOM, a light-emitting module LM, a light-receiving module LRM, and a camera module CMM. The second electronic module EM2 may be mounted on or directly mounted on the motherboard or mounted on a separate substrate, and may be electrically connected to the first electronic module EM1 or electrically connected to the display apparatus DA through a connector (not illustrated).

The audio output module AOM may convert the audio data received from the wireless communication module TM or the audio data stored in the memory MM and output the resulting data to the outside.

The light-emitting module LM may generate and output light. The light-emitting module LM may output infrared light. For example, the light-emitting module LM may include a light-emitting diode (LED) element. For example, the light-receiving module LRM may sense infrared light. The light-receiving module LRM may be activated in case that infrared light above a certain or a given level is sensed. The light-receiving module LRM may include a complementary metal-oxide semiconductor (CMOS) sensor. After the infrared light generated by the light-emitting module LM is output, the infrared light is reflected by an external subject (for example, a user's finger or face) and the reflected infrared light may be incident on the light-receiving module LRM. The camera module CMM may capture an external image.

In an embodiment, the electronic module SS may include the first electronic module EM1 and/or the second electronic module EM2. For example, the electronic module SS may include at least one of a camera, a speaker, a photo sensor, and a thermal sensor. The electronic module SS may sense an external subject received through the front side IS or provide a sound signal such as a voice through the front side IS to the outside. Also, the electronic module SS may include components, and is not limited to any one embodiment.

Referring back to FIG. 2A, the housing HU may be connected or coupled to the cover window CW. The cover window CW may be on the front side FS of the housing HU. The housing HU may include a rear side and a lateral side. The cover window CW may be on the rear side of the housing HU. For example, the cover window CW may be above the housing HU. The housing HU may be connected or coupled to the cover window CW to provide a certain or a given accommodation space. The display apparatus DA and the electronic module SS may be accommodated in the certain or a given accommodation space between the housing HU and the cover window CW.

The housing HU may include a material having a relatively high rigidity. For example, the housing HU may include frames and/or plates including glass, plastic, metal, or any combination thereof. The housing HU may stably protect the components of the electronic device 1000, accommodated in the internal space, from external impact.

Figure 3A:
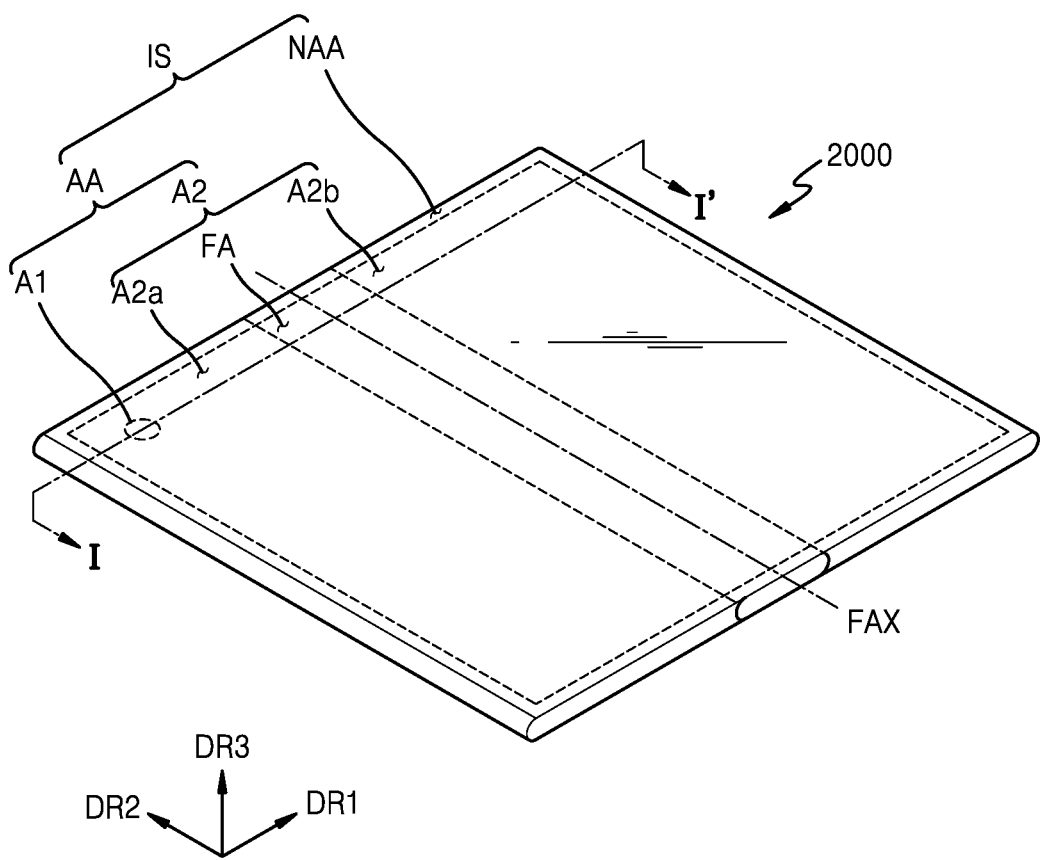
FIG. 3A is a schematic perspective view schematically illustrating an electronic device according to an embodiment.
Figure 3B:
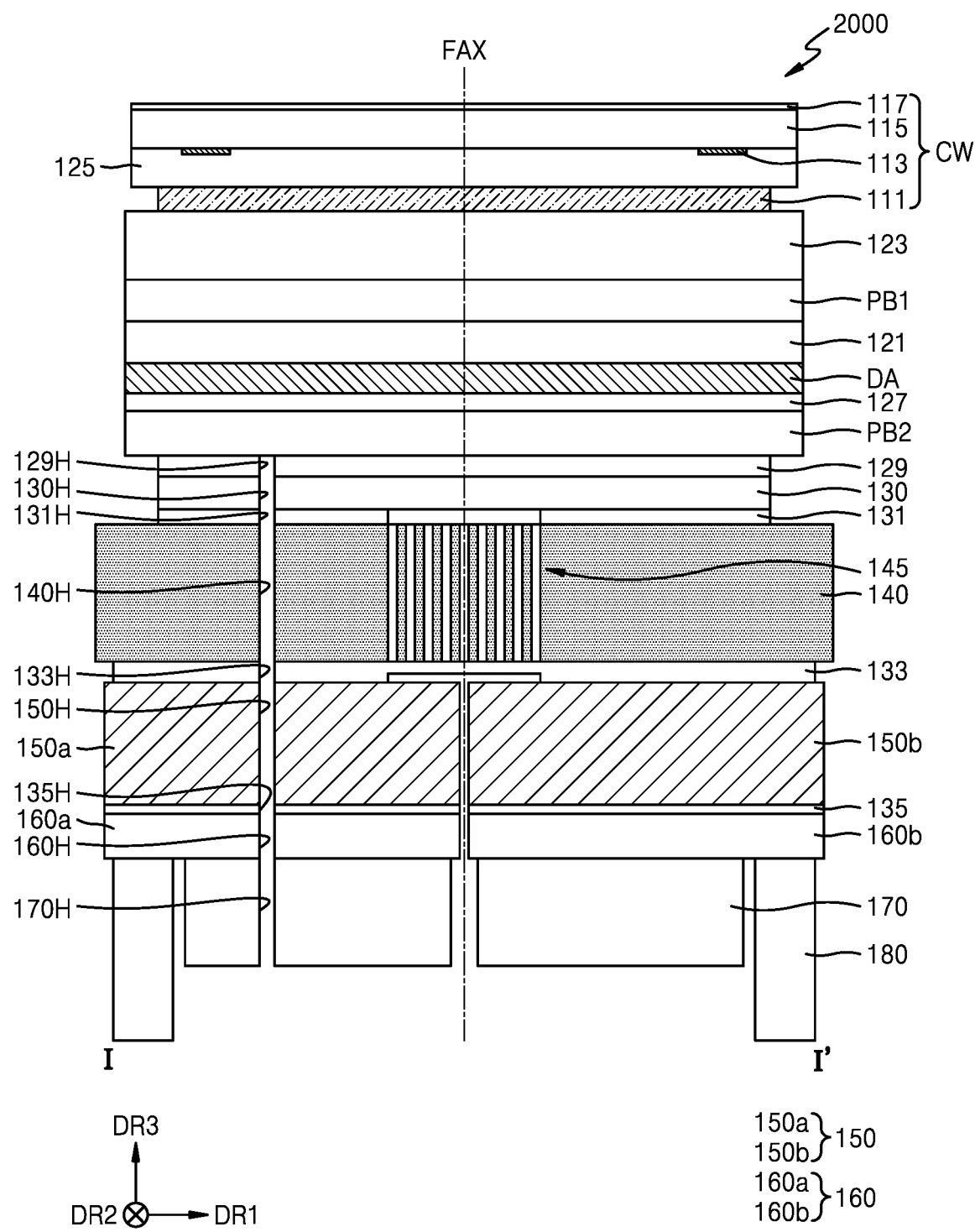
FIG. 3B is a schematic cross-sectional view schematically illustrating an electronic device according to an embodiment.

FIG. 3A is a schematic perspective view schematically illustrating an electronic device 2000 according to an embodiment, and FIG. 3B is a schematic cross-sectional view schematically illustrating the electronic device 2000 according to an embodiment. FIG. 3A is a diagram illustrating a case in which the electronic device 2000 is a foldable electronic device 2000, and FIG. 3B is a diagram for describing a stacked relationship of members constituting the electronic device 2000. In FIG. 3B, the members constituting the electronic device 2000 are simply illustrated.

Referring to FIG. 3A, in an embodiment, the electronic device 2000 may be the foldable electronic device 2000. The electronic device 2000 may be folded with respect to (or, centering on) a folding axis FAX. For example, the electronic device 1000 may be folded centering on (or with respect to) the folding axis FAX. In an embodiment, a display surface IS of the electronic device 2000 may be located or disposed outside of or inside of the electronic device 2000.

The electronic device 2000 may include a housing, a display apparatus, and a cover window CW.

In an embodiment, the display apparatus may include an active area AA and a peripheral area NAA. The active area AA may be an area in which an image is displayed and may also be an area in which an external input is sensed. The active area AA may be an area in which pixels, which will be described later, are arranged.

The active area AA may include a first area A1 and a second area A2. Also, the second area A2 may include a (2-1)th area A2a, a (2-2)th area A2b, and a folding area FA. The (2-1)th area A2a and the (2-2)th area A2b may be on the left and right sides of the folding axis FAX, respectively, and the folding area FA may be between the (2-1)th area A2a and the (2-2)th area A2b. However, the disclosure is not limited thereto.

Although FIG. 3A illustrates that the first area A1 has a circular shape on the upper left side of the electronic device 2000, the disclosure is not limited thereto. The first area A1 may be provided in various numbers and shapes according to the number and shape of electronic modules (see SS of FIG. 2A).

Also, although FIG. 3A illustrates that the first area A1 is adjacent to the (2-1)th area A2a, the disclosure is not limited thereto. In an embodiment, the first area A1 may be located or disposed adjacent to the (2-2)th area A2b.

Referring to FIG. 3B, in an embodiment, the electronic device 2000 may include a cover window CW, a first protective member PB1, a display apparatus DA, a second protective member PB2, a first support member 130, a second support member 140, a digitizer 150, a plate 160, a cushion layer 170, and a waterproof member 180.

The first protective member PB1 may be on the display apparatus DA. The first protective member PB1 may adhere to the upper surface of the display apparatus DA through a first adhesive layer 121. The first adhesive layer 121 may include a pressure sensitive adhesive (PSA). However, the disclosure is not limited thereto. The first adhesive layer 121 may include an optically clear adhesive (OCA).

The first protective member PB1 may be positioned on the display apparatus DA to protect the display apparatus DA from external impact. The first protective member PB1 may include a polymer resin. For example, the first protective member PB1 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the disclosure is not limited thereto. The first protective member PB1 may include a material such as glass or quartz.

The cover window CW may be on the first protective member PB1. The cover window CW may adhere to the upper surface of the first protective member PB1 through a second adhesive layer 123.

The cover window CW may include a window 111, an opaque layer 113, a window protective member 115, and a hard coating layer 117. The window 111 may include UTG™ (Ultra Thin Glass). However, the disclosure is not limited thereto. The window 111 may include a polymer resin.

The window protective member 115 may be on the window 111. The window protective member 115 may adhere to the upper surface of the window 111 through a third adhesive layer 125. The window protective member 115 may protect the window 111 from external impact and may prevent or minimize the occurrence of scratches on the upper surface of the window 111. The window protective member 115 may include a polymer resin. However, the disclosure is not limited thereto. The window protective member 115 may include an inorganic material.

The opaque layer 113 may be between the window protective member 115 and the third adhesive layer 125. However, the disclosure is not limited thereto. The opaque layer 113 may be on a portion of the window protective member 115. The opaque layer 113 may include an opaque material so that lines or circuits of the display apparatus DA are not identified from the outside. A portion in which the opaque layer 113 may be arranged or disposed may be a bezel area BZA.

The hard coating layer 117 may be on the window protective member 115. The hard coating layer 117 may include an organic material such as a polymer resin. However, the disclosure is not limited thereto. The hard coating layer 117 may include an inorganic material The hard coating layer 117 may be the outermost layer of the cover window CW. The outermost layer of the cover window CW may refer to the outermost layer of the electronic device 2000. The outermost layer of the cover window CW is a layer that is touched by or directly touched by a user. In case that the outermost layer of the cover window CW is UTG™ or the window protective member 115, a user's touch feeling may deteriorate. Because the outermost layer of the cover window CW is the hard coating layer 117, a smooth and soft touch feeling may be provided to the user.

The second protective member PB2 may be below the display apparatus DA. The second protective member PB2 may adhere to the lower surface of the display apparatus DA through a fourth adhesive layer 127. The second protective member PB2 may be below the display apparatus DA to support the display apparatus DA and protect the display apparatus DA from external impact. The second protective member PB2 may include a polymer resin, such as polyethylene terephthalate or polyimide.

The first support member 130 may be below the second protective member PB2. The first support member 130 may adhere to the second protective member PB2 through a fifth adhesive layer 129. The first support member 130 may be below the display apparatus DA to support the display apparatus DA. The first support member 130 may include a polymer resin, such as polyethylene terephthalate or polyimide.

The second support member 140 may be below the first support member 130. The second support member 140 may adhere to the first support member 130 through a sixth adhesive layer 131. In an embodiment, the sixth adhesive layer 131 may not be provided in a portion corresponding to the folding area FA of FIG. 3A.

The second support member 140 may be below the display apparatus DA to support the display apparatus DA. Also, the second support member 140 may be above the digitizer 150 to be described later to protect the digitizer 150 from external impact.

In an embodiment, the second support member 140 may include a folding structure 145. In case that the electronic device 2000 is folded, the folding structure 145 may have a variable shape or a variable length. For example, the folding structure 145 may include a pattern portion having an opening formed therein, a concave-convex shape, or links rotatably connected to each other. However, the disclosure is not limited thereto.

In an embodiment, in case that the electronic device 2000 is folded, the folding structure 145 may be folded with respect to (or centered on) the folding axis FAX. In an embodiment, the folding structure 145 may be provided so that both sides thereof are symmetrical with respect to (or centering on) the folding axis FAX. In an embodiment, the second support member 140 excluding the folding structure 145 may have a flat upper surface.

In an embodiment, the second support member 140 may include at least one of glass, plastic, and metal. In an embodiment, the second support member 140 may include polyurethane or carbon fiber reinforced plastic (CFRP). In an embodiment, the folding structure 145 may include the same material or a similar material as that of the second support member 140, or may include a material different from that of the second support member 140.

The digitizer 150 may be below the second support member 140. The digitizer 150 may adhere to the lower portion of the second support member 140 through a seventh adhesive layer 133. The seventh adhesive layer 133 may be below the second support member 140 to prevent or minimize infiltration of foreign material into the folding structure 145 of the second support member 140.

The digitizer 150 may include a body layer and/or a pattern layer. The digitizer 150 may sense a signal input from an external electronic pen or the like through the pattern layer. By way of example, the digitizer 150 may sense the intensity and direction of the signal input from the external electronic pen or the like within the spirit and the scope of the disclosure.

In case that the digitizer 150 is integrally provided, cracks may occur in the body layer and/or the pattern layer of the digitizer 150 in case that the electronic device 2000 is folded. In an embodiment, the digitizer 150 may include a first digitizer 150a on the left side of the folding axis FAX and a second digitizer 150b on the right side of the folding axis FAX. The first digitizer 150a may overlap at least a portion of the (2–1)th area A2a of FIG. 3A, and the second digitizer 150b may overlap at least a portion of the (2–2)th area A2b of FIG. 3A. Also, the first digitizer 150a may overlap at least a portion of the folding area FA of FIG. 3A, and the second digitizer 150b may overlap at least a portion of the folding area FA of FIG. 3A.

In an embodiment, the first digitizer 150a and the second digitizer 150b may be apart from each other in the first direction DR1 with the folding axis FAX therebetween. For example, the digitizer 150 may be provided in a separate type rather than an integrated type. Because the digitizer 150 is provided in a separable structure, it is possible to prevent or minimize the occurrence of cracks in the body layer and/or the pattern layer in the folding area FA.

Also, because the digitizer 150 is provided in a separable type and is provided to overlap at least a portion of the folding area FA of FIG. 3A, the digitizer 150 may receive signals even in the folding area FA, thereby improving user convenience.

The plate 160 may be below the digitizer 150. The plate 160 may adhere to the lower surface of the digitizer 150 through an eighth adhesive layer 135. In an embodiment, the eighth adhesive layer 135 may not be provided in a portion corresponding to the folding area FA of FIG. 3A.

The plate 160 may transfer heat generated by the digitizer 150 to the outside. The plate 160 may include a metal having good heat transfer efficiency. By way of example, the plate 160 may include graphite having high heat conductivity in a plane direction. The thickness of the plate 160 in case that the plate 160 may include graphite may be less than the thickness of the plate 160 in case that the plate 160 may include a metal. Also, the plate 160 may be below the digitizer 150 to support the digitizer 150 and protect the digitizer 150 from external impact.

The plate 160 may include a first plate 160a on the left side of the folding axis FAX and a second plate 160b on the right side of the folding axis FAX.

The cushion layer 170 may be below the plate 160. The cushion layer 170 may prevent or minimize damage to the digitizer 150 arranged on the cushion layer 170 due to external impact. In an embodiment, the cushion layer 170 may include a pressure sensitive adhesive.

The waterproof member 180 may be arranged outside the cushion layer 170. The waterproof member 180 may block or absorb moisture introduced from the outside of the electronic device 2000 so as to prevent or minimize damage to the components of the electronic device 2000 due to moisture. The waterproof member 180 may include a tape, a sponge, or the like within the spirit and the scope of the disclosure.

In an embodiment, through-holes 129H, 130H, 131H, 140H, 133H, 150H, 135H, 160H, and 170H corresponding to the first area A1 may be respectively provided in the fifth adhesive layer 129, the first support member 130, the sixth adhesive layer 131, the second support member 140, the seventh adhesive layer 133, the digitizer 150, the eighth adhesive layer 135, the plate 160, and the cushion layer 170. However, the disclosure is not limited thereto. The through-hole may not be provided in at least one of the fifth adhesive layer 129, the first support member 130, the sixth adhesive layer 131, the second support member 140, the seventh adhesive layer 133, the digitizer 150, the eighth adhesive layer 135, the plate 160, and the cushion layer 170. Also, although not illustrated, a through-hole may be additionally provided in the second protective member PB2.

Although FIG. 3B illustrates that the through-holes 129H, 130H, 131H, 140H, 133H, 150H, 135H, 160H, and 170H corresponding to the first area A1 are provided on the left side of the electronic device 2000, the disclosure is not limited thereto. In an embodiment, the through-holes 129H, 130H, 131H, 140H, 133H, 150H, 135H, 160H, and 170H corresponding to the first area A1 may be provided on the right side of the electronic device 2000.

Because the through-holes 129H, 130H, 131H, 140H, 133H, 150H, 135H, 160H, and 170H corresponding to the first area A1 are respectively provided in the fifth adhesive layer 129, the first support member 130, the sixth adhesive layer 131, the second support member 140, the seventh adhesive layer 133, the digitizer 150, the eighth adhesive layer 135, the plate 160, and the cushion layer 170, the transmittance of the first area A1 may be provided, and thus, the electronic device (see 1000 of FIG. 2A) in which the performance of the electronic module SS is improved may be provided.

Figure 4:
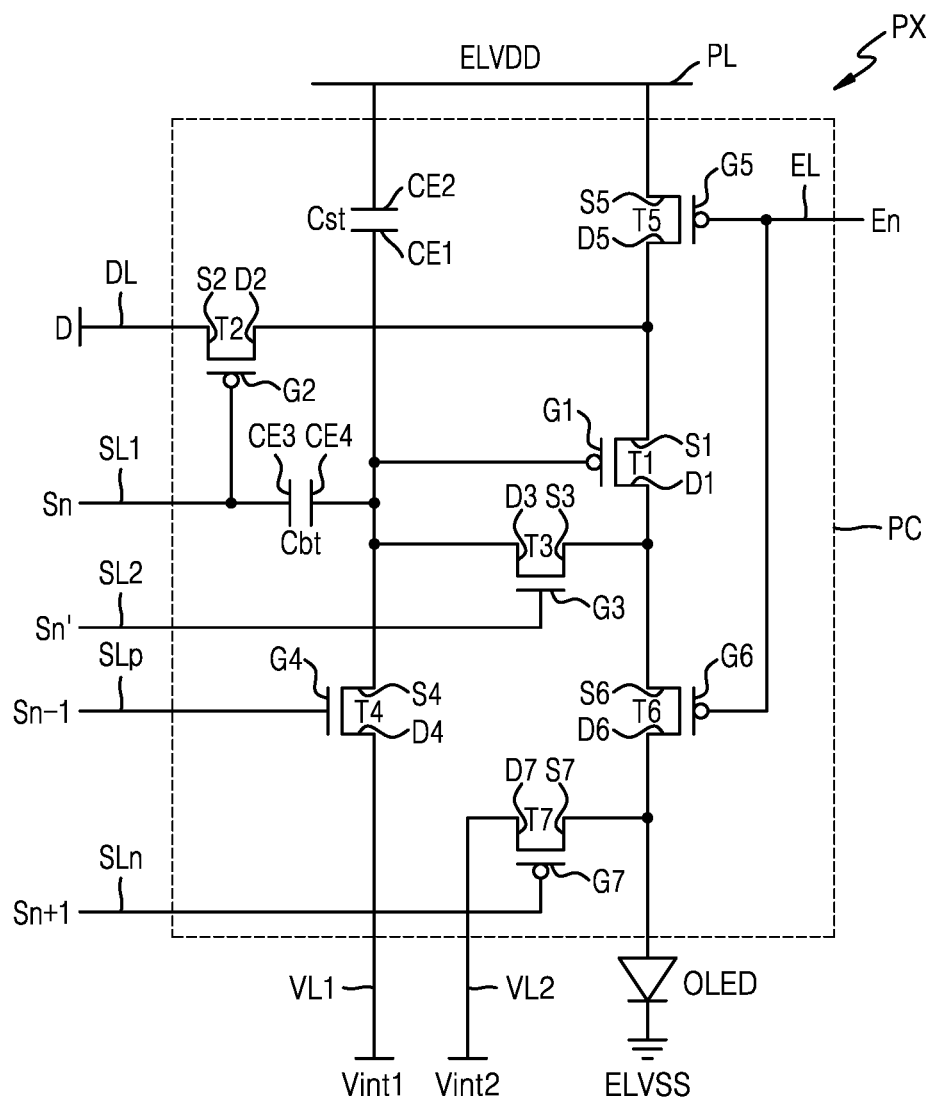
FIG. 4 is schematic diagram of an equivalent circuit diagram of a pixel according to an embodiment.

FIG. 4 is a schematic diagram of an equivalent circuit diagram of a pixel according to an embodiment. FIG. 4 is a schematic diagram of an equivalent circuit diagram of the pixel PX of the display apparatus DA illustrated in FIG. 2A. Although there is a difference in size, the equivalent circuit diagram of the pixel PX illustrated in FIG. 4 may be equally applied to a first pixel PXa of FIG. 5 arranged in a first area A1 and a second pixel PXm of FIG. 5 arranged in a second area A2.

In an embodiment, a pixel circuit PC may include a first transistor T1, a second transistor T2, a third transistor T3, a fourth transistor T4, a fifth transistor T5, a sixth transistor T6, a seventh transistor T7, a first storage capacitor Cst, and a second storage capacitor Cbt. In an embodiment, at least one of the first to seventh transistors T1 to T7 may be omitted.

The first to seventh transistors T1, T2, T3, T4, T5, T6, and T7 and the first and second storage capacitors Cst and Cbt may be connected to signal lines, a first initialization voltage line VL1, a second initialization voltage line VL2, and a driving voltage line PL. The signal lines may include a data line DL, a first scan line SL1, a second scan line SL2, a third scan line SLp, a fourth scan line SLn, and an emission control line EL. In an embodiment, the signal lines, the first and second initialization voltage lines VL1 and VL2, and/or the driving voltage line PL may be shared by neighboring pixels.

The driving voltage line PL may transmit a first driving voltage ELVDD to the first transistor T1. The first initialization voltage line VL1 may transmit, to the pixel circuit PC, a first initialization voltage Vint1 for initializing the first transistor T1. The second initialization voltage line VL2 may transmit, to the pixel circuit PC, a second initialization voltage Vint2 for initializing a light-emitting element OLED. The equivalent circuit diagram of a pixel may also include a second driving voltage line ELVSS.

Of the first to seventh transistors T1 to T7, the third transistor T3 and the fourth transistor T4 may be implemented as an n-channel metal-oxide semiconductor field effect transistor (MOSFET) (NMOS), and the others may be implemented as a p-channel MOSFET (PMOS). However, the disclosure is not limited thereto. In an embodiment, the third transistor T3, the fourth transistor T4, and the seventh transistor T7 may be implemented as an NMOS, and the others may be implemented as a PMOS.

In this specification, the phrase "electrically connected between transistors and signal lines or between transistors" means that "a source, a drain, and a gate of a transistor are provided as one body with signal lines or are connected to signal lines through connection electrodes."

The first transistor T1 may control an amount of a driving current flowing from the driving voltage line PL to the light-emitting element OLED according to a gate voltage thereof. The first transistor T1 may include a first gate G1 connected to a first electrode CE1 of the first storage capacitor Cst, and a first source S1 connected to the driving voltage line PL through the fifth transistor T5. Also, the first transistor T1 may include a first drain D1 connected to the light-emitting element OLED through the sixth transistor T6.

The second transistor T2 may receive a data voltage D in response to a first scan signal Sn. The second transistor T2 may transmit the data voltage D to the first source S1 of the first transistor T1 in response to the first scan signal Sn. The second transistor T2 may include a second gate G2 connected to the first scan line SL1, a second source S2 connected to the data line DL, and a second drain D2 connected to the first source S1 of the first transistor T1.

The first storage capacitor Cst may be connected between the driving voltage line PL and the first transistor T1. The first storage capacitor Cst may include a second electrode CE2 connected to the driving voltage line PL, and the first electrode CE1 connected to the first gate G1 of the first transistor T1. The first storage capacitor Cst may store a difference between the first driving voltage ELVDD applied to the driving voltage line PL and the gate voltage of the first transistor T1, and may maintain the gate voltage of the first transistor T1.

The third transistor T3 may be connected in series between the first drain D1 and the first gate G1 of the first transistor T1, and may connect the first drain D1 and the first gate G1 of the first transistor T1 to each other in response to a second scan signal Sn'. The third transistor T3 may include a third gate G3 connected to the second scan line SL2, a third source S3 connected to the first drain D1 of the first transistor T1, and a third drain D3 connected to the first gate G1 of the first transistor T1. The third transistor T3 may include transistors connected in series to each other and simultaneously controlled by the second scan signal Sn'. However, the third transistor T3 may be omitted.

In case that the third transistor T3 is turned on in response to the second scan signal Sn', the first drain D1 and the first gate G1 of the first transistor T1 may be connected to each other so that the first transistor T1 is diode-connected.

The fourth transistor T4 may apply the first initialization voltage Vint1 to the first gate G1 of the first transistor T1 in response to a third scan signal Sn−1. The fourth transistor T4 may include a fourth gate G4 connected to the third scan line SLp, a fourth source S4 connected to the first gate G1 of the first transistor T1, and a fourth drain D4 connected to the first initialization voltage line VL1. The fourth transistor T4 may include transistors connected in series to each other and simultaneously controlled by the third scan signal Sn−1. However, the fourth transistor T4 may be omitted.

The fifth transistor T5 may connect the driving voltage line PL to the first source S1 of the first transistor T1 in response to an emission control signal En. The fifth transistor T5 may include a fifth gate G5 connected to the emission control line EL, a fifth source S5 connected to the driving voltage line PL, and a fifth drain D5 connected to the first source S1 of the first transistor T1. However, the fifth transistor T5 may be omitted.

The sixth transistor T6 may connect the first drain D1 of the first transistor T1 to an anode of the light-emitting element OLED in response to the emission control signal En. The sixth transistor T6 may transmit the driving current output from the first transistor T1 to the anode of the light-emitting element OLED. The sixth transistor T6 may include a sixth gate G6 connected to the emission control line EL, a sixth source S6 connected to the first drain D1 of the first transistor T1, and a sixth drain D6 connected to the anode of the light-emitting element OLED. However, the sixth transistor T6 may be omitted.

The seventh transistor T7 may apply the second initialization voltage Vint2 to the anode of the light-emitting element OLED in response to a fourth scan signal Sn+1. The seventh transistor T7 may include a seventh gate G7 connected to the fourth scan line SLn, a seventh source S7 connected to the anode of the light-emitting element OLED, and a seventh drain D7 connected to the second initialization voltage line VL2. However, the seventh transistor T7 may be omitted.

The seventh transistor T7 may be connected to the fourth scan line SLn, as illustrated in FIG. 4. By way of example, the seventh transistor T7 may be connected to the emission control line EL and driven in response to the emission control signal En. By way of example, the seventh transistor T7 may be connected to the third scan line SLp and driven in response to the third scan signal SL-1.

On the other hand, the positions of the sources and the drains may be changed depending on the type (p-type or n-type) of the transistor.

The second storage capacitor Cbt may include a third electrode CE3 and a fourth electrode CE4. The fourth electrode CE4 of the second storage capacitor Cbt may be connected to the first electrode CE1 of the first storage capacitor Cst, and the third electrode CE3 of the second storage capacitor Cbt may receive the first scan signal Sn. The second storage capacitor Cbt may compensate for the voltage drop of the gate terminal of the first transistor T1 by increasing the voltage of the gate terminal of the first transistor T1 in case that the supply of the first scan signal Sn is stopped. However, the second storage capacitor Cbt may be omitted.

Figure 5:
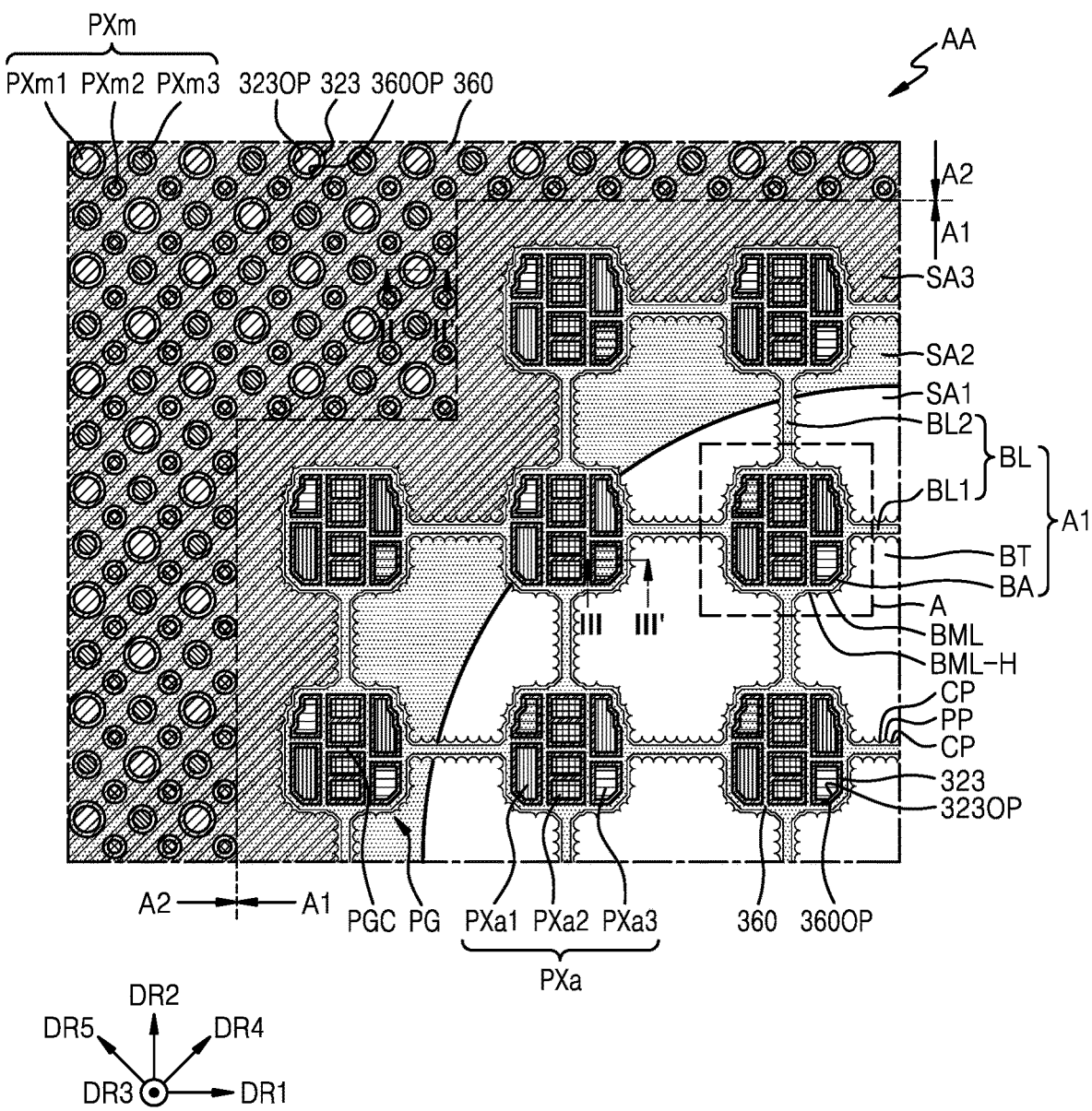
FIG. 5 is a schematic plan view of an active area in an electronic device, according to an embodiment.
Figure 6:
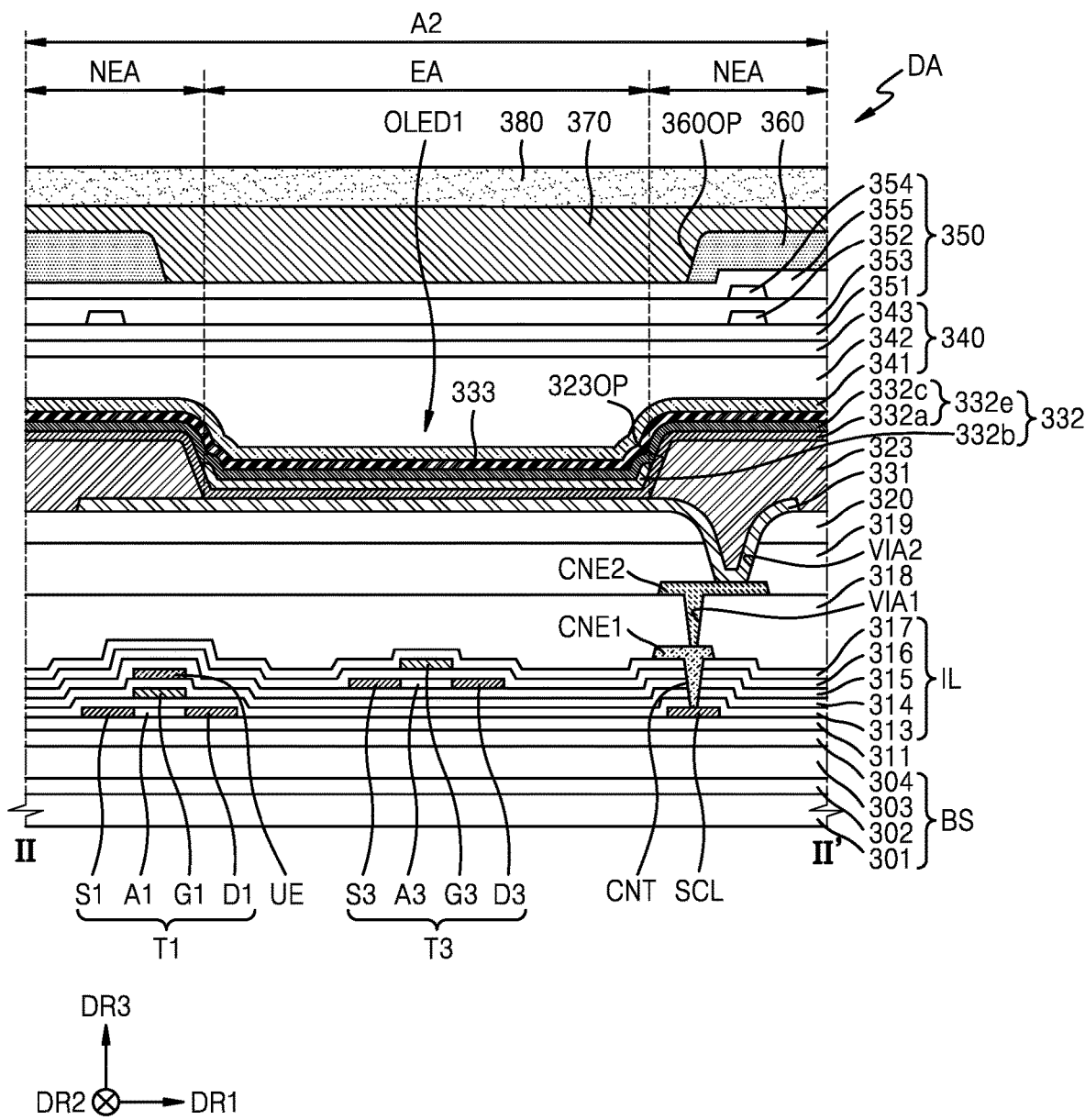
FIG. 6 is a schematic cross-sectional view of an active area in an electronic device, according to an embodiment.
Figure 7:
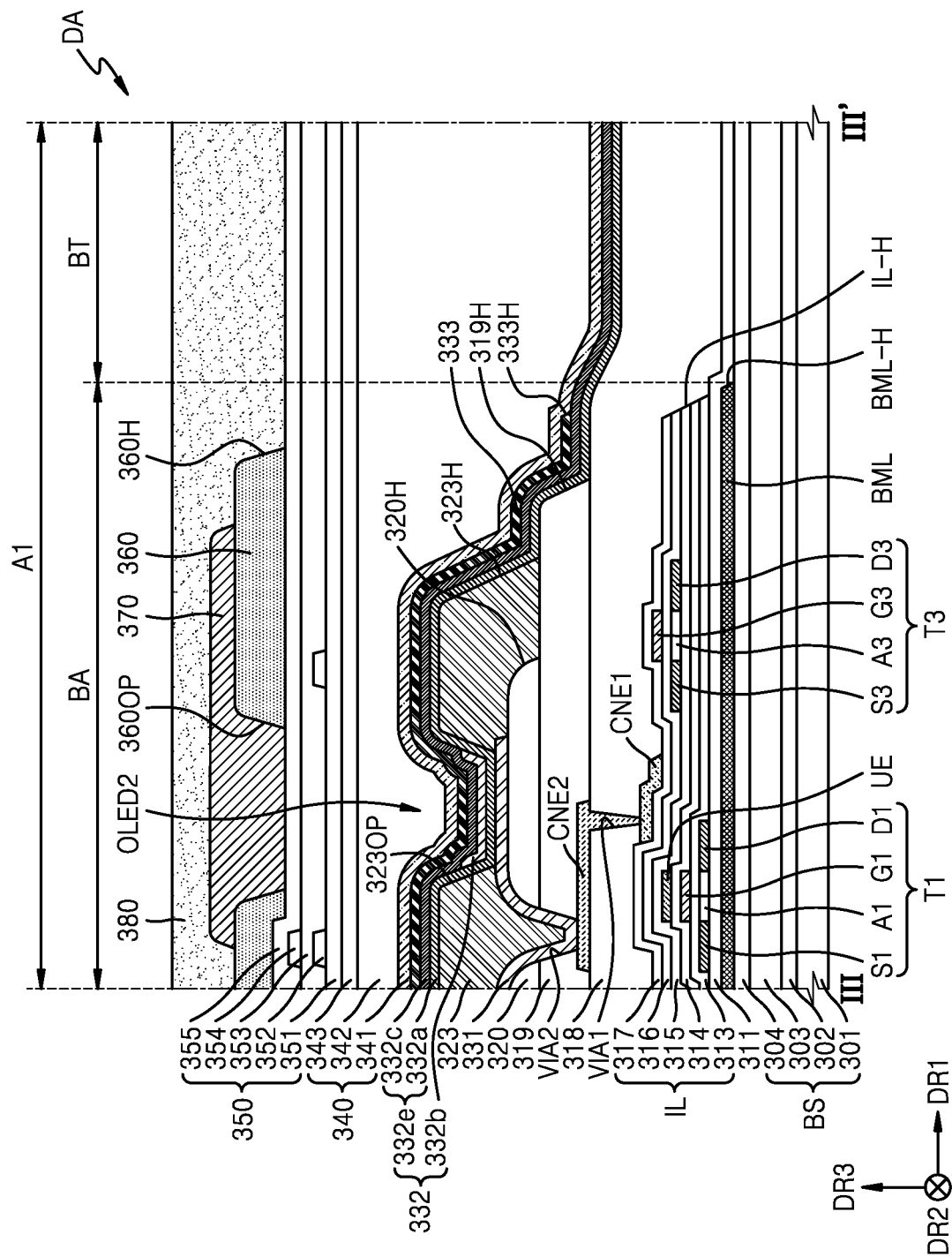
FIG. 7 is a schematic cross-sectional view of an active area in an electronic device, according to an embodiment.

FIG. 5 is a schematic plan view of the active area in the electronic device, according to an embodiment, FIG. 6 is a schematic cross-sectional view of the active area in the electronic device, according to an embodiment, and FIG. 7 is a schematic cross-sectional view of the active area in the electronic device, according to an embodiment. FIG. 6 is a cross-sectional view of the second area A2 taken along line II-IF of FIG. 5, and FIG. 7 is a schematic cross-sectional view of the first area A1 taken along line of FIG. 5.

FIGS. 6 and 7 illustrate only the first transistor T1 and the third transistor T3 among the first to seventh transistors T1 to T7 described with reference to FIG. 4. However, the first transistor T1 and the third transistor T3 of FIG. 7 are illustrated so as to describe that the pixel PX may include a first semiconductor pattern including a silicon semiconductor and a second semiconductor pattern including an oxide semiconductor, and the positions of the first transistor T1 and the third transistor T3 are not limited to the positions illustrated in FIG. 7.

Referring to FIGS. 5, 6, and 7, an electronic device according to an embodiment may include a display apparatus, and the display apparatus may include a substrate BS, a light blocking layer BML, a first pixel PXa, a second pixel PXm, a pixel defining layer 323, and a black matrix 360.

In an embodiment, the substrate BS may include a first area A1 and a second area A2. Because the display apparatus may include the substrate BS, it may be understood that the display apparatus may include the first area A1 and the second area A2.

In an embodiment, the first area A1 may include a display area BA, a line area BL, and a transmission area BT. In an embodiment, the line area BL may include a first line area BL1 extending in a first direction DR1 and a second line area BL2 extending in a second direction DR2 crossing or intersecting the first direction DR1. Signal lines and/or voltage lines may be arranged in the first line area BL1 and the second line area BL2.

Also, the first area A1 may include a first sub-area SA1, a second sub-area SA2, and a third sub-area SA3. The first sub-area SA1, the second sub-area SA2, and the third sub-area SA3 are defined by an overlapping relationship between the pixel defining layer 323 and the black matrix 360, and each of the first sub-area SA1 and the second sub-area SA2 may overlap at least a portion of the transmission area BT.

In an embodiment, the light blocking layer BML, may be on the substrate BS. The light blocking layer BML may be on the display area BA and the line area BL of the first area A1. For example, the light blocking layer BML may overlap the display area BA and the line area BL of the first area A1, and may not overlap the transmission area BT of the first area A1.

In an embodiment, the light blocking layer BML may include a first hole BML-H corresponding to the transmission area BT. For example, the first hole BML-H may be defined in the light blocking layer BML. For example, the shape and/or size of the transmission area BT may be defined by the first hole BML-H defined in the light blocking layer BML.

In an embodiment, the light blocking layer BML may include concave and convex uneven edges. For example, the edges of the light blocking layer BML may have a structure in which concave portions CP that are concave in a direction away from the center of the transmission area BT are arranged adjacent to each other. The edges of the light blocking layer BML may have a structure in which the concave portions CP are arranged continuously and/or regularly, and convex portions PP facing the center of the transmission area BT may be between the adjacent concave portions CP. At this time, this may be referred to as an embo structure.

In an embodiment, the convex portion PP may have a relatively sharp shape, as illustrated in FIG. 5. However, the disclosure is not limited thereto. The convex portion PP may have a relatively round shape. In an embodiment, the concave portion CP may have a substantially semi-circular shape. However, the disclosure is not limited thereto. For example, the concave portion CP may have various shapes, for example, a substantially semi-elliptical shape, a substantially triangular shape, or a substantially rectangular shape.

In an embodiment, because the edges of the light blocking layer BML include the concave portions CP and the convex portions PP, the diffraction of light traveling to the electronic module (see SS of FIG. 2A) through the first hole BML-H defined in the light blocking layer BML may be minimized. Therefore, the resolution of light received by the electronic module SS may be increased. For example, in case that the electronic module SS is the camera module (see CMM of FIG. 2B), the edges of the light blocking layer BML are provided in the embo structure, and thus, the resolution of light received by the camera module CMM may be increased and the characteristics of the camera module CMM may be improved.

In an embodiment, the display apparatus may include a first pixel PXa and a second pixel PXm. The first pixel PXa may be arranged in the first area A1, and the second pixel PXm may be arranged in the second area A2. The first pixel PXa and the second pixel PXm may have different light-emitting areas, and the first pixel PXa and the second pixel PXm may have different arrangement shapes.

First pixels PXa may be provided in the first area A1, and may be apart from each other in the first direction DR1 and/or the second direction DR2. The first pixel PXa may include sub-pixels PXa1, PXa2, and PXa3.

In an embodiment, the first pixel PXa may be arranged in the display area BA, and signal lines and/or voltage lines may be arranged in the line area BL. The transmission area BT has higher transmittance than the display area BA and/or the line area BL. The transmission area BT may be defined as an area in which conductive materials or insulating layers are patterned or not deposited so as to improve transmittance. The transmission area BT in the first area A1 may be surrounded by the display area BA and the line area BL.

The transmission area BT may have various shapes. For example, the transmission area BT may have a polygonal shape in a plan view. The transmission area BT may have a circular or elliptical shape.

In the first area A1, the display areas BA may be apart from each other. Each of the display areas BA may be surrounded by the transmission area BT. Sub-pixels emitting light of different colors, for example, a (1-1)th sub-pixel PXa1, a (1-2)th sub-pixel PXa2, and a (1-3)th sub-pixel PXa3 may be provided in the display area BA.

In an embodiment, two (1-1)th sub-pixels PXa1, four (1-2)th sub-pixels PXa2, and two (1-3)th sub-pixels PXa3 may be provided in each of the display areas BA. For example, two (1-1)th sub-pixels PXa1, four (1-2)th sub-pixels PXa2, and two (1-3)th sub-pixels PXa3 may form one pixel group PG. The (1-1)th sub-pixel PXa1 may emit blue light, the (1-2)th sub-pixel PXa2 may emit green light, and the (1-3)th sub-pixel PXa3 may emit red light.

The (1-1)th, (1-2)th, and (1-3)th sub-pixels PXa1, PXa2, and PXa3 may be symmetrically arranged with respect to a center PGC of the pixel group PG. For example, in one display area BA, two (1-1)th sub-pixels PXa1, four (1-2)th sub-pixels PXa2, and two (1-3)th sub-pixels PXa3 may be symmetrically arranged with respect to the center PGC of the pixel group PG. For example, the two (1-1)th sub-pixels PXa1 may be apart from each other in a fourth direction DR4 with respect to the center PGC of the pixel group PG, and the two (1-3)th sub-pixels PXa3 may be apart from each other in a fifth direction DR5 with respect to the center PGC of the pixel group PG. Also, the four (1-2)th sub-pixels PXa2 may be apart from each other in the second direction DR2.

In an embodiment, the length of the (1-1)th sub-pixel PXa1 in the second direction DR2 may be greater than the length of the (1-3)th sub-pixel PXa3 in the second direction DR2. In an embodiment, the light-emitting area of the (1-1)th sub-pixel PXa1 may be greater than the light-emitting area of the (1-3)th sub-pixel PXa3, and the light-emitting area of the (1-3)th sub-pixel PXa3 may be greater than the light-emitting area of the (1-2)th sub-pixel PXa2. However, the disclosure is not limited thereto.

In an embodiment, the (1-1)th sub-pixel PXa1, the (1-2)th sub-pixel PXa2, and the (1-3)th sub-pixel PXa3 may be substantially rectangular in a plan view. For example, the (1-1)th sub-pixel PXa1 and the (1-3)th sub-pixel PXa3 may have a rectangular shape having a short side in the first direction DR1 and a long side in the second direction DR2, and the (1-2)th sub-pixel PXa2 may have a rectangular shape having a long side in the first direction DR1 and a short side in the second direction DR2. However, the disclosure is not limited thereto.

In an embodiment, at least one of the (1-1)th sub-pixel PXa1, the (1-2)th sub-pixel PXa2, and the (1-3)th sub-pixel PXa3 may have an n-gonal shape (where n is a natural number equal to or greater than 5) in a plan view. For example, the (1-2)th sub-pixel PXa2 may have a rectangular shape, but the edges of the (1-1)th sub-pixel PXa1 and the (1-3)th sub-pixel PXa3 adjacent to the transmission area BT may be bent at least once. Therefore, the (1-1)th sub-pixel PXa1 and the (1-3)th sub-pixel PXa3 may have an n-gonal shape (where n is a natural number equal to or greater than 5) in a plan view.

Second pixels PXm may be provided in the second area A2, and may be apart from each other in the fourth direction DR4 and/or the fifth direction DR5. The second pixel PXm may include sub-pixels including a (2-1)th sub-pixel PXm1, a (2-2)th sub-pixel PXm2, and a (2-3)th sub-pixel PXm3.

The (2-1)th sub-pixel PXm1, the (2-2)th sub-pixel PXm2, and the (2-3)th sub-pixel PXm3 may be arranged or disposed in the second area A2 according to a certain or a given rule. For example, the (2-1)th sub-pixel PXm1, the (2-2)th sub-pixel PXm2, and the (2-3)th sub-pixel PXm3 may be arranged in a PENTILE™ type.

For example, the (2-1)th sub-pixel PXm1 and the (2-2)th sub-pixel PXm2, which are adjacent to each other, may be apart from each other in the fifth direction DR5, and the (2-3)th sub-pixel PXm3 and the (2-2)th sub-pixel PXm2, which are adjacent to each other, may be apart from each other in the fourth direction DR4. Also, the (2-1)th sub-pixel PXm1 and the (2-3)th sub-pixel PXm3 may be alternately arranged or disposed in the first direction DR1 and/or the second direction DR2.

Each of the (2-1)th sub-pixel PXm1, the (2-2)th sub-pixel PXm2, and the (2-3)th sub-pixel PXm3 may have a circular shape. However, the disclosure is not limited thereto. For example, at least one of the (2-1)th sub-pixel PXm1, the (2-2)th sub-pixel PXm2, and the (2-3)th sub-pixel PXm3 may have a square shape, a rectangular shape, a diamond shape, or the like within the spirit and the scope of the disclosure.

In an embodiment, the pixel defining layer 323 may be on the substrate BS. The pixel defining layer 323 may be on the first area A1 and the second area A2. However, as will be described later, the pixel defining layer 323 may not be arranged in the line area BL, the first sub-area SA1, and the second sub-area SA2.

In an embodiment, the pixel defining layer 323 may include a first opening 3230P defining an emission area of each of the first and second pixels PXa and PXm. For example, the emission area of each of the first and second pixels PXa and PXm may be defined through the first opening 3230P defined in the pixel defining layer 323. For example, the emission area of each of the sub-pixels PXa1, PXa2, PXa3, PXm1, PXm2, and PXm3 may be defined through the first opening 3230P defined in the pixel defining layer 323.

In an embodiment, the black matrix 360 may be on the pixel defining layer 323. The pixel defining layer 323 and the black matrix 360 may at least partially overlap each other in the third direction DR3 perpendicular to the substrate BS. The black matrix 360 may be on the first area A1 and the second area A2. However, as will be described later, the black matrix 360 may not be arranged in the first sub-area SA1.

In an embodiment, the black matrix 360 may include a second opening 360OP that overlaps the first opening 3230P defined in the pixel defining layer 323. For example, the second opening 360OP may be defined in the black matrix 360, and the second opening 360OP defined in the black matrix 360 may overlap at least a portion of the first opening 3230P defined in the pixel defining layer 323. In an embodiment, the area of the second opening 360OP defined in the black matrix 360 may be greater than the area of the first opening 3230P defined in the pixel defining layer 323. However, the disclosure is not limited thereto. The area of the second opening 360OP defined in the black matrix 360 may be equal to the area of the first opening 3230P defined in the pixel defining layer 323, or the area of the second opening 360OP may be less than the area of the first opening 3230P.

In an embodiment, as described above, the first area A1 may include the first sub-area SA1, the second sub-area SA2, and the third sub-area SA3. In an embodiment, the first sub-area SA1 and the second sub-area SA2 may overlap the transmission area BT. For example, it may be understood that the transmission area BT may include the first sub-area SA1 and the second sub-area SA2.

In an embodiment, the first sub-area SA1 may be an area in which both the pixel defining layer 323 and the black matrix 360 are not arranged. The second sub-area SA2 may be an area in which the pixel defining layer 323 is not arranged or disposed and the black matrix 360 may be arranged or disposed. The third sub-area SA3 may be an area in which both the pixel defining layer 323 and the black matrix 360 are arranged. For example, the pixel defining layer 323 and the black matrix 360 may overlap each other in the third sub-area SA3, and may not overlap each other in the first sub-area SA1 and the second sub-area SA2. Because both the pixel defining layer 323 and the black matrix 360 are not arranged in the first sub-area SA1, the transmittance of the first sub-area SA1 may be greater than the transmittance of the second sub-area SA2 and the third sub-area SA3.

Referring to FIG. 6, in an embodiment, the electronic device may include a display apparatus DA, and the display apparatus DA may include a substrate BS, a buffer layer 311, insulating layers IL, a light-emitting element OLED1, an encapsulation member 340, an input sensor 350 (corresponding to ISS of FIG. 2B), a black matrix 360, a color filter 370, and an overcoat layer 380.

The substrate BS may have a structure in which layers including an organic material and layers including an inorganic material may be alternately stacked each other. For example, the substrate BS may include a first base layer 301, a first barrier layer 302, a second base layer 303, and a second barrier layer 304, which may be sequentially stacked each other.

The first base layer 301 may include an organic material. For example, the first base layer 301 may include one selected from polyimide, polyethylene naphthalate, polyethylene terephthalate, polyarylate, polycarbonate, polyetherimide, and polyethersulfone.

The first barrier layer 302 may be on the first base layer 301. The first barrier layer 302 may include an inorganic material. For example, the first barrier layer 302 may include silicon oxide, silicon oxynitride, silicon nitride, amorphous silicon, or the like within the spirit and the scope of the disclosure. In an embodiment, the first barrier layer 302 may include a first layer and a second layer, and the second layer may have a lower refractive index than that of the first layer. For example, the first layer may include silicon oxynitride, and the second layer may include silicon oxide having a lower refractive index than that of silicon oxynitride.

The second base layer 303 may be on the first barrier layer 302. The second base layer 303 may include the same material or a similar material as that of the first base layer 301. However, the disclosure is not limited thereto. The second base layer 303 may include a material different from that of the first base layer 301. In an embodiment, a thickness of the second base layer 303 may be less than a thickness of the first base layer 301.

The second barrier layer 304 may be on the second base layer 303. The second barrier layer 304 may include an inorganic material. For example, the second barrier layer 304 may include silicon oxide, silicon oxynitride, silicon nitride, or the like within the spirit and the scope of the disclosure. In an embodiment, the second barrier layer 304 may include a first layer and a second layer, and the second layer may have a lower refractive index than that of the first layer. For example, the first layer may include silicon oxynitride, and the second layer may include silicon oxide having a lower refractive index than that of silicon oxynitride.

The buffer layer 311 may be on the substrate BS. The buffer layer 311 may reduce or prevent infiltration of foreign material, moisture, or ambient air from below the substrate BS. The buffer layer 311 may include an inorganic material such as silicon oxide, silicon oxynitride, or silicon nitride, and may include a single layer or multiple layers including the above-described material. Although not illustrated, a light blocking layer (see BML, of FIG. 7) may be between the buffer layer 311 and the substrate BS of the second area A2.

A semiconductor pattern (for example, a first semiconductor layer) may be on the buffer layer 311. Hereinafter, a semiconductor pattern disposed on or directly disposed on the buffer layer 311 is defined as a first semiconductor pattern. The first semiconductor pattern may include a silicon semiconductor. The first semiconductor pattern may include polysilicon. However, the disclosure is not limited thereto. The first semiconductor pattern may include amorphous silicon.

FIG. 6 only illustrates a portion of the first semiconductor pattern, and the first semiconductor pattern may be further arranged in another region of the pixel (see PX of FIG. 4). The first semiconductor pattern may include a doped region and a non-doped region. The doped region may be doped with an N-type dopant or a P-type dopant. A P-type transistor may include a doped region doped with a P-type dopant.

A first transistor T1 (for example, a first thin-film transistor) may include a first source S1, a first active region A1, and a first drain D1. The first source S1, the first active region A1, and the first drain D1 of the first transistor T1 may include the first semiconductor pattern. The first source S1 and the first drain D1 of the first transistor T1 may be apart from each other with the first active region A1 of the first transistor T1 therebetween.

A connection signal line SCL may be further on the buffer layer 311. The connection signal line SCL may be connected to a drain D6 of a sixth transistor (see T6 of FIG. 4) in a plan view. However, the connection signal line SCL may be omitted.

A first insulating layer 313 may be on the buffer layer 311. The first insulating layer 313 may cover or overlap the first semiconductor pattern. In an embodiment, the first insulating layer 313 may include an inorganic material such as silicon oxide, silicon oxynitride, or silicon nitride, and may include a single layer or multiple layers including the above-described material.

The first gate G1 (for example, the first gate electrode) of the first transistor T1 may be on the first insulating layer 313. The first gate G1 may be a portion of a metal pattern. The first gate G1 of the first transistor T1 may overlap at least a portion of the first semiconductor pattern therebelow. For example, the first gate G1 may overlap the first active region A1 therebelow. The first gate G1 may include a low-resistance conductive material such as molybdenum (Mo), aluminum (Al), copper (Cu), and/or titanium (Ti), and may include a single layer or multiple layers including the above-described material.

A second insulating layer 314 may be on the first insulating layer 313. The second insulating layer 314 may cover or overlap the first gate G1 of the first transistor T1 arranged on the first insulating layer 313. The second insulating layer 314 may include an inorganic material such as silicon oxide, silicon oxynitride, or silicon nitride, and may include a single layer or multiple layers including the above-described material.

An upper electrode UE may be on the second insulating layer 314. The upper electrode UE may overlap at least a portion of the first gate G1 of the first transistor T1 therebelow. The upper electrode UE may be a portion of a metal pattern or a portion of a doped semiconductor pattern. A portion of the first gate G1 and the upper electrode UE overlapping the portion of the first gate G1 may form a first storage capacitor (see Cst of FIG. 4). However, the upper electrode UE may be omitted.

Although not illustrated separately, a first electrode (see CE1 of FIG. 4) and a second electrode (see CE2 of FIG. 4) of the first storage capacitor (see Cst of FIG. 4) may be formed through the same processes as the gate G1 and the upper electrode UE, respectively. The first electrode CE1 may be on the first insulating layer 313, and the first electrode CE1 may be electrically connected to the first gate G1. The first electrode CE1 may have a shape integral with the first gate G1.

A third insulating layer 315 may be on the second insulating layer 314. The third insulating layer 315 may cover or overlap the upper electrode UE arranged on the second insulating layer 314. The third insulating layer 315 may include an inorganic material such as silicon oxide, silicon oxynitride, or silicon nitride, and may include a single layer or multiple layers including the above-described material. In an embodiment, the third insulating layer 315 may include silicon oxide layers and silicon nitride layers, which may be alternately stacked each other.

Although not illustrated separately, sources (see S2, S5, S6, and S7 of FIG. 4), drains (see D2, D5, D6, and D7 of FIG. 4), and gates (see G2, G5, G6, and G7 of FIG. 4) of second, fifth, sixth, and seventh transistors (see T2, T5, T6, and T7 of FIG. 4) may be formed through the same processes as the first source S1, the first drain D1, and the first gate G1 of the first transistor T1, respectively.

A semiconductor pattern (for example, a second semiconductor layer) may be on the third insulating layer 315. Hereinafter, a semiconductor pattern disposed on or directly disposed on the third insulating layer 315 is defined as a second semiconductor pattern. The second semiconductor pattern may include an oxide semiconductor. The oxide semiconductor may include a crystalline or amorphous oxide semiconductor.

For example, the oxide semiconductor may include at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). By way of example, the oxide semiconductor may include indium tin oxide (ITO), indium gallium zinc oxide (IGZO), zinc oxide (ZnO), indium zinc oxide (IZnO), zinc indium oxide (ZIO), indium oxide (InO), titanium oxide (TiO), indium zinc tin oxide (IZTO), zinc tin oxide (ZTO), and the like within the spirit and the scope of the disclosure.

The third transistor T3 (for example, the second thin-film transistor) may include a third source S3, a third active region A3, and a third drain D3. The third source S3, the third active region A3, and the third drain D3 of the third transistor T3 may include the second semiconductor pattern. The third source S3 and the third drain D3 of the third transistor T3 may include a metal reduced from a metal oxide semiconductor. The third source S3 and the third drain D3 of the third transistor T3 may have a certain or a given thickness from the upper surface of the second semiconductor pattern, and may include a metal layer including a reduced metal.

A fourth insulating layer 316 may be on the third insulating layer 315. The fourth insulating layer 316 may cover or overlap the second semiconductor pattern arranged on the third insulating layer 315. In an embodiment, the fourth insulating layer 316 may include an inorganic material such as silicon oxide, silicon oxynitride, or silicon nitride, and may include a single layer or multiple layers including the above-described material.

In an embodiment, the fourth insulating layer 316 may be patterned to correspond to the third gate G3 (for example, the second gate electrode) of the third transistor T3 thereon. For example, the third gate G3 and the fourth insulating layer 316 may have a same shape in a plan view.

The third gate G3 of the third transistor T3 may be on the fourth insulating layer 316. The third gate G3 may be a portion of a metal pattern. The third gate G3 of the third transistor T3 may overlap at least a portion of the second semiconductor pattern therebelow. For example, the third gate G3 may overlap the active region A3 therebelow. The third gate G3 may include a low-resistance conductive material such as molybdenum (Mo), aluminum (Al), copper (Cu), and/or titanium (Ti), and may include a single layer or multiple layers including the above-described material.

A fifth insulating layer 317 may be on the fourth insulating layer 316. The fifth insulating layer 317 may cover or overlap the third gate G3 arranged on the fourth insulating layer 316. In an embodiment, the fifth insulating layer 317 may include an inorganic material such as silicon oxide, silicon oxynitride, or silicon nitride, and may include a single layer or multiple layers including the above-described material. In an embodiment, the fifth insulating layer 317 may include silicon oxide layers and silicon nitride layers, which may be alternately stacked each other.

Although not illustrated separately, the source (see S4 of FIG. 4), the drain (see D4 of FIG. 4), and the gate (see G4 of FIG. 4) of the fourth transistor (see T4 of FIG. 4) may be formed through the same processes as the third source S3, the third drain D3, and the third gate G3 of the third transistor T3.

The first to fifth insulating layers 313 to 317 may be collectively referred to as insulating layers IL. However, at least one of the first to fifth insulating layers 313 to 317 may be omitted.

At least one organic insulating layer may be on the fifth insulating layer 317. In an embodiment, a first organic insulating layer 318, a second organic insulating layer 319, and a third organic insulating layer 320 may be on the fifth insulating layer 317. The first organic insulating layer 318, the second organic insulating layer 319, and the third organic insulating layer 320 may be a single polyimide resin layer. However, the disclosure is not limited thereto. The first organic insulating layer 318, the second organic insulating layer 319, and the third organic insulating layer 320 may include at least one selected from an acrylic resin, a methacrylic resin, polyisoprene, a vinyl-based resin, an epoxy-based resin, a urethane-based resin, a cellulose-based resin, a siloxane-based resin, a polyamide-based resin, and a perylene-based resin.

A first connection electrode CNE1 may be on the fifth insulating layer 317. The first connection electrode CNE1 may be connected to the connection signal line SCL through contact holes CNT defined in the first to fifth insulating layers 313 to 317.

A second connection electrode CNE2 may be on the first organic insulating layer 318. The second connection electrode CNE2 may be connected to the first connection electrode CNE1 through a first via hole VIA1 defined in the first organic insulating layer 318.

A light-emitting element OLED1 may be on the third organic insulating layer 320. The light-emitting element OLED1 may include a pixel electrode 331, an intermediate layer 332, and an opposite electrode 333. The pixel electrode 331 may be on the third organic insulating layer 320. Also, a pixel defining layer 323 may be on the third organic insulating layer 320.

The pixel electrode 331 may be on the third organic insulating layer 320. The pixel electrode 331 may be electrically connected to the second connection electrode CNE2 through second via holes VIA2 defined in the second organic insulating layer 319 and the third organic insulating layer 320. The pixel electrode 331 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 331 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In an embodiment, the pixel electrode 331 may further include layers including ITO, IZO, ZnO, or $In_2O_3$ above or below the reflective layer. For example, the pixel electrode 331 may have a multilayer structure of ITO/Ag/ITO.

A pixel defining layer 323 having a first opening 3230P exposing at least a portion of the pixel electrode 331 may be on the pixel electrode 331. The first opening 3230P of the pixel defining layer 323 may define the emission area EA of light emitted from the light-emitting element OLED1. For example, the width of the first opening 323OP may correspond to the width of the emission area EA. A periphery of the emission area EA may be a non-emission area NEA, and the non-emission area NEA may surround the emission area EA.

The pixel defining layer 323 may include an organic insulating material. By way of example, the pixel defining layer 323 may include an inorganic insulating material such as silicon nitride, silicon oxynitride, or silicon oxide. By way of example, the pixel defining layer 323 may include an organic insulating material and an inorganic insulating material. In an embodiment, the pixel defining layer 323 may include a light blocking material and may be provided in black. The light blocking material may include carbon black, carbon nanotubes, a resin or paste including black dye, metal particles (for example, nickel, aluminum, molybdenum, and any alloy thereof), metal oxide particles (for example, chromium oxide), metal nitride particles (for example, chromium nitride), or the like within the spirit and the scope of the disclosure. In case that the pixel defining layer 323 may include a light blocking material, the reflection of external light due to metal structures below the pixel defining layer 323 may be reduced.

Although not illustrated, a spacer may be on the pixel defining layer 323. The spacer may include an organic insulating material such as polyimide. By way of example, the spacer may include an inorganic insulating material such as silicon nitride ($SiN_x$) or silicon oxide ($SiO_2$), or may include an organic insulating material and an inorganic insulating material.

In an embodiment, the spacer may include the same material or a similar material as that of the pixel defining layer 323. The pixel defining layer 323 and the spacer may be formed together in a mask process using a halftone mask or the like within the spirit and the scope of the disclosure. In an embodiment, the spacer and the pixel defining layer 323 may include different materials from each other.

The intermediate layer 332 may be on the pixel electrode 331. The intermediate layer 332 may include a first functional layer 332a, an emission layer 332b, and a second functional layer 332c, which may be sequentially stacked each other. The first functional layer 332a and the second functional layer 332c may be collectively referred to as an organic functional layer 332e.

The emission layer 332b may be arranged in the first opening 3230P of the pixel defining layer 323. The emission layer 332b may include a high molecular weight organic material or a low molecular weight organic material that emits light of a certain or a given color.

The organic functional layer 332e may include the first functional layer 332a between the pixel electrode 331 and the emission layer 332b and/or the second functional layer 332c between the emission layer 332b and the opposite electrode 333. For example, the first functional layer 332a may be between the pixel electrode 331 and the emission layer 332b, and the second functional layer 332c may be omitted between the emission layer 332b and the opposite electrode 333. In an embodiment, the first functional layer 332a may be omitted between the pixel electrode 331 and the emission layer 332b, and the second functional layer 332c may be between the emission layer 332b and the opposite electrode 333. In an embodiment, the first functional layer 332a may be between the pixel electrode 331 and the emission layer 332b, and the second functional layer 332c may be between the emission layer 332b and the opposite electrode 333. Hereinafter, a case in which both the first functional layer 332a and the second functional layer 332c are arranged will be described in detail.

The first functional layer 332a may include, for example, a hole transport layer (HTL), or may include an HTL and a hole injection layer (HIL). The second functional layer 332c may include an electron transport layer (ETL) and/or an electron injection layer (EIL). The first functional layer 332a and/or the second functional layer 332c may be a common layer that completely covers or overlaps the substrate BS.

The opposite electrode 333 may include a conductive material having a low work function. For example, the opposite electrode 333 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. By way of example, the opposite electrode 333 may further include a layer such as ITO, IZO, ZnO, or $In_2O_3$ on the (semi)transparent layer including the above-described material.

Although not illustrated, a capping layer may be further on the opposite electrode 333. The capping layer may include LiF, an inorganic material, and/or an organic material.

An encapsulation member may be on the light-emitting element OLED1. The encapsulation member may include a thin-film encapsulation layer 340. In an embodiment, although a case in which the thin-film encapsulation layer 340 is provided as the encapsulation member is illustrated, the disclosure is not limited thereto. The encapsulation member may be an encapsulation substrate.

The thin-film encapsulation layer 340 may include at least one inorganic layer and at least one organic layer. For example, the thin-film encapsulation layer 340 may include a first inorganic layer 341, an organic layer 342, and a second inorganic layer 343, which may be sequentially stacked each other.

The first inorganic layer 341 may be disposed on or directly disposed on the opposite electrode 333. The first inorganic layer 341 may prevent or minimize infiltration of external moisture or oxygen into the light-emitting element OLED1.

The organic layer 342 may be disposed on or directly disposed on the first inorganic layer 341. The organic layer 342 may provide a flat surface on the first inorganic layer 341. Because unevenness or particles on the upper surface of the first inorganic layer 341 are covered or overlapped by the organic layer 342, the influence of the surface state of the upper surface of the first inorganic layer 341 on the components formed on the organic layer 342 may be blocked.

The second inorganic layer 343 may be disposed on or directly disposed on the organic layer 342. The second inorganic layer 343 may prevent or minimize the release of moisture from the organic layer 342 to the outside.

The first inorganic layer 341 and the second inorganic layer 343 may include at least one inorganic material selected from aluminum oxide, titanium oxide, tantalum oxide, hafnium oxide, zinc oxide, silicon oxide, silicon nitride, and silicon oxynitride. The first inorganic layer 341 and the second inorganic layer 343 may include a single layer or multiple layers including the above-described material. The organic layer 342 may include a polymer-based material. The polymer-based material may include an acrylic resin, an epoxy-based resin, polyimide, polyethylene, and the like within the spirit and the scope of the disclosure. In an embodiment, the organic layer 342 may include acrylate.

An input sensor 350 (see ISS of FIG. 2B) may be on the encapsulation member. The input sensor 350 may include conductive patterns 352 and 354, a first sensing insulating layer 351, a second sensing insulating layer 353, and a third sensing insulating layer 355.

The first sensing insulating layer 351 may be on the encapsulation member. Also, the first conductive patterns 352 may be on the first sensing insulating layer 351 and may be covered or overlapped by the second sensing insulating layer 353. Also, the second conductive patterns 354 may be on the second sensing insulating layer 353 and may be covered or overlapped by the third sensing insulating layer 355. The first sensing insulating layer 351, the second sensing insulating layer 353, and the third sensing insulating layer 355 may include an inorganic material and/or an organic material.

The conductive patterns 352 and 354 may have conductivity. The conductive patterns 352 and 354 may include a single layer or multiple layers. Also, at least one of the conductive patterns 352 and 354 may include mesh lines in a plan view.

The mesh lines constituting the conductive patterns 352 and 354 may not overlap the emission layer 332*b* in a plan view. Therefore, even in case that the input sensor 350 is disposed on or directly disposed on the display panel (see DP of FIG. 2B), light emitted from the pixels PX of the display panel DP may be provided to a user without interference of the input sensor 350.

In case that the black matrix 360 is disposed on or directly disposed on the second conductive pattern 354, the second conductive pattern 354 may be damaged during a process of patterning the black matrix 360. Therefore, the third sensing insulating layer 355 between the second conductive pattern 354 and the black matrix 360 may prevent or minimize damage to the second conductive pattern 354.

A color filter 370 may be on the input sensor 350. The color filter 370 may overlap at least a portion of the emission layer 332*b* therebelow. The color filter 370 may selectively transmit light corresponding to the light provided from the emission layer 332*b*. For example, in case that the emission layer 332*b* provides blue light, the color filter 370 may be a blue color filter that transmits blue light. By way of example, in case that the emission layer 332*b* provides green light, the color filter 370 may be a green color filter that transmits green light. By way of example, in case that the emission layer 332*b* provides red light, the color filter 370 may be a red color filter that transmits red light.

The color filter 370 may include a polymer photosensitive resin and a pigment or dye. For example, the color filter 370 overlapping the emission layer 332*b* providing blue light may include a blue pigment or dye, the color filter 370 overlapping the emission layer 332*b* providing green light may include a green pigment or dye, and the color filter 370 overlapping the emission layer 332*b* providing red light may include a red pigment or dye.

However, the disclosure is not limited thereto. The color filter 370 overlapping the emission layer 332*b* providing blue light may not include a pigment or dye. The color filter 370 may be transparent, and the color filter 370 may include a transparent photosensitive resin.

The black matrix 360 may be between the color filters 370 providing different pieces of light from each other. The black matrix 360 may be a pattern having a black color, and may be a grid-shaped matrix. The black matrix 360 may include a black coloring agent. The black coloring agent may include a black dye or a black pigment. The black coloring agent may include carbon black, a metal such as chromium, or any oxide thereof. In an embodiment, the black matrix 360 may include the same material or a similar material as that of the pixel defining layer 323.

In an embodiment, the black matrix 360 may include a second opening 360OP overlapping the emission area EA of the light-emitting element OLED1. The width of the second opening 360OP of the black matrix 360 may be equal to or greater than the width of the emission area EA of the light-emitting element OLED1 and/or the first opening 323OP of the pixel defining layer 323. However, the disclosure is not limited thereto.

In an embodiment, the color filter 370 may be positioned (or arranged) within the second opening 360OP defined in the black matrix 360. The overcoat layer 380 may be on the color filter 370 and the black matrix 360. The overcoat layer 380 may be a light-transmitting layer that does not have a color in a visible light band, and may surround the concave-convex surfaces generated in the process of forming the color filter 370 and the black matrix 360 and provide a flat upper surface. For example, the overcoat layer 380 may include a light transmitting organic material such as an acrylic resin.

Referring to FIGS. 6 and 7, in an embodiment, the electronic device may include a display apparatus DA, and the display apparatus DA may include a substrate BS, a buffer layer 311, insulating layers IL, a light-emitting element OLED2, an encapsulation member 340, an input sensor 350 (corresponding to ISS of FIG. 2B), a black matrix 360, a color filter 370, and an overcoat layer 380.

The substrate BS may have a structure in which layers including an organic material and layers including an inorganic material may be alternately stacked each other. For example, the substrate BS may include a first base layer 301, a first barrier layer 302, a second base layer 303, and a second barrier layer 304, which may be sequentially stacked each other.

The buffer layer 311 may be on the substrate BS. The buffer layer 311 may be arranged not only in the display area BA but also in the transmission area BT.

In an embodiment, a light blocking layer BML, may be between the substrate BS and the buffer layer 311. However, the disclosure is not limited thereto. For example, in case that the second barrier layer 304 is omitted, the light blocking layer BML may be between the second base layer 303 and the buffer layer 311.

In an embodiment, the light blocking layer BML on the display area BA may protect the pixel circuit (see PC of FIG. 4) and the light-emitting element OLED2 on the display area BA during a process of removing the opposite electrode 333 on the transmission area BT. Also, the light blocking layer BML may prevent or reduce the influence of electrical potential on the pixel circuit PC due to the polarization phenomenon of the first base layer 301 and the second base layer 303 in case that a constant voltage or a signal is applied to the light blocking layer BML.

In an embodiment, the light blocking layer BML may prevent or reduce the influence of light traveling to the electronic module (see SS of FIG. 2A) overlapping the first area A1 or light emitted from the electronic module SS on the components such as the transistors. Also, the light blocking layer BML may prevent or minimize visual recognition of the conductive materials on the substrate BS as the electronic module SS by external light. Therefore, even in case that the electronic module SS is arranged inside the active area (see AA of FIG. 2A), the electronic device (see 1000 of FIG. 2A) in which the performance of the electronic module SS is improved may be provided.

In an embodiment, the light blocking layer BML may include a first light blocking layer, a second light blocking layer, and a third light blocking layer, which may be sequentially stacked each other. The first light blocking layer, the second light blocking layer, and the third light blocking layer may include different materials from each other. For example, the first light blocking layer may include amorphous silicon, the second light blocking layer may include silicon oxide, and the third light blocking layer may include a conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

External light reflected by the electronic module SS may be reflected from the light blocking layer BML and incident on the electronic module SS again, which causes a ghost phenomenon. In an embodiment, because the light blocking layer BML may include the first light blocking layer, the second light blocking layer, and the third light blocking layer, the destructive interference of external light reflected by the electronic module SS may occur in the light blocking layer BML, thereby preventing or minimizing the occurrence of the ghost phenomenon.

In an embodiment, the transmission area BT may be formed by omitting insulating layers overlapping the transmission area BT in the first to fifth insulating layers 313 to 317. For example, at least one of the first to fifth insulating layers 313 to 317 may include a hole corresponding to the transmission area.

In an embodiment, in case that the first to fifth insulating layers 313 to 317 are collectively referred to as insulating layers IL, the insulating layers IL may include a second hole IL-H corresponding to the transmission area BT. In case that the insulating layers IL include the second hole IL-H corresponding to the transmission area BT, the transmittance of the transmission area BT may be improved.

A first organic insulating layer 318, a second organic insulating layer 319, a third organic insulating layer 320, and a pixel defining layer 323 may be sequentially on the display area BA of the first area A1. The second organic insulating layer 319, the third organic insulating layer 320, and the pixel defining layer 323 may include a third hole 319H, a fourth hole 320H, and a fourth hole 323H corresponding to the transmission area BT, respectively.

In case that the hole corresponding to the transmission area BT is provided in the first organic insulating layer 318, at least one of the second organic insulating layer 319, the third organic insulating layer 320, and the pixel defining layer, which are on the first organic insulating layer 318, may flow down to the transmission area BT due to the step difference between the display area BA and the transmission area BT. For example, the pixel defining layer 323 on the display area BA may flow down to the transmission area BT.

In an embodiment, the hole corresponding to the transmission area BT may not be provided in the first organic insulating layer 318. For example, the first organic insulating layer 318 may be arranged in both the display area BA and the transmission area BT. In case that the first organic insulating layer 318 is arranged in both the display area BA and the transmission area BT, at least one of the second organic insulating layer 319, the flow-down of the third organic insulating layer 320, and the pixel defining layer 323, which are on the first organic insulating layer 318, to the transmission area BT may be prevented or minimized.

Also, because the third hole 319H, the fourth hole 320H, and the fifth hole 323H corresponding to the transmission area BT are respectively defined in the second organic insulating layer 319, the third organic insulating layer 320, and the pixel defining layer 323, the transmittance of the transmission area BT may be improved.

A first connection electrode CNE1 may be on the fifth insulating layer 317, and a second connection electrode CNE2 may be on the first organic insulating layer 318. Also, a light-emitting element OLED2 including a pixel electrode 331, an intermediate layer 332, and an opposite electrode 333 may be on the pixel defining layer 323.

In an embodiment, the second connection electrode CNE2 may be electrically connected to the first connection electrode CNE1 through the first via hole VIA1 defined in the first organic insulating layer 318, and the pixel electrode 331 may be electrically connected to the second connection electrode CNE2 through the second via hole VIA2 defined in the second organic insulating layer 319 and the third organic insulating layer 320.

Although FIG. 7 illustrates that that the first connection electrode CNE1 and the second connection electrode CNE2 overlap the first transistor T1, this is for convenience of description and the disclosure is not limited thereto. Also, although FIG. 7 illustrates that that the first connection electrode CNE1 is between the first transistor T1 and the third transistor T3, this is for convenience of description and the disclosure is not limited thereto.

In an embodiment, the organic functional layer 322e may include a first functional layer 332a and a second functional layer 332c. The first functional layer 332a and the second functional layer 332c may be on both the display area BA and the transmission area BT.

In an embodiment, the opposite electrode 333 may be on the display area BA of the first area A1. The opposite electrode 333 may include a sixth hole 333H corresponding to the transmission area BT. Because the sixth hole 333H corresponding to the transmission area BT is defined in the opposite electrode 333, the transmittance of the transmission area BT may be improved.

The encapsulation member, the input sensor 350, the black matrix 360, the color filter 370, and the overcoat layer 380 may be sequentially on the light-emitting element OLED2.

The encapsulation member may include a thin-film encapsulation layer 340, and the thin-film encapsulation layer 340 may include a first inorganic layer 341, an organic layer 342, and a second inorganic layer 343, which may be sequentially stacked each other. The first inorganic layer 341, the organic layer 342, and the second inorganic layer 343 may be arranged in both the display area BA and the transmission area BT.

The input sensor 350 may include conductive patterns 352 and 354, a first sensing insulating layer 351, a second sensing insulating layer 353, and a third sensing insulating layer 355. The first sensing insulating layer 351, the second sensing insulating layer 353, and the third sensing insulating layer 355 may be on both the display area BA and the transmission area BT.

A black matrix 360 including a second opening 360OP corresponding to the emission layer 332b may be on the input sensor 350, and the color filter 370 may be positioned in the second opening 360OP defined in the black matrix 360. The color filter 370 may also be on the upper surface of the black matrix 360. The black matrix 360 is on the display area BA and may include a seventh hole 360H corresponding to the transmission area BT. Because the seventh hole 360H corresponding to the transmission area BT is defined in the black matrix 360, the transmittance of the transmission area BT may be improved.

An overcoat layer 380 may be on the color filter 370 and the black matrix 360. The overcoat layer 380 may be in both the display area BA and the transmission area BT.

Figure 8:
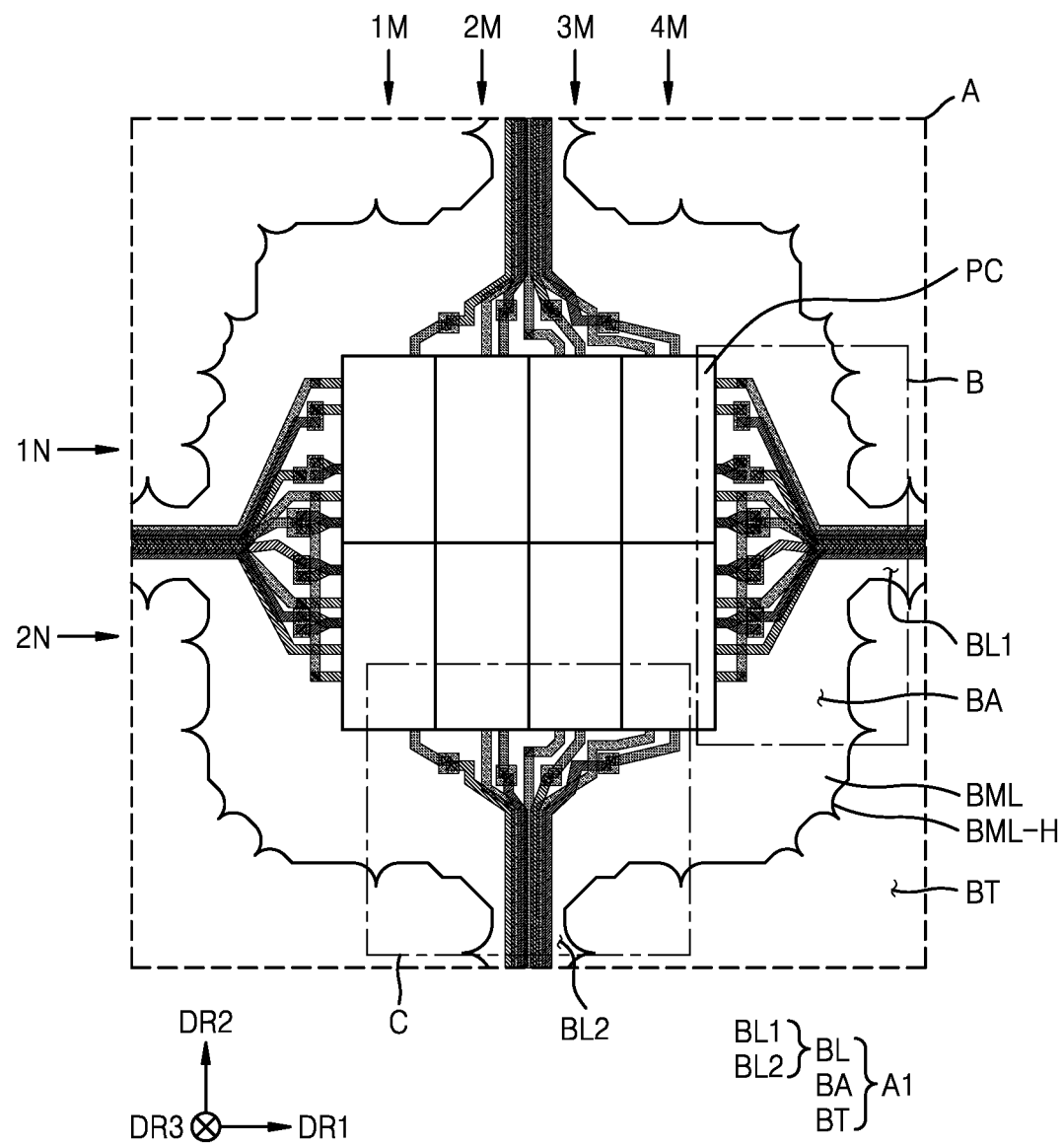
FIG. 8 is a schematic plan view schematically illustrating a portion of a first area in an electronic device, according to an embodiment.

FIG. 8 is a schematic plan view schematically illustrating a portion of a first area A1 in an electronic device, according to an embodiment. FIG. 8 is an enlarged view of region A of FIG. 5.

In an embodiment, the first area A1 may include a display area BA, a transmission area BT, and a line area BL. The line area BL may include a first line area BL1 extending in a first direction DR1 and a second line area BL2 extending in a second direction DR2. Signal lines and/or voltage lines may be arranged in the first line area BL1 and the second line area BL2.

In an embodiment, pixel circuits PC may be on the display area BA. Each of the pixel circuits PC may be electrically connected to the above-described light-emitting element OLED2 and may drive the light-emitting element OLED2.

The pixel circuits PC may be arranged in the first direction DR1 and the second direction DR2. In an embodiment, eight pixel circuits PC may be arranged in one display area BA. However, the disclosure is not limited thereto. Various numbers of pixel circuits PC may be arranged in one display area BA. For example, two, three, or four pixel circuits PC may be arranged in one display area BA.

In an embodiment, the pixel circuits PC may be arranged in rows and columns in the display area BA. Four pixel circuits PC may be arranged in a first row 1N, and four pixel circuits PC may be arranged in a second row 2N adjacent to the first row 1N. Also, two pixel circuits PC may be arranged in a first column 1M, two pixel circuits PC may be arranged in a second column 2M adjacent to the first column 1M, two pixel circuits PC may be arranged in a third column 3M adjacent to the second column 2M, and two pixel circuits PC may be arranged in a fourth column 4M adjacent to the third column 3M. However, the disclosure is not limited thereto.

Figure 9:
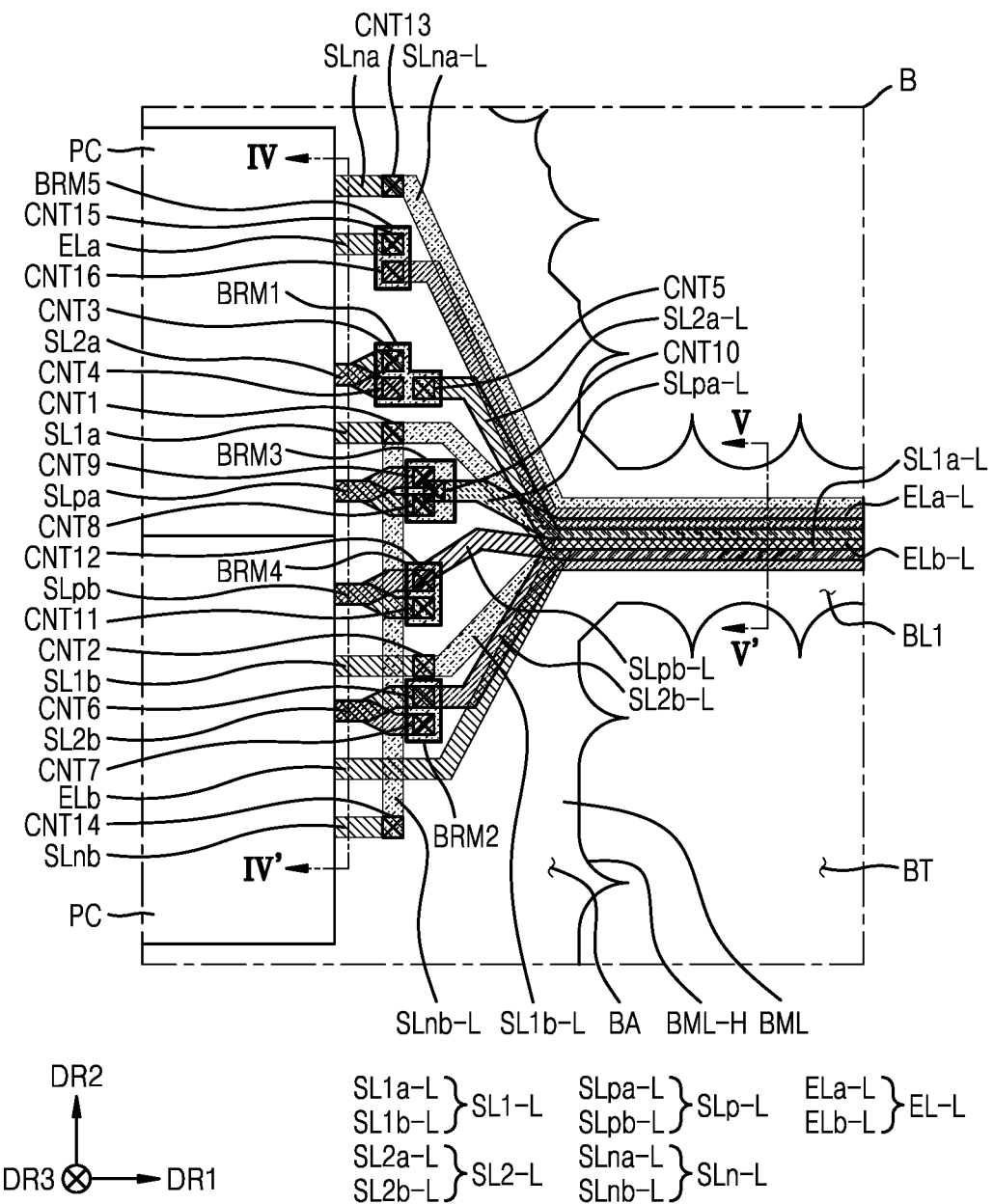
FIG. 9 is a schematic plan view schematically illustrating a portion of a first area in an electronic device, according to an embodiment.
Figure 10:
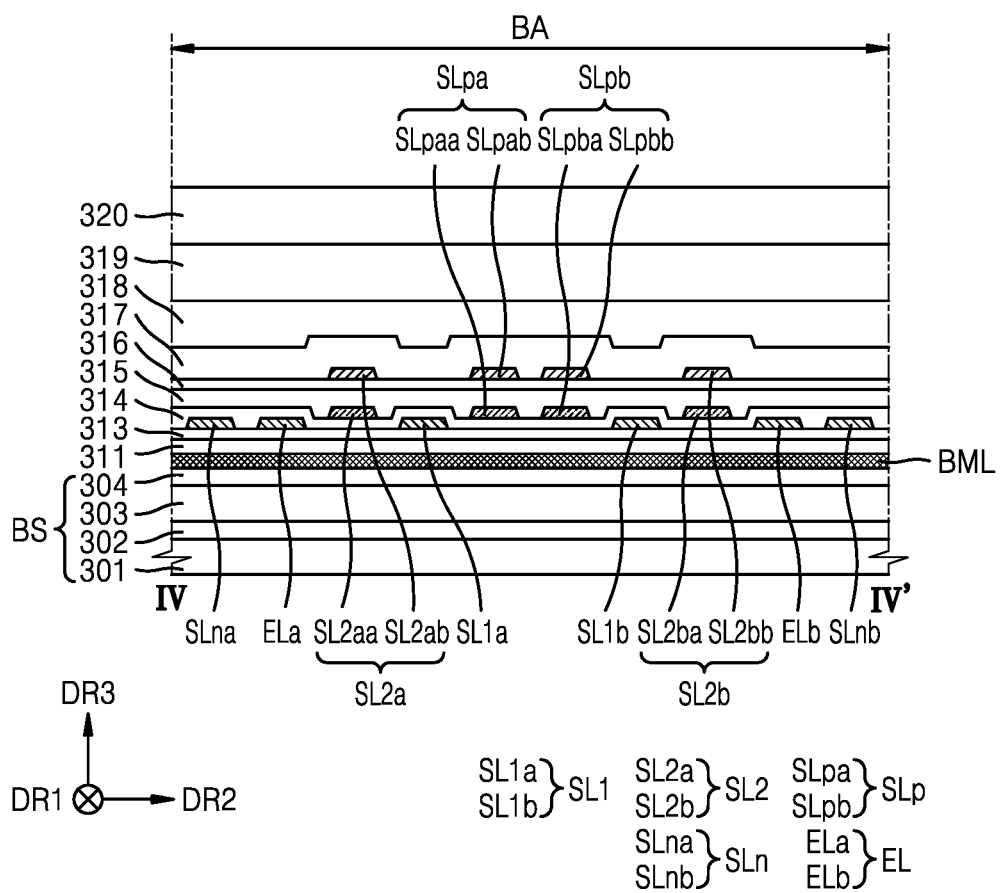
FIG. 10 is a schematic cross-sectional view schematically illustrating a portion of a first area in an electronic device, according to an embodiment.
Figure 11:
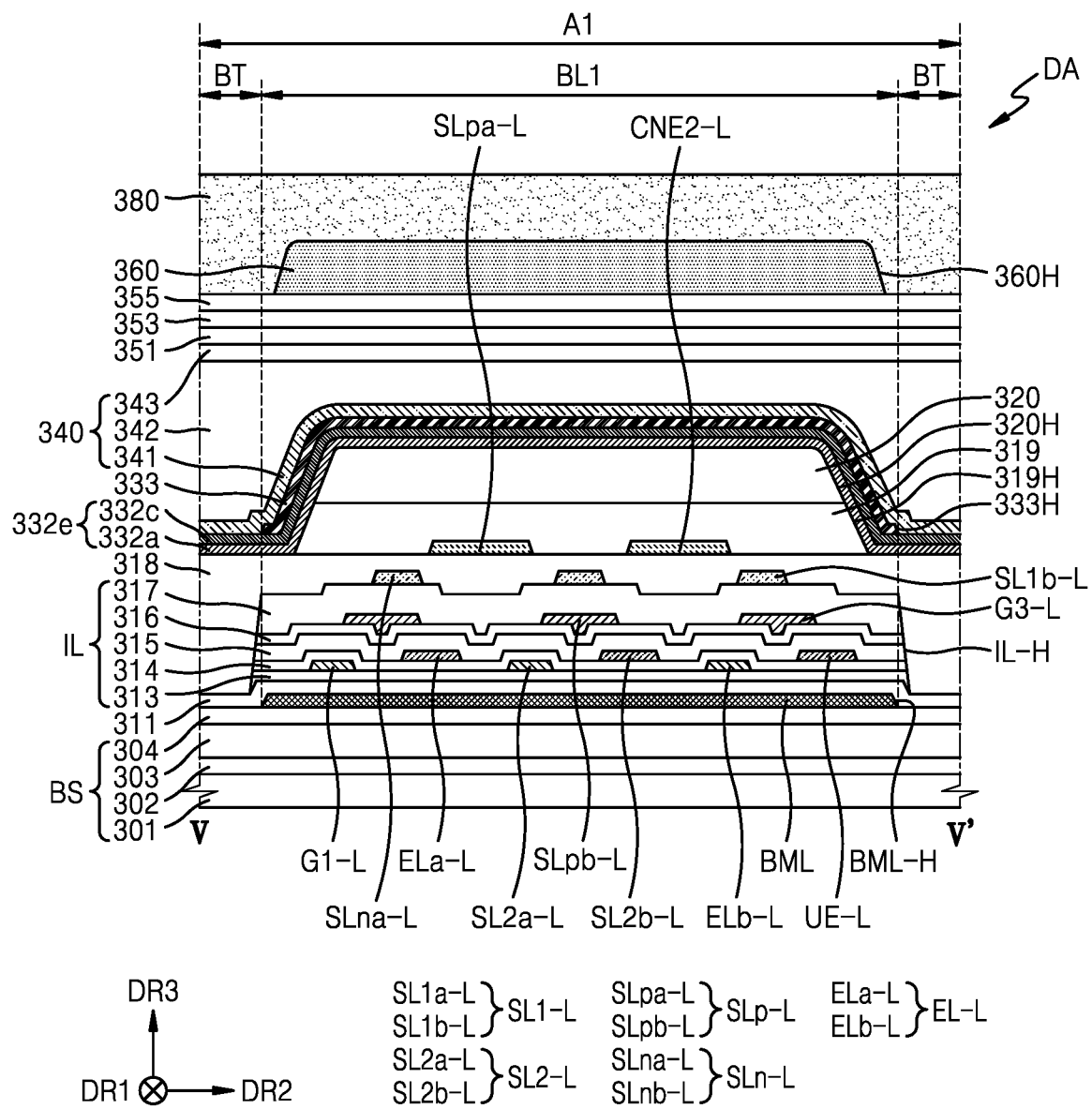
FIG. 11 is a schematic cross-sectional view schematically illustrating a portion of a first area in an electronic device, according to an embodiment.

FIG. 9 is a schematic plan view schematically illustrating a portion of a first area in an electronic device, according to an embodiment, FIG. 10 is a schematic cross-sectional view schematically illustrating a portion of a first area in an electronic device, according to an embodiment, and FIG. 11 is a schematic cross-sectional view schematically illustrating a portion of a first area in an electronic device, according to an embodiment. FIG. 9 is an enlarged view of region B of FIG. 8, FIG. 10 is a schematic cross-sectional view of the display area BA taken along line IV-IV' of FIG. 9, and FIG. 11 is a schematic cross-sectional view of the first line area BL1 taken along line V-V' of FIG. 9.

Referring to FIGS. 8, 9, 10, and 11, as described above with reference to FIG. 4, in each of the pixel circuits PC, a first scan signal Sn (FIG. 4) may be transmitted through a first scan line SL1, a second scan signal Sn' (FIG. 4) may be transmitted through a second scan line SL2, a third scan signal Sn−1 (FIG. 4) may be transmitted through a third scan line SLp, a fourth scan signal Sn+1 (FIG. 4) may be transmitted through a fourth scan line SLn, and an emission control signal En (FIG. 4) may be transmitted through an emission control line EL. However, the disclosure is not limited thereto.

In an embodiment, at least a portion of the first scan line SL1, the second scan line SL2, the third scan line SLp, the fourth scan line SLn, and the emission control line EL may extend in the first direction DR1. Therefore, the first scan line SL1, the second scan line SL2, the third scan line SLp, the fourth scan line SLn, and the emission control line EL may be connected to the pixel circuits PC arranged in a same row. However, the disclosure is not limited thereto.

A substrate BS may include a first base layer 301, a first barrier layer 302, a second base layer 303, and a second barrier layer 304, which may be sequentially stacked each other. A light blocking layer BML, may be on the substrate BS. The light blocking layer BML, on the display area BA and the first line area BL1 may have the structure described above with reference to FIG. 7. A buffer layer 311 may be on the light blocking layer BML.

A first insulating layer 313, a second insulating layer 314, a third insulating layer 315, a fourth insulating layer 316, a fifth insulating layer 317, a first organic insulating layer 318, a second organic insulating layer 319, and a third organic insulating layer 320 may be sequentially on the buffer layer 311. The first insulating layer 313, the second insulating layer 314, the third insulating layer 315, the fourth insulating layer 316, the fifth insulating layer 317, the first organic insulating layer 318, the second organic insulating layer 319, and the third organic insulating layer 320 may include the material described above with reference to FIG. 6.

In an embodiment, signal lines may be on the display area BA. The signal lines may include a first scan line SL1, a second scan line SL2, a third scan line SLp, a fourth scan line SLn, and an emission control line EL.

In an embodiment, the signal lines may be on the light blocking layer BML. For example, the signal lines, for example, the first scan line SL1, the second scan line SL2, the third scan line SLp, the fourth scan line SLn, and the emission control line EL may be on the light blocking layer BML.

The respective signal lines may be shared by the pixel circuits PC arranged in a same row. Therefore, two first scan lines SL1, two second scan lines SL2, two third scan lines SLp, two fourth scan lines SLn, and two emission control lines EL may be on the display area BA.

In an embodiment, one of the two first scan lines SL1 on the display area BA may be connected to the pixel circuits PC arranged in the first row 1N, and the other thereof may be connected to the pixel circuits PC arranged in the second row 2N, which is the next row of the first row 1N. The first scan line SL1 connected to the pixel circuits PC arranged in the first row 1N may be referred to as a (1−1)th scan line SL1a, and the first scan line SL1 connected to the pixel circuits PC arranged in the second row 2N may be referred to as a (1−2)th scan line SL1b. For example, the first scan line SL1 may include the (1−1)th scan line SL1a and the (1−2)th scan line SL1b. The (1−1)th scan line SL1a may be connected to the pixel circuits PC arranged in the first row 1N, and the (1−2)th scan line SL1b may be connected to the pixel circuits PC arranged in the second row 2N. However, the disclosure is not limited thereto.

In an embodiment, one of the two second scan lines SL2 on the display area BA may be connected to the pixel circuits PC arranged in the first row 1N, and the other thereof may be connected to the pixel circuits PC arranged in the second row 2N, which is the next row of the first row 1N. The second scan line SL2 connected to the pixel circuits PC arranged in the first row 1N may be referred to as a (2-1)th scan line SL2a, and the second scan line SL2 connected to the pixel circuits PC arranged in the second row 2N may be referred to as a (2-2)th scan line SL2b. For example, the second scan line SL2 may include the (2-1)th scan line SL2a and the (2-2)th scan line SL2b. The (2-1)th scan line SL2a may be connected to the pixel circuits PC arranged in the first row 1N, and the (2-2)th scan line SL2b may be connected to the pixel circuits PC arranged in the second row 2N. However, the disclosure is not limited thereto.

In an embodiment, one of the two third scan lines SLp on the display area BA may be connected to the pixel circuits PC arranged in the first row 1N, and the other thereof may be connected to the pixel circuits PC arranged in the second row 2N, which is the next row of the first row 1N. The third scan line SLp connected to the pixel circuits PC arranged in the first row 1N may be referred to as a (3-1)th scan line SLpa, and the third scan line SLp connected to the pixel circuits PC arranged in the second row 2N may be referred to as a (3-2)th scan line SLpb. For example, the third scan line SLp may include the (3-1)th scan line SLpa and the (3-2)th scan line SLpb. The (3-1)th scan line SLpa may be connected to the pixel circuits PC arranged in the first row 1N, and the (3-2)th scan line SLpb may be connected to the pixel circuits PC arranged in the second row 2N. However, the disclosure is not limited thereto.

In an embodiment, one of the two fourth scan lines SLn on the display area BA may be connected to the pixel circuits PC arranged in the first row 1N, and the other thereof may be connected to the pixel circuits PC arranged in the second row 2N, which is the next row of the first row 1N. The fourth scan line SLn connected to the pixel circuits PC arranged in the first row 1N may be referred to as a (4-1)th scan line SLna, and the fourth scan line SLn connected to the pixel circuits PC arranged in the second row 2N may be referred to as a (4-2)th scan line SLnb. For example, the fourth scan line SLn may include the (4-1)th scan line SLna and the (4-2)th scan line SLnb. The (4-1)th scan line SLna may be connected to the pixel circuits PC arranged in the first row 1N, and the (4-2)th scan line SLnb may be connected to the pixel circuits PC arranged in the second row 2N. However, the disclosure is not limited thereto.

In an embodiment, one of the two emission control lines EL on the display area BA may be connected to the pixel circuits PC arranged in the first row 1N, and the other thereof may be connected to the pixel circuits PC arranged in the second row 2N, which is the next row of the first row 1N. The emission control line EL connected to the pixel circuits PC arranged in the first row 1N may be referred to as a first emission control line ELa, and the emission control line EL connected to the pixel circuits PC arranged in the second row 2N may be referred to as a second emission control line ELb. For example, the emission control line EL may include the first emission control line ELa and the second emission control line ELb. The first emission control line ELa may be connected to the pixel circuits PC arranged in the first row 1N, and the second emission control line ELb may be connected to the pixel circuits PC arranged in the second row 2N. However, the disclosure is not limited thereto.

In an embodiment, connection lines may be on the first line area BL1. The connection lines may include a first scan connection line SL1-L, a second scan connection line SL2-L, a third scan connection line SLp-L, a fourth scan connection line SLn-L, and an emission control connection line EL-L.

In an embodiment, the first scan connection line SL1-L may include a (1-1)th scan connection line SL1a-L and a (1-2)th scan connection line SL1b-L. The (1-1)th scan connection line SL1a-L may be electrically connected to the (1-1)th scan line SL1a, and the (1-2)th scan connection line SL1b-L may be electrically connected to the (1-2)th scan line SL1b. However, the disclosure is not limited thereto.

In an embodiment, the second scan connection line SL2-L may include a (2-1)th scan connection line SL2a-L and a (2-2)th scan connection line SL2b-L. The (2-1)th scan connection line SL2a-L may be electrically connected to the (2-1)th scan line SL2a, and the (2-2)th scan connection line SL2b-L may be electrically connected to the (2-2)th scan line SL2b. However, the disclosure is not limited thereto.

In an embodiment, the third scan connection line SLp-L may include a (3-1) scan connection line SLpa-L and a (3-2)th scan connection line SLpb-L. The (3-1)th scan connection line SLpa-L may be electrically connected to the (3-1)th scan line SLpa, and the (3-2)th scan connection line SLpb-L may be electrically connected to the (3-2)th scan line SLpb. However, the disclosure is not limited thereto.

In an embodiment, the fourth scan connection line SLn-L may include a (4-1)th scan connection line SLna-L and a (4-2)th scan connection line SLnb-L. The (4-1)th scan connection line SLna-L may be electrically connected to the (4-1)th scan line SLna, and the (4-2)th scan connection line SLnb-L may be electrically connected to the (4-2)th scan line SLnb. However, the disclosure is not limited thereto.

In an embodiment, the emission control connection line EL-L may include a first emission control connection line ELa-L and a second emission control connection line ELb-L. The first emission control connection line ELa-L may be electrically connected to the first emission control line ELa, and the second emission control connection line ELb-L may be electrically connected to the second emission control line ELb. However, the disclosure is not limited thereto.

In an embodiment, the (1-1)th scan line SL1a may be on the display area BA, and the (1-1)th scan connection line SL1a-L may be on the display area BA and the first line area BL1. At least a portion of each of the (1-1)th scan line SL1a and the (1-1)th scan connection line SL1a-L may extend in the first direction DR1.

In an embodiment, the (1-1)th scan line SL1a may be on the first insulating layer 313, and the (1-1)th scan connection line SL1a-L may be on the fifth insulating layer 317. For example, the (1-1)th scan line SL1a and the (1-1)th scan connection line SL1a-L may be on different layers from each other. However, the disclosure is not limited thereto. The (1-1)th scan line SL1a and the (1-1)th scan connection line SL1a-L may be on a same layer.

Although FIG. 10 illustrates that the (1-1)th scan line SL1a is on the first insulating layer 313, the disclosure is not limited thereto. The (1-1)th scan line SL1a may be on one of the second insulating layer 314, the third insulating layer 315, and the fourth insulating layer 316. Also, although FIG. 11 illustrates that the (1-1)th scan connection line SL1a-L is on the fifth insulating layer 317, the disclosure is not limited thereto. The (1-1)th scan connection line SL1a-L may be on one of the first insulating layer 313, the second insulating layer 314, the third insulating layer 315, the fourth insulating layer 316, and the first organic insulating layer 318.

In an embodiment, the (1-1)th scan line SL1a and the (1-1)th scan connection line SL1a-L may be electrically connected to each other. For example, the (1-1)th scan line SL1*a* and the (1-1)th scan connection line SL1*a*-L may be electrically connected to each other through the first contact hole CNT1. However, the disclosure is not limited thereto. The (1-1)th scan line SL1*a* and the (1-1)th scan connection line SL1*a*-L may be electrically connected to each other through a bridge metal.

In an embodiment, the (1-2)th scan line SL1*b* may be on the display area BA, and the (1-2)th scan connection line SL1*b*-L may be on the display area BA and the first line area BL1. At least a portion of each of the (1-2)th scan line SL1*b* and the (1-2)th scan connection line SL1*b*-L may extend in the first direction DR1.

In an embodiment, the (1-2)th scan line SL1*b* may be on the first insulating layer 313, and the (1-2)th scan connection line SL1*b*-L may be on the fifth insulating layer 317. For example, the (1-2)th scan line SL1*b* and the (1-2)th scan connection line SL1*b*-L may be on different layers from each other. However, the disclosure is not limited thereto. The (1-2)th scan line SL1*b* and the (1-2)th scan connection line SL1*b*-L may be on a same layer.

Although FIG. 10 illustrates that the (1-2)th scan line SL1*b* is on the first insulating layer 313, the disclosure is not limited thereto. The (1-2)th scan line SL1*b* may be on one of the second insulating layer 314, the third insulating layer 315, and the fourth insulating layer 316. Also, although FIG. 11 illustrates that the (1-2)th scan connection line SL1*b*-L is on the fifth insulating layer 317, the disclosure is not limited thereto. The (1-2)th scan connection line SL1*b*-L may be on one of the first insulating layer 313, the second insulating layer 314, the third insulating layer 315, the fourth insulating layer 316, and the first organic insulating layer 318.

In an embodiment, the (1-2)th scan line SL1*b* and the (1-2)th scan connection line SL1*b*-L may be electrically connected to each other. For example, the (1-2)th scan line SL1*b* and the (1-2)th scan connection line SL1*b*-L may be electrically connected to each other through the second contact hole CNT2. However, the disclosure is not limited thereto. The (1-2)th scan line SL1*b* and the (1-2)th scan connection line SL1*b*-L may be electrically connected to each other through a bridge metal.

In an embodiment, the (2-1)th scan line SL2*a* may be on the display area BA, and the (2-1)th scan connection line SL2*a*-L may be on the display area BA and the first line area BL1. At least a portion of each of the (2-1)th scan line SL2*a* and the (2-1)th scan connection line SL2*a*-L may extend in the first direction DR1.

In an embodiment, the (2-1)th scan line SL2*a* may include a (2-1)th lower scan line SL2*aa* and a (2-1)th upper scan line SL2*ab*. The (2-1)th lower scan line SL2*aa* may be on the second insulating layer 314, and the (2-1)th upper scan line SL2*ab* may be on the fourth insulating layer 316. However, the disclosure is not limited thereto. The (2-1)th scan line SL2*a* may be one scan line. The (2-1)th scan connection line SL2*a*-L may be on the first insulating layer 313. For example, the (2-1)th scan line SL2*a* and the (2-1)th scan connection line SL2*a*-L may be on different layers from each other. However, the disclosure is not limited thereto. The (2-1)th scan connection line SL2*a*-L may be on a same layer as one of the (2-1)th lower scan line SL2*aa* and the (2-1)th upper scan line SL2*ab*.

Although FIG. 10 illustrates that the (2-1)th lower scan line SL2*aa* and the (2-1)th upper scan line SL2*ab* are on the second insulating layer 314 and the fourth insulating layer 316, respectively, the disclosure is not limited thereto. The (2-1)th lower scan line SL2*aa* may be on one of the first insulating layer 313, the third insulating layer 315, and the fourth insulating layer 316, and the (2-1)th upper scan line SL2*ab* may be on one of the first insulating layer 313, the second insulating layer 314, and the third insulating layer 315. Also, although FIG. 11 illustrates that the (2-1)th scan connection line SL2*a*-L is on the first insulating layer 313, the disclosure is not limited thereto. The (2-1)th scan connection line SL2*a*-L may be on one of the second insulating layer 314, the third insulating layer 315, the fourth insulating layer 316, the fifth insulating layer 317, and the first organic insulating layer 318.

In an embodiment, the (2-1)th scan line SL2*a* and the (2-1)th scan connection line SL2*a*-L may be electrically connected to each other. The (2-1)th scan line SL2*a* and the (2-1)th scan connection line SL2*a*-L may be electrically connected to each other through a first bridge metal BRM1. For example, the (2-1)th lower scan line SL2*aa* and the (2-1)th upper scan line SL2*ab* may be electrically connected to the first bridge metal BRM1 through a third contact hole CNT3 and a fourth contact hole CNT4, respectively, and the (2-1)th scan connection line SL2*a*-L may be electrically connected to the first bridge metal BRM1 through a fifth contact hole CNT5. Therefore, the (2-1)th scan line SL2*a* and the (2-1)th scan connection line SL2*a*-L may be electrically connected to each other through the first bridge metal BRM1. The first bridge metal BRM1 may be on the fifth insulating layer 317. However, the disclosure is not limited thereto.

In an embodiment, the (2-2)th scan line SL2*b* may be on the display area BA, and the (2-2)th scan connection line SL2*b*-L may be on the display area BA and the first line area BL1. At least a portion of each of the (2-2)th scan line SL2*b* and the (2-2)th scan connection line SL2*b*-L may extend in the first direction DR1.

In an embodiment, the (2-2)th scan line SL2*b* may include a (2-2)th lower scan line SL2*ba* and a (2-2)th upper scan line SL2*bb*. The (2-2)th lower scan line SL2*ba* may be on the second insulating layer 314, and the (2-2)th upper scan line SL2*bb* may be on the fourth insulating layer 316. However, the disclosure is not limited thereto. The (2-2)th scan line SL2*b* may be one scan line. The (2-2)th scan connection line SL2*b*-L may be on the second insulating layer 314. The (2-2)th scan connection line SL2*b*-L may be on a same layer as one of the (2-2)th lower scan line SL2*ba* and the (2-2)th upper scan line SL2*bb*. However, the disclosure is not limited thereto. The (2-2)th scan line SL2*b* and the (2-2)th scan connection line SL2*b*-L may be on different layers from each other.

Although FIG. 10 illustrates that the (2-2)th lower scan line SL2*ba* and the (2-2)th upper scan line SL2*bb* are on the second insulating layer 314 and the fourth insulating layer 316, respectively, the disclosure is not limited thereto. The (2-2)th lower scan line SL2*ba* may be on one of the first insulating layer 313, the third insulating layer 315, and the fourth insulating layer 316, and the (2-2)th upper scan line SL2*bb* may be on one of the first insulating layer 313, the second insulating layer 314, and the third insulating layer 315. Also, although FIG. 11 illustrates that the (2-2)th scan connection line SL2*b*-L is on the second insulating layer 314, the disclosure is not limited thereto. The (2-2)th scan connection line SL2*b*-L may be on one of the first insulating layer 313, the third insulating layer 315, the fourth insulating layer 316, the fifth insulating layer 317, and the first organic insulating layer 318.

In an embodiment, the (2-2)th scan line SL2*b* and the (2-2)th scan connection line SL2*b*-L may be electrically connected to each other. The (2-2)th scan line SL2*b* and the (2-2)th scan connection line SL2*b*-L may be electrically connected to each other through a second bridge metal BRM2. For example, the (2-2)th lower scan line SL2ba and the (2-2)th upper scan line SL2bb may be electrically connected to the second bridge metal BRM2 through a sixth contact hole CNT6 and a seventh contact hole CNT7, respectively, and the (2-2)th scan connection line SL2b-L may be electrically connected to the second bridge metal BRM2 through the sixth contact hole CNT6. Therefore, the (2-2)th scan line SL2b and the (2-2)th scan connection line SL2b-L may be electrically connected to each other through the second bridge metal BRM2. The second bridge metal BRM2 may be on the fifth insulating layer 317. However, the disclosure is not limited thereto.

In an embodiment, the (3-1)th scan line SLpa may be on the display area BA, and the (3-1)th scan connection line SLpa-L may be on the display area BA and the first line area BL1. At least a portion of each of the (3-1)th scan line SLpa and the (3-1)th scan connection line SLpa-L may extend in the first direction DR1.

In an embodiment, the (3-1)th scan line SLpa may include a (3-1)th lower scan line SLpaa and a (3-1)th upper scan line SLpab. The (3-1)th lower scan line SLpaa may be on the second insulating layer 314, and the (3-1)th upper scan line SLpab may be on the fourth insulating layer 316. However, the disclosure is not limited thereto. The (3-1)th scan line SLpa may be one scan line. The (3-1)th scan connection line SLpa-L may be on the first organic insulating layer 318. For example, the (3-1)th scan line SLpa and the (3-1)th scan connection line SLpa-L may be on different layers from each other. However, the disclosure is not limited thereto. The (3-1)th scan connection line SLpa-L may be on a same layer as one of the (3-1)th lower scan line SLpaa and the (3-1)th upper scan line SLpab.

Although FIG. 9 illustrates that the (3-1)th lower scan line SLpaa and the (3-1)th upper scan line SLpab are on the second insulating layer 314 and the fourth insulating layer 316, respectively, the disclosure is not limited thereto. The (3-1)th lower scan line SLpaa may be on one of the first insulating layer 313, the third insulating layer 315, and the fourth insulating layer 316, and the (3-1)th upper scan line SLpab may be on one of the first insulating layer 313, the second insulating layer 314, and the third insulating layer 315. Also, although FIG. 11 illustrates that the (3-1)th scan connection line SLpa-L is on the first organic insulating layer 318, the disclosure is not limited thereto. The (3-1)th scan connection line SLpa-L may be on one of the first insulating layer 313, the second insulating layer 314, the third insulating layer 315, the fourth insulating layer 316, and the fifth insulating layer 317.

In an embodiment, the (3-1)th scan line SLpa and the (3-1)th scan connection line SLpa-L may be electrically connected to each other. The (3-1)th scan line SLpa and the (3-1)th scan connection line SLpa-L may be electrically connected to each other through a third bridge metal BRM3. For example, the (3-1)th lower scan line SLpaa and the (3-1) upper scan line SLpab may be electrically connected to the third bridge metal BRM3 through an eighth contact hole CNT8 and a ninth contact hole CNT9, respectively, and the (3-1)th scan connection line SLpa-L may be electrically connected to the third bridge metal BRM3 through a tenth contact hole CNT10. Therefore, the (3-1)th scan line SLpa and the (3-1)th scan connection line SLpa-L may be electrically connected to each other through the third bridge metal BRM3. The third bridge metal BRM3 may be on the fifth insulating layer 317. However, the disclosure is not limited thereto.

In an embodiment, the (3-2)th scan line SLpb may be on the display area BA, and the (3-2)th scan connection line SLpb-L may be on the display area BA and the first line area BL1. At least a portion of each of the (3-2)th scan line SLpb and the (3-2)th scan connection line SLpb-L may extend in the first direction DR1.

In an embodiment, the (3-2)th scan line SLpb may include a (3-2)th lower scan line SLpba and a (3-2)th upper scan line SLpbb. The (3-2)th lower scan line SLpba may be on the second insulating layer 314, and the (3-2)th upper scan line SLpbb may be on the fourth insulating layer 316. However, the disclosure is not limited thereto. The (3-2)th scan line SLpb may be one scan line. The (3-2)th scan connection line SLpb-L may be on the fourth insulating layer 316. The (3-2)th scan connection line SLpb-L may be on a same layer as one of the (3-2)th lower scan line SLpba and the (3-2)th upper scan line SLpbb. However, the disclosure is not limited thereto. The (3-2)th scan line SLpb and the (3-2)th scan connection line SLpb-L may be on different layers from each other. However, the disclosure is not limited thereto. The (3-1)th scan connection line SLpa-L may be on a same layer as one of the (3-1)th lower scan line SLpaa and the (3-1)th upper scan line SLpab.

Although FIG. 10 illustrates that the (3-2)th lower scan line SLpba and the (3-2)th upper scan line SLpbb are on the second insulating layer 314 and the fourth insulating layer 316, respectively, the disclosure is not limited thereto. The (3-1)th lower scan line SLpba may be on one of the first insulating layer 313, the third insulating layer 315, and the fourth insulating layer 316, and the (3-1)th upper scan line SLpbb may be on one of the first insulating layer 313, the second insulating layer 314, and the third insulating layer 315. Also, although FIG. 11 illustrates that the (3-2)th scan connection line SLpb-L is on the fourth insulating layer 316, the disclosure not limited thereto. The (3-2)th scan connection line SLpb-L may be on one of the first insulating layer 313, the second insulating layer 314, the third insulating layer 315, the fifth insulating layer 317, and the first organic insulating layer 318.

In an embodiment, the (3-2)th scan line SLpb and the (3-2)th scan connection line SLpb-L may be electrically connected to each other. The (3-2)th scan line SLpb and the (3-2)th scan connection line SLpb-L may be electrically connected to each other through a fourth bridge metal BRM4. For example, the (3-2)th lower scan line SLpba and the (3-2) upper scan line SLpbb may be electrically connected to the fourth bridge metal BRM4 through an eleventh contact hole CNT11 and a twelfth contact hole CNT12, respectively, and the (3-2)th scan connection line SLpb-L may be electrically connected to the fourth bridge metal BRM4 through the twelfth contact hole CNT12. Therefore, the (3-2)th scan line SLpb and the (3-2)th scan connection line SLpb-L may be electrically connected to each other through the fourth bridge metal BRM4. The fourth bridge metal BRM4 may be on the fifth insulating layer 317. However, the disclosure is not limited thereto.

In an embodiment, the (4-1)th scan line SLna may be on the display area BA, and the (4-1)th scan connection line SLna-L may be on the display area BA and the first line area BL1. At least a portion of each of the (4-1)th scan line SLna and the (4-1)th scan connection line SLna-L may extend in the first direction DR1.

In an embodiment, the (4-1)th scan line SLna may be on the first insulating layer 313, and the (4-1)th scan connection line SLna-L may be on the fifth insulating layer 317. For example, the (4-1)th scan line SLna and the (4-1)th scan connection line SLna-L may be on different layers from each other. However, the disclosure is not limited thereto. The (4-1)th scan line SLna and the (4-1)th scan connection line SLna-L may be on a same layer.

Although FIG. 10 illustrates that the (4-1)th scan line SLna is on the first insulating layer 313, the disclosure is not limited thereto. The (4-1)th scan line SLna may be on one of the second insulating layer 314, the third insulating layer 315, and the fourth insulating layer 316. Also, although FIG. 11 illustrates that the (4-1)th scan connection line SLna-L is on the fifth insulating layer 317, the disclosure is not limited thereto. The (4-1)th scan connection line SLna-L may be on one of the first insulating layer 313, the second insulating layer 314, the third insulating layer 315, the fourth insulating layer 316, and the first organic insulating layer 318.

In an embodiment, the (4-1)th scan line SLna and the (4-1)th scan connection line SLna-L may be electrically connected to each other. For example, the (4-1)th scan line SLna and the (4-1)th scan connection line SLna-L may be electrically connected to each other through a thirteenth contact hole CNT13. However, the disclosure is not limited thereto. The (4-1)th scan line SLna and the (4-1)th scan connection line SLna-L may be electrically connected to each other through a bridge metal.

In an embodiment, the (4-2)th scan line SLnb and the (4-2)th scan connection line SLnb-L may be on the display area BA. At least a portion of the (4-2)th scan line SLnb may extend in the first direction DR1, and at least a portion of the (4-2)th scan connection line SLnb-L may extend in the second direction DR2.

In an embodiment, the (4-2)th scan line SLnb may be on the first insulating layer 313, and the (4-2)th scan connection line SLnb-L may be on the fifth insulating layer 317. For example, the (4-2)th scan line SLnb and the (4-2)th scan connection line SLnb-L may be on different layers from each other. However, the disclosure is not limited thereto. The (4-2)th scan line SLnb and the (4-2)th scan connection line SLnb-L may be on a same layer.

Although FIG. 10 illustrates that the (4-2)th scan line SLnb is on the first insulating layer 313, the disclosure is not limited thereto. The (4-2)th scan line SLnb may be on one of the second insulating layer 314, the third insulating layer 315, and the fourth insulating layer 316. Also, although FIG. 11 illustrates that the (4-2)th scan connection line SLnb-L is on the fifth insulating layer 317, the disclosure is not limited thereto. The (4-2)th scan connection line SLnb-L may be on one of the first insulating layer 313, the second insulating layer 314, the third insulating layer 315, the fourth insulating layer 316, and the first organic insulating layer 318.

In an embodiment, the (4-2)th scan line SLnb and the (4-2)th scan connection line SLnb-L may be electrically connected to each other. For example, the (4-2)th scan line SLnb and the (4-2)th scan connection line SLnb-L may be electrically connected to each other through a fourteenth contact hole CNT14. However, the disclosure is not limited thereto. The (4-2)th scan line SLnb and the (4-2)th scan connection line SLnb-L may be electrically connected to each other through a bridge metal. In an embodiment, the (4-2)th scan connection line SLnb-L may be electrically connected to the (1-1)th scan connection line SL1a-L.

In an embodiment, the first emission control line ELa may be on the display area BA, and the first emission control connection line ELa-L may be on the display area BA and the first line area BL1. At least a portion of each of the first emission control line ELa and the first emission control connection line ELa-L may extend in the first direction DR1.

In an embodiment, the first emission control line ELa may be on the first insulating layer 313, and the first emission control connection line ELa-L may be on the second insulating layer 314. For example, the first emission control line ELa and the first emission control connection line ELa-L may be on different layers from each other. However, the disclosure is not limited thereto. At least a portion of each of the first emission control line ELa and the first emission control connection line ELa-L may be on a same layer.

Although FIG. 10 illustrates that the first emission control line ELa is on the first insulating layer 313, the disclosure is not limited thereto. The first emission control line ELa may be on one of the second insulating layer 314, the third insulating layer 315, and the fourth insulating layer 316. Also, although FIG. 11 illustrates that the first emission control connection line ELa-L is on the second insulating layer 314, the disclosure is not limited thereto. The first emission control connection line ELa-L may be on one of the first insulating layer 313, the third insulating layer 315, the fourth insulating layer 316, the fifth insulating layer 317, and the first organic insulating layer 318.

In an embodiment, the first emission control line ELa and the first emission control connection line ELa-L may be electrically connected to each other. For example, the first emission control line ELa and the first emission control connection line ELa-L may be electrically connected to each other through a fifth bridge metal BRM5. For example, the first emission control line ELa may be electrically connected to the fifth bridge metal BRM5 through a fifteenth contact hole CNT15, and the first emission control connection line ELa-L may be electrically connected to the fifth bridge metal BRM5 through a sixteenth contact hole CNT16. Therefore, the first emission control line ELa and the first emission control connection line ELa-L may be electrically connected to each other through the fifth bridge metal BRM5. The fifth bridge metal BRM5 may be on the fifth insulating layer 317. However, the disclosure is not limited thereto.

In an embodiment, the second emission control line ELb may be on the display area BA, and the second emission control connection line ELb-L may be on the display area BA and the first line area BL1. At least a portion of each of the second emission control line ELb and the second emission control connection line ELb-L may extend in the first direction DR1.

In an embodiment, the second emission control line ELb may be on the first insulating layer 313, and the second emission control connection line ELb-L may be on the first insulating layer 313. For example, the first emission control line ELa and the first emission control connection line ELa-L may be on a same layer. However, the disclosure is not limited thereto. The first emission control line ELa and the first emission control connection line ELa-L may be on different layers from each other and electrically connected to each other through a contact hole.

Although FIG. 10 illustrates that the second emission control line ELb is on the first insulating layer 313, the disclosure is not limited thereto. The second emission control line ELb may be on one of the second insulating layer 314, the third insulating layer 315, and the fourth insulating layer 316. Also, although FIG. 11 illustrates that the second emission control connection line ELb-L is on the first insulating layer 313, the disclosure is not limited thereto. The second emission control connection line ELb-L may be on one of the second insulating layer 314, the third insulating layer 315, the fourth insulating layer 316, the fifth insulating layer 317, and the first organic insulating layer 318.

In an embodiment, the second emission control line ELb and the second emission control connection line ELb-L may be electrically connected to each other. For example, the second emission control line ELb and the second emission control connection line ELb-L may be provided as one body. However, the disclosure is not limited thereto. In an embodiment, the second emission control line ELb and the second emission control connection line ELb-L may be electrically connected to each other.

In an embodiment, the first scan line SL1, the second scan line SL2, the third scan line SLp, the fourth scan line SLn, and the emission control line EL may be on the display area BA, and the first scan line SL1, the second scan line SL2, the third scan line SLp, the fourth scan line SLn, and the emission control line EL on the display area BA may be on a same layer as one of the first gate (see G1 of FIG. 6), the upper electrode (see UE of FIG. 6), and the third gate (see G3 of FIG. 6) described above with reference to FIG. 6.

On the other hand, the first scan connection line SL1-L, the second scan connection line SL2-L, the third scan connection line SLp-L, the fourth scan connection line SLn-L, and the emission control connection line EL-L may be on the display area BA and/or the first line area BL1, and the first scan connection line SL1-L, the second scan connection line SL2-L, the third scan connection line SLp-L, the fourth can connection line SLn-L, and the emission control connection line EL-L may be on a same layer as one of the first gate G1, the upper electrode UE, the third gate G3, the first connection electrode (see CNE1 of FIG. 6), and the second connection electrode (see CNE2 of FIG. 6) described above with reference to FIG. 6.

For example, the lines on the first line area BL1 may be arranged in more various layers than the lines on the display area BA. Therefore, because the lines on the first line area BL1 are arranged in more various layers than the lines on the display area BA, the size (or area) of the first line area BL1 may be reduced and the size (or area) of the transmission area BT may be increased. Therefore, the transmittance of the first area A1 including the transmission area BT may be improved.

Referring to FIG. 11, in an embodiment, a first gate line G1-L, a (2-1)th scan connection line SL2a-L, and a second emission control connection line ELb-L may be on the first insulating layer 313. The first gate line G1-L, the (2-1)th scan connection line SL2a-L, and the second emission control connection line ELb-L may be on a same layer as the first gate G1 and may include the same material or a similar material.

In an embodiment, a first emission control connection line ELa-L, a (2-2)th scan connection line SL2b-L, and an upper electrode line UE-L may be on a second insulating layer 314. The first emission control connection line ELa-L, the (2-2)th scan connection line SL2b-L, and the upper electrode line UE-L may be on a same layer as the upper electrode UE and may include the same material or a similar material. In an embodiment, the first gate line G1-L and the upper electrode line UE-L may be apart from each other in a cross-sectional view.

In an embodiment, a third gate line G3-L and a (3-2)th scan connection line SLpb-L may be on the fourth insulating layer 316. In an embodiment, a (3-2)th scan connection line SLpb-L may at least partially overlap the (2-1)th scan connection line SL2a-L and the (2-2)th scan connection line SL2b-L therebelow. Because the (3-2)th scan connection line SLpb-L at least partially overlaps the (2-1)th scan connection line SL2a-L and the (2-2)th scan connection line SL2b-L therebelow, the size (or area) of the first line area BL1 may be reduced and the size (or area) of the transmission area BT may be increased. Therefore, the transmittance of the first area A1 including the transmission area BT may be improved.

In an embodiment, a (4-1)th scan connection line SLna-L, a (1-1)th scan connection line SL1a-L, and a (1-2)th scan connection line SL1b-L may be on a fifth insulating layer 317. In an embodiment, the (4-1)th scan connection line SLna-L may at least partially overlap the first emission control connection line ELa-L therebelow. Because the (4-1)th scan connection line SLna-L at least partially overlaps the first emission control connection line ELa-L therebelow, the size (or area) of the first line area BL1 may be reduced and the size (or area) of the transmission area BT may be increased. Therefore, the transmittance of the first area A1 including the transmission area BT may be improved.

In an embodiment, the (1-1)th scan connection line SL1a-L may at least partially overlap the (3-2)th scan connection line SLpb-L, the (2-1)th scan connection line SL2a-L, and the (2-2)th scan connection line SL2b-L therebelow. Because the (1-1)th scan connection line SL1a-L at least partially overlaps the (3-2)th scan connection line SLpb-L, the (2-1)th scan connection line SL2a-L, and the (2-2)th scan connection line SL2b-L therebelow, the size (or area) of the first line area BL1 may be reduced and the size (or area) of the transmission area BT may be increased. Therefore, the transmittance of the first area A1 including the transmission area BT may be improved.

In an embodiment, the (1-2)th scan connection line SL1b-L may at least partially overlap the second emission control connection line ELb-L therebelow. Because the (1-2)th scan connection line SL1b-L at least partially overlaps the second emission control connection line ELb-L therebelow, the size (or area) of the first line area BL1 may be reduced and the size (or area) of the transmission area BT may be increased. Therefore, the transmittance of the first area A1 including the transmission area BT may be improved.

In an embodiment, a (3-1)th scan connection line SLpa-L and a second connection electrode line CNE2-L may be on a first organic insulating layer 318. In an embodiment, the (3-1)th scan connection line SLpa-L may at least partially overlap the (4-1)th scan connection line SLna-L, the first emission control connection line ELa-L, and the (2-1)th scan connection line SL2a-L therebelow. Because the (3-1)th scan connection line SLpa-L at least partially overlaps the (4-1)th scan connection line SLna-L, the first emission control connection line ELa-L, and the (2-1)th scan connection line SL2a-L therebelow, the size (or area) of the first line area BL1 may be reduced and the size (or area) of the transmission area BT may be increased. Therefore, the transmittance of the first area A1 including the transmission area BT may be improved.

In an embodiment, a second organic insulating layer 319 and a third organic insulating layer 320 may include a third hole 319H and a fourth hole 320H corresponding to the transmission area BT, respectively.

An organic functional layer 332e including a first functional layer 332a and a second functional layer 332c may be on the third organic insulating layer 320. An opposite electrode 333 may be on the organic functional layer 332e. A first inorganic layer 341, an organic layer 342, a second inorganic layer 343, a first sensing insulating layer 351, a second sensing insulating layer 353, and a third sensing insulating layer 355 may be sequentially on the opposite electrode 333. However, the disclosure is not limited thereto.

In an embodiment, in case that the pixel defining layer (see 323 of FIG. 7) is on the first line area BL1, a portion of the pixel defining layer 323 on the first line area BL1 flows down to the transmission area BT due to the step difference between the first line area BL1 and the transmission area BT.

In an embodiment, instead of the pixel defining layer 323, a black matrix 360 may be on the first line area BL1. Therefore, the pixel defining layer 323 may have an isolated shape in the first area A1. For example, the pixel defining layer 323 may be arranged only in the display area BA of the first area A1. By way of example, the pixel defining layer 323 may be arranged only in the third sub-area (see SA3 of FIG. 5) and the display area BA of the first area A1.

In an embodiment, the black matrix 360 may be on the third sensing insulating layer 355. In an embodiment, the black matrix 360 may at least partially overlap (or completely overlap) the connection lines and the lines therebelow.

Because the black matrix 360 at least partially overlaps (or completely overlaps) the connection lines and the lines therebelow, the reflection of external light may be prevented to improve the contrast of the display apparatus, and the resolution of light received by the camera module CMM may be increased to improve the characteristics of the camera module CMM.

In an embodiment, holes BML-H, IL-H, 319H, 320H, and 360H corresponding to the transmission area BT may be defined in the light blocking layer BML, the insulating layers IL, the second organic insulating layer 319, the third organic insulating layer 320, and the black matrix 360, respectively.

Although not illustrated, in an embodiment, a color filter may be further on the black matrix 360. For example, a red color filter may be further on the black matrix 360. By way of example, a blue or green color filter may be on the black matrix 360. In an embodiment, in case that the color filter is on the black matrix 360 of the first line area BL1, black visibility on a screen in case that the power of the electronic device is turned off may be improved.

Figure 12:
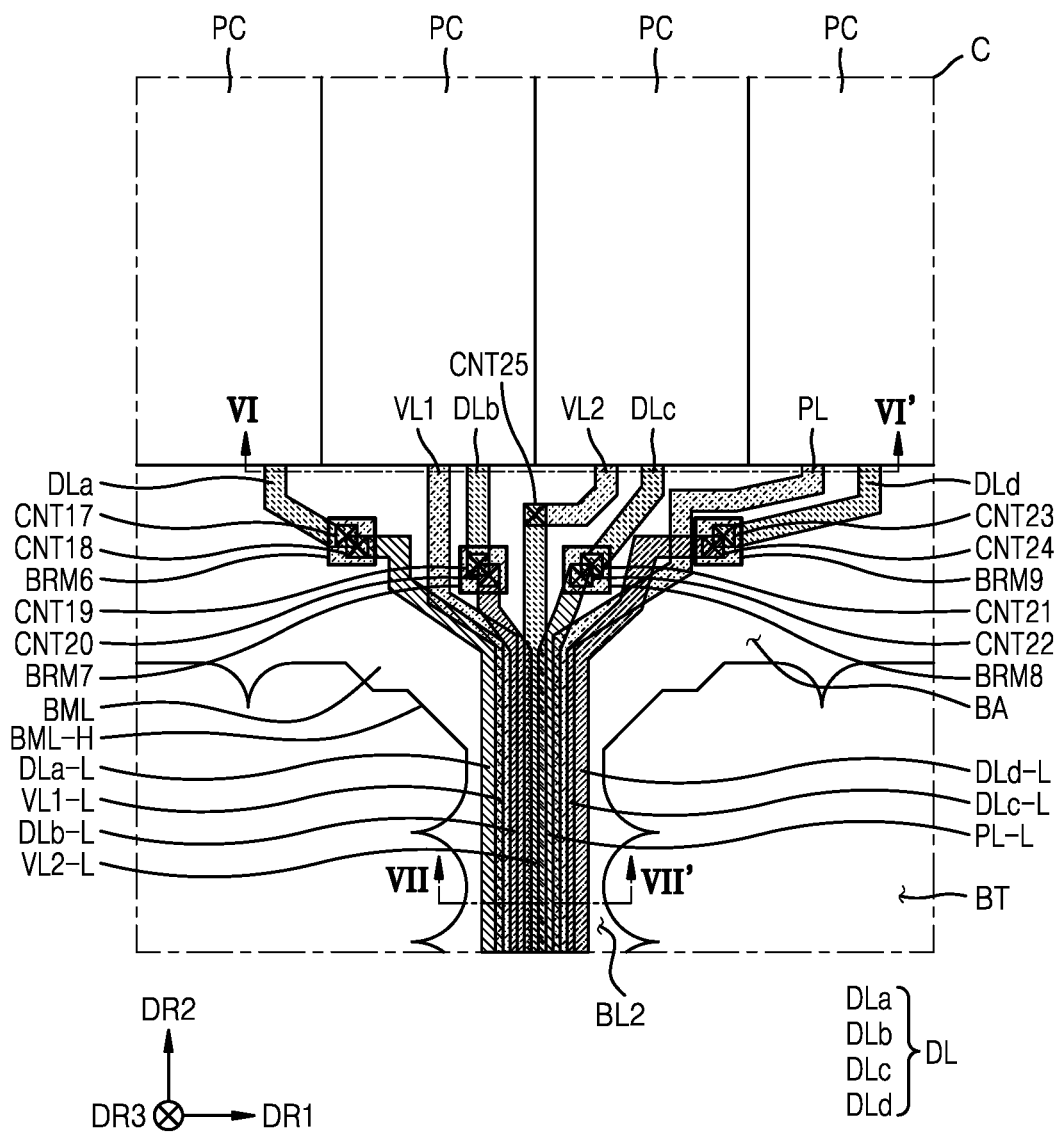
FIG. 12 is a schematic plan view schematically illustrating a portion of a first area in an electronic device, according to an embodiment.
Figure 13:
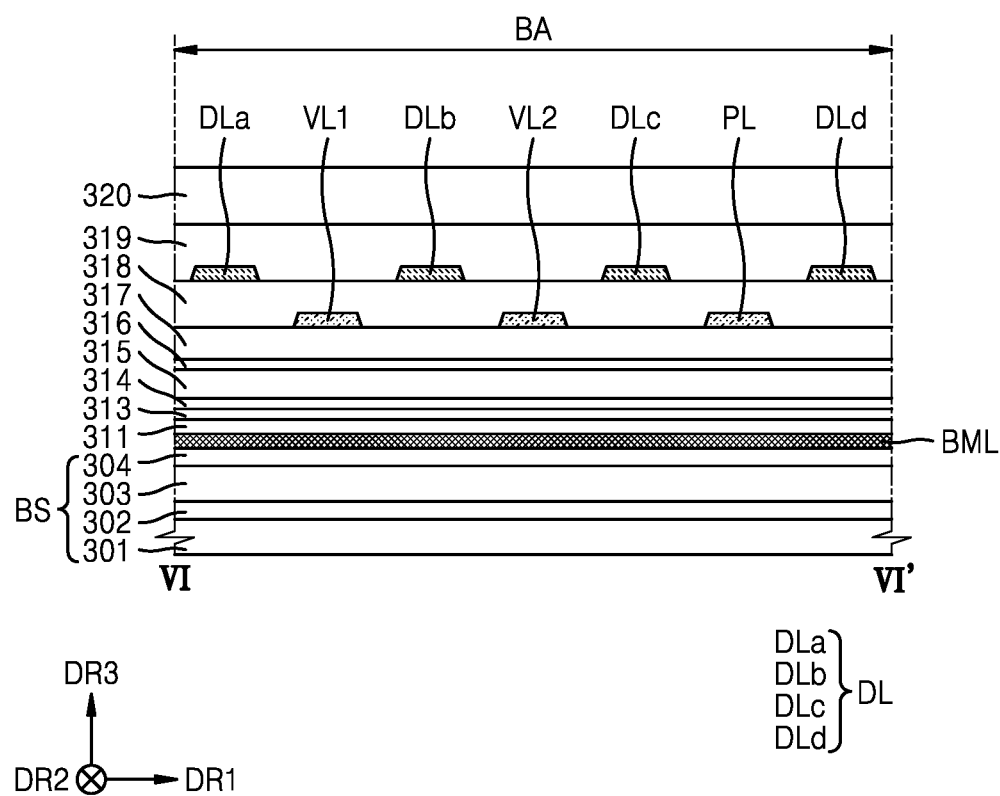
FIG. 13 is a schematic cross-sectional view schematically illustrating a portion of a first area in an electronic device, according to an embodiment.
Figure 14:
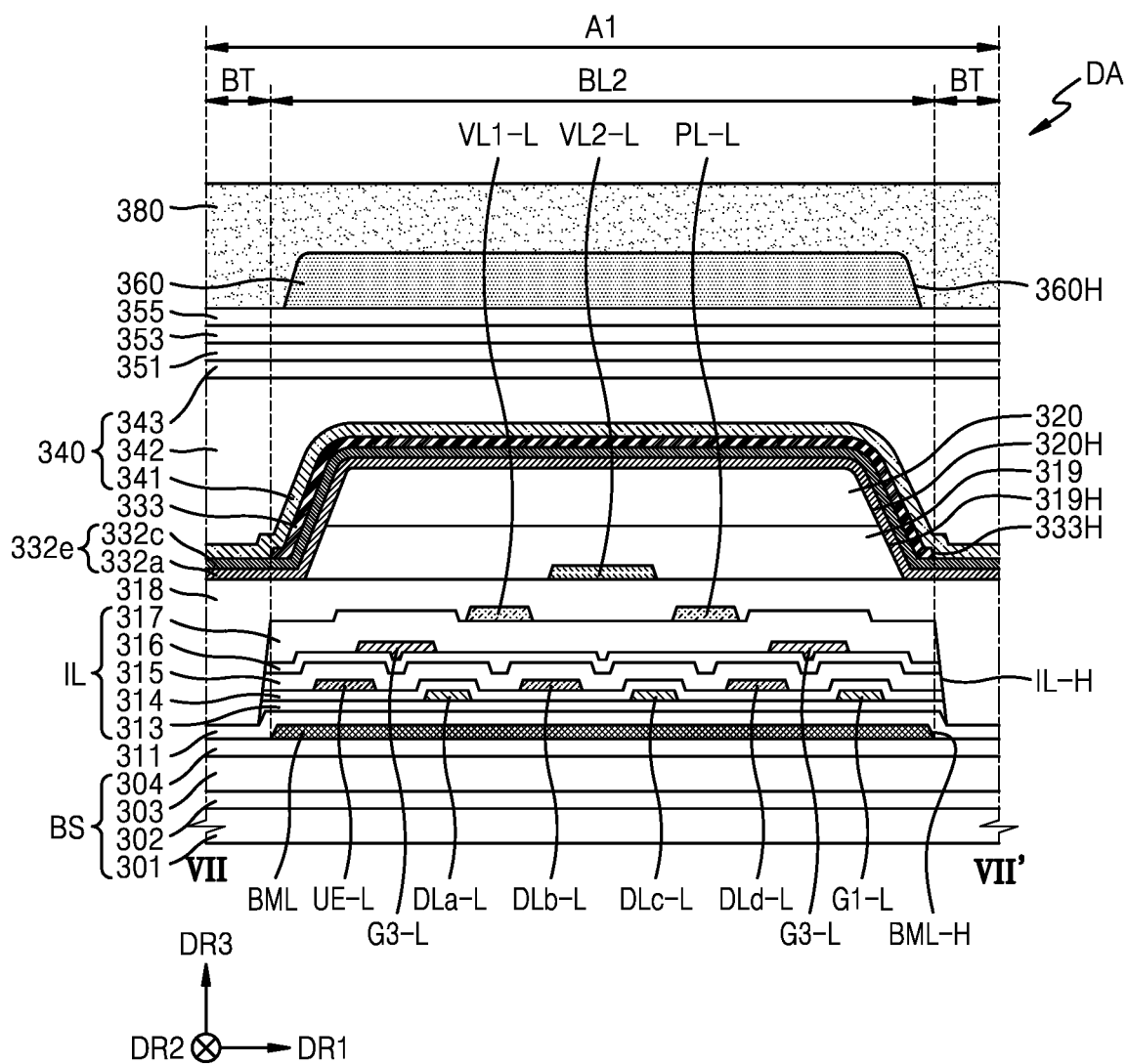
FIG. 14 is a schematic cross-sectional view schematically illustrating a portion of a first area in an electronic device, according to an embodiment.

FIG. 12 is a schematic plan view schematically illustrating a portion of a first area in an electronic device, according to an embodiment, FIG. 13 is a schematic cross-sectional view schematically illustrating a portion of a first area in an electronic device, according to an embodiment, and FIG. 14 is a schematic cross-sectional view schematically illustrating a portion of a first area in an electronic device, according to an embodiment. FIG. 12 is an enlarged view of region C of FIG. 8, FIG. 13 is a schematic cross-sectional view of a display area BA taken along line VI-VI' in FIG. 12, and FIG. 14 is a schematic cross-sectional view of a second line area BL2 taken along line VII-VII' of FIG. 12. In FIGS. 12 and 13, the same reference numerals as those in FIGS. 9 to 11 denote the same members, and redundant descriptions thereof are omitted.

Referring to FIGS. 8, 12, 13, and 14, in each of pixel circuits PC, as described above with reference to FIG. 4, the first driving voltage ELVDD of FIG. 4 may be provided through the driving voltage line PL, the data voltage D of FIG. 4 may be provided through the data line DL, the first initialization voltage Vint1 of FIG. 4 may be provided through the first initialization voltage line VL1, and the second initialization voltage Vint2 of FIG. 4 may be provided through the second initialization voltage line VL2.

In an embodiment, at least a portion of the driving voltage line PL, the data line DL, the first initialization voltage line VL1, and the second initialization voltage line VL2 may extend in the second direction DR2. Therefore, the driving voltage line PL, the data line DL, the first initialization voltage line VL1, and the second initialization voltage line VL2 may be connected to the pixel circuits PC arranged in a same column. However, the disclosure is not limited thereto.

In an embodiment, signal lines and voltage lines may be on the display area BA. For example, the data line DL, the first initialization voltage line VL1, the second initialization voltage line VL2, and the driving voltage line PL may be on the display area BA.

In an embodiment, the data line DL may be shared by the pixel circuits PC arranged in a same column. Accordingly, four data lines DL may be on the display area BA. However, the disclosure is not limited thereto.

In an embodiment, the data line DL may include a first data line DLa, a second data line DLb, a third data line DLc, and a fourth data line DLd. The first data line DLa may be connected to the pixel circuit PC arranged along a first column 1M, the second data line DLb may be connected to the pixel circuit PC arranged along a second column 2M, the third data line DLc may be connected to the pixel circuit PC arranged along a third column 3M, and the fourth data line DLd may be connected to the pixel circuit PC arranged along a fourth column 4M. However, the disclosure is not limited thereto.

In an embodiment, the first initialization voltage line VL1, the second initialization voltage line VL2, and the driving voltage line PL may be connected to one pixel circuit PC. The first initialization voltage line VL1, the second initialization voltage line VL2, and the driving voltage line PL may be applied to one pixel circuit PC and transmitted to an adjacent pixel circuit PC. For example, the first initialization voltage line VL1 may be connected to the pixel circuit PC arranged in the second column 2M and transmitted to the pixel circuits PC arranged in a same (or adjacent) row through a separate line. Although the first initialization voltage line VL1 has been described as an example, the second initialization voltage line VL2 and the driving voltage line PL may also be transmitted to the pixel circuits PC arranged in a same (or adjacent) row in the same manner as described above.

In an embodiment, connection lines may be on the second line area BL2. The connection lines may include a first data connection line DLa-L, a second data connection line DLb-L, a third data connection line DLc-L, a fourth data connection line DLd-L, a first initialization voltage connection line VL1-L, a second initialization voltage connection line VL2-L, and a driving voltage connection line PL-L.

In an embodiment, the first data connection line DLa-L may be electrically connected to the first data line DLa, the second data connection line DLb-L may be electrically connected to the second data line DLb, the third data connection line DLc-L may be electrically connected to the third data line DLc, and the fourth data connection line DLd-L may be electrically connected to the fourth data line DLd.

Also, the first initialization voltage connection line VL1-L may be electrically connected to the first initialization voltage line VL1, the second initialization voltage connection line VL2-L may be electrically connected to the second initialization voltage line VL2, and the driving voltage connection line PL-L may be electrically connected to the driving voltage line PL.

In an embodiment, the first data line DLa may be on the display area BA, and the first data connection line DLa-L may be on the display area BA and the second line area BL2.

At least a portion of each of the first data line DLa and the first data connection line DLa-L may extend in the second direction DR2.

In an embodiment, the first data line DLa may be on the first organic insulating layer 318, and the first data connection line DLa-L may be on the first insulating layer 313. For example, the first data line DLa and the first data connection line DLa-L may be on different layers from each other. However, the disclosure is not limited thereto. The first data line DLa and the first data connection line DLa-L may be on a same layer.

Although FIG. 13 illustrates that the first data line DLa is on the first organic insulating layer 318, the disclosure is not limited thereto. The first data line DLa may be on the fifth insulating layer 317. Also, although FIG. 14 illustrates that the first data connection line DLa-L is on the first insulating layer 313, the disclosure is not limited thereto. The first data connection line DLa-L may be on one of the second insulating layer 314, the third insulating layer 315, the fourth insulating layer 316, the fifth insulating layer 317, and the first organic insulating layer 318.

In an embodiment, the first data line DLa and the first data connection line DLa-L may be electrically connected to each other. The first data line DLa and the first data connection line DLa-L may be electrically connected to each other through a sixth bridge metal BRM6. For example, the first data line DLa may be electrically connected to the sixth bridge metal BRM6 through a seventeenth contact hole CNT17, and the first data connection line DLa-L may be electrically connected to the sixth bridge metal BRM6 through an eighteenth contact hole CNT18. The sixth bridge metal BRM6 may be on the fifth insulating layer 317. However, the disclosure is not limited thereto.

In an embodiment, the second data line DLb may be on the display area BA, and the second data connection line DLb-L may be on the display area BA and the second line area BL2. At least a portion of each of the second data line DLb and the second data connection line DLb-L may extend in the second direction DR2.

In an embodiment, the second data line DLb may be on the first organic insulating layer 318, and the second data connection line DLb-L may be on the second insulating layer 314. For example, the second data line DLb and the second data connection line DLb-L may be on different layers from each other. However, the disclosure is not limited thereto. The second data line DLb and the second data connection line DLb-L may be on a same layer.

Although FIG. 13 illustrates that the second data line DLb is on the first organic insulating layer 318, the disclosure is not limited thereto. The second data line DLb may be on the fifth insulating layer 317. Also, although FIG. 14 illustrates that the second data connection line DLb-L is on the second insulating layer 314, the disclosure is not limited thereto. The first data connection line DLa-L may be on one of the first insulating layer 313, the third insulating layer 315, the fourth insulating layer 316, the fifth insulating layer 317, and the first organic insulating layer 318.

In an embodiment, the second data line DLb and the second data connection line DLb-L may be electrically connected to each other. The second data line DLb and the second data connection line DLb-L may be electrically connected to each other through a seventh bridge metal BRM7. For example, the second data line DLb may be electrically connected to the seventh bridge metal BRM7 through a nineteenth contact hole CNT19, and the second data connection line DLb-L may be electrically connected to the seventh bridge metal BRM7 through a twentieth contact hole CNT20. The seventh bridge metal BRM7 may be on the fifth insulating layer 317. However, the disclosure is not limited thereto.

In an embodiment, the third data line DLc may be on the display area BA, and the third data connection line DLc-L may be on the display area BA and the second line area BL2. At least a portion of each of the third data line DLc and the third data connection line DLc-L may extend in the second direction DR2.

In an embodiment, the third data line DLc may be on the first organic insulating layer 318, and the third data connection line DLc-L may be on the first insulating layer 313. For example, the third data line DLc and the third data connection line DLc-L may be on different layers from each other. However, the disclosure is not limited thereto. The third data line DLc and the third data connection line DLc-L may be on a same layer.

Although FIG. 13 illustrates that the third data line DLc is on the first organic insulating layer 318, the disclosure is not limited thereto. The third data line DLc may be on the fifth insulating layer 317. Also, although FIG. 14 illustrates that the third data connection line DLc-L is on the first insulating layer 313, the disclosure is not limited thereto. The third data connection line DLc-L may be on one of the second insulating layer 314, the third insulating layer 315, the fourth insulating layer 316, the fifth insulating layer 317, and the first organic insulating layer 318.

In an embodiment, the third data line DLc and the third data connection line DLc-L may be electrically connected to each other. The third data line DLc and the third data connection line DLc-L may be electrically connected to each other through an eighth bridge metal BRM8. For example, the third data line DLc may be electrically connected to the eighth bridge metal BRM8 through a twenty-first contact hole CNT21, and the third data connection line DLc-L may be electrically connected to the eighth bridge metal BRM8 through a twenty-second contact hole CNT22. The eighth bridge metal BRM8 may be on the fifth insulating layer 317. However, the disclosure is not limited thereto.

In an embodiment, the fourth data line DLd may be on the display area BA, and the fourth data connection line DLd-L may be on the display area BA and the second line area BL2. At least a portion of each of the fourth data line DLd and the fourth data connection line DLd-L may extend in the second direction DR2.

In an embodiment, the fourth data line DLd may be on the first organic insulating layer 318, and the fourth data connection line DLd-L may be on the second insulating layer 314. For example, the fourth data line DLd and the fourth data connection line DLd-L may be on different layers from each other. However, the disclosure is not limited thereto. The fourth data line DLd and the fourth data connection line DLd-L may be on a same layer.

Although FIG. 13 illustrates that the fourth data line DLd is on the first organic insulating layer 318, the disclosure is not limited thereto. The fourth data line DLd may be on the fifth insulating layer 317. Also, although FIG. 14 illustrates that the fourth data connection line DLd-L is on the second insulating layer 314, the disclosure is not limited thereto. The fourth data connection line DLd-L may be on one of the first insulating layer 313, the third insulating layer 315, the fourth insulating layer 316, the fifth insulating layer 317, and the first organic insulating layer 318.

In an embodiment, the fourth data line DLd and the fourth data connection line DLd-L may be electrically connected to each other. The fourth data line DLd and the fourth data connection line DLd-L may be electrically connected to each other through a ninth bridge metal BRM9. For example, the fourth data line DLd may be electrically connected to the ninth bridge metal BRM9 through a twenty-third contact hole CNT23, and the fourth data connection line DLd-L may be electrically connected to the ninth bridge metal BRM9 through a twenty-fourth contact hole CNT24. The ninth bridge metal BRM9 may be on the fifth insulating layer 317. However, the disclosure is not limited thereto.

In an embodiment, the first initialization voltage line VL1 may be on the display area BA, and the first initialization voltage connection line VL1-L may be on the display area BA and the second line area BL2. At least a portion of each of the first initialization voltage line VL1 and the first initialization voltage connection line VL1-L may extend in the second direction DR2.

In an embodiment, the first initialization voltage line VL1 may be on the fifth insulating layer 317, and the first initialization voltage connection line VL1-L may be on the fifth insulating layer 317. For example, the first initialization voltage line VL1 and the first initialization voltage connection line VL1-L may be on a same layer. However, the disclosure is not limited thereto. The first initialization voltage line VL1 and the first initialization voltage connection line VL1-L may be on different layers from each other.

Although FIG. 13 illustrates that the first initialization voltage line VL1 is on the fifth insulating layer 317, the disclosure is not limited thereto. The first initialization voltage line VL1 may be on the first organic insulating layer 318. Also, although FIG. 14 illustrates that the first initialization voltage connection line VL1-L is on the fifth insulating layer 317, the disclosure is not limited thereto. The first initialization voltage connection line VL1-L may be on one of the first insulating layer 313, the second insulating layer 314, the third insulating layer 315, the fourth insulating layer 316, and the first organic insulating layer 318.

In an embodiment, the first initialization voltage line VL1 and the first initialization voltage connection line VL1-L may be electrically connected to each other. For example, the first initialization voltage line VL1 and the first initialization voltage connection line VL1-L may be provided as one body. However, the disclosure is not limited thereto. The first initialization voltage line VL1 and the first initialization voltage connection line VL1-L may be on different layers from each other and may be electrically connected to each other by a contact hole and/or a bridge metal.

In an embodiment, the second initialization voltage line VL2 may be on the display area BA, and the second initialization voltage connection line VL2-L may be on the display area BA and the second line area BL2. At least a portion of each of the second initialization voltage line VL2 and the second initialization voltage connection line VL2-L may extend in the second direction DR2.

In an embodiment, the second initialization voltage line VL2 may be on the fifth insulating layer 317, and the second initialization voltage connection line VL2-L may be on the first organic insulating layer 318. For example, the second initialization voltage line VL2 and the second initialization voltage connection line VL2-L may be on different layers from each other. However, the disclosure is not limited thereto. The second initialization voltage line VL2 and the second initialization voltage connection line VL2-L may be on a same layer.

Although FIG. 13 illustrates that the second initialization voltage line VL2 is on the fifth insulating layer 317, the disclosure is not limited thereto. The second initialization voltage line VL2 may be on the first organic insulating layer 318. Also, although FIG. 14 illustrates that the second initialization voltage connection line VL2-L is on the first organic insulating layer 318, the disclosure is not limited thereto. The second initialization voltage connection line VL2-L may be on one of the first insulating layer 313, the second insulating layer 314, the third insulating layer 315, the fourth insulating layer 316, and the fifth insulating layer 317.

In an embodiment, the second initialization voltage line VL2 and the second initialization voltage connection line VL2-L may be electrically connected to each other. For example, the second initialization voltage line VL2 and the second initialization voltage connection line VL2-L may be electrically connected to each other through a twenty-fifth contact hole CNT25. However, the disclosure is not limited thereto.

In an embodiment, the driving voltage line PL may be on the display area BA, and the driving voltage connection line PL-L may be on the display area BA and the second line area BL2. At least a portion of each of the driving voltage line PL and the driving voltage connection line PL-L may extend in the second direction DR2.

In an embodiment, the driving voltage line PL may be on the fifth insulating layer 317, and the driving voltage connection line PL-L may be on the fifth insulating layer 317. For example, the driving voltage line PL and the driving voltage connection line PL-L may be on a same layer. However, the disclosure is not limited thereto. The driving voltage line PL and the driving voltage connection line PL-L may be on different layers from each other.

Although FIG. 13 illustrates that the driving voltage line PL is on the fifth insulating layer 317, the disclosure is not limited thereto. The driving voltage line PL may be on the first organic insulating layer 318. Also, although FIG. 14 illustrates that the driving voltage connection line PL-L is on the fifth insulating layer 317, the disclosure is not limited thereto. The driving voltage line PL-L may be on one of the first insulating layer 313, the second insulating layer 314, the third insulating layer 315, the fourth insulating layer 316, and the first organic insulating layer 318.

In an embodiment, the driving voltage line PL and the driving voltage connection line PL-L may be electrically connected to each other. For example, the driving voltage line PL and the driving voltage connection line PL-L may be provided as one body. However, the disclosure is not limited thereto. The driving voltage line PL and the driving voltage connection line PL-L may be on different layers from each other and electrically connected to each other by a contact hole and/or a bridge metal.

In an embodiment, the data line DL, the first initialization voltage line VL1, the second initialization voltage line VL2, and the driving voltage line PL may be on the display area BA. The data line DL, the first initialization voltage line VL1, the second initialization voltage line VL2, and the driving voltage line PL on the display area BA may be on a same layer as one of the first connection electrode CNE1 of FIG. 6 and the second connection electrode CNE2 of FIG. 6.

On the other hand, the data connection lines DLa-L, DLb-L, DLc-L, and DLd-L, the first initialization voltage connection line VL1-L, the second initialization voltage connection line VL2-L, and the driving voltage connection line PL-L may be arranged in the display area BA and/or the second line area BL2. The data connection lines DLa-L, DLb-L, DLc-L, and DLd-L, the first initialization voltage connection line VL1-L, the second initialization voltage connection line VL2-L, and the driving voltage connection line PL-L, which are arranged in the display area BA and/or the second line area BL2, may be on a same layer as one of the first gate G1 of FIG. 6, the upper electrode UE of FIG. 6, the third gate G3 of FIG. 6, the first connection electrode CNE1, and the second connection electrode CNE2.

For example, the lines on the second line area BL2 may be arranged in more various layers than the lines on the display area BA. Therefore, because the lines on the second line area BL2 are arranged in more various layers than the lines on the display area BA, the size (or area) of the second line area BL2 may be reduced and the size (or area) of the transmission area BT may be increased. Therefore, the transmittance of the first area A1 including the transmission area BT may be improved.

Referring to FIG. 14, in an embodiment, the first gate line G1-L, the first data connection line DLa-L, and the third data connection line DLc-L may be on the first insulating layer 313. The first gate line G1-L, the first data connection line DLa-L, and the third data connection line DLc-L may be on a same layer as the first gate G1 described above with reference to FIG. 6 and may include the same material or a similar material.

In an embodiment, the upper electrode line UE-L, the second data connection line DLb-L, and the fourth data connection line DLd-L may be on the second insulating layer 314. The upper electrode line UE-L, the second data connection line DLb-L, and the fourth data connection line DLd-L may be on a same layer as the upper electrode UE described above with reference to FIG. 6 and may include the same material or a similar material. In an embodiment, the first data connection line DLa-L and the second data connection line DLb-L may be apart from each other in a cross-sectional view, and the third data connection line DLc-L and the fourth data connection line DLd-L may be apart from each other in a cross-sectional view.

In an embodiment, the third gate line G3-L may be on the fourth insulating layer 316. The third gate line G3-L may be on a same layer as the third gate G3 described above with reference to FIG. 6 and may include the same material or a similar material.

In an embodiment, the first initialization voltage connection line VL1-L and the driving voltage connection line PL-L may be on the fifth insulating layer 317. The first initialization voltage connection line VL1-L and the driving voltage connection line PL-L may be on a same layer as the first connection electrode CNE1 described above with reference to FIG. 6 and may include the same material or a similar material. In an embodiment, the first initialization voltage connection line VL1-L may at least partially overlap the first data connection line DLa-L and the second data connection line DLb-L therebelow. Because the first initialization voltage connection line VL1-L at least partially overlaps the first data connection line DLa-L and the second data connection line DLb-L therebelow, the size (or area) of the second line area BL2 may be reduced and the size (or area) of the transmission area BT may be increased. Therefore, the transmittance of the first area A1 including the transmission area BT may be improved.

In an embodiment, the driving voltage connection line PL-L may at least partially overlap the third data connection line DLc-L and the fourth data connection line DLd-L therebelow. Because the driving voltage connection line PL-L at least partially overlaps the third data connection line DLc-L and the fourth data connection line DLd-L therebelow, the size (or area) of the second line area BL2 may be reduced and the size (or area) of the transmission area BT may be increased. Therefore, the transmittance of the first area A1 including the transmission area BT may be improved.

In an embodiment, the second initialization voltage connection line VL2-L may be on the first organic insulating layer 318. In an embodiment, the second initialization voltage connection line VL2-L may at least partially overlap the second data connection line DLb-L and the third data connection line DLc-L therebelow. Because the second initialization voltage connection line VL2-L may at least partially overlap the second data connection line DLb-L and the third data connection line DLc-L therebelow, the size (or area) of the second line area BL2 may be reduced and the size (or area) of the transmission area BT may be increased. Therefore, the transmittance of the first area A1 including the transmission area BT may be improved.

In an embodiment, instead of the pixel defining layer 323, a black matrix 360 may be on the second line area BL2. In an embodiment, the black matrix 360 may be on the third sensing insulating layer 355. In an embodiment, the black matrix 360 may at least partially overlap (or completely overlap) the connection lines and the lines therebelow.

Because the black matrix 360 at least partially overlaps (or completely overlaps) the connection lines and the lines therebelow, the reflection of external light may be prevented to improve the contrast of the display apparatus, and the resolution of light received by the camera module CMM may be increased to improve the characteristics of the camera module CMM.

In the display apparatus according to an embodiment, the signal lines and/or the voltage lines on the display area BA are connected to the connection lines on the line area BL by using bridge metals, the size (or area) of the line area BL may be reduced and the size (or area) of the transmission area BT may be increased. Therefore, the transmittance of the first area A1 including the transmission area BT may be improved.

Although FIGS. 1 to 14 illustrate that the color filter 370 may be arranged over the black matrix 360, but the disclosure is not limited thereto. For example, a reflection control layer may be arranged over the black matrix 360. The reflection control layer may selectively absorb light of a certain band among pieces of light reflected from the inside of the display panel and/or the electronic device or pieces of light incident from the outside of the display panel and/or the electronic device.

FIGS. 6 and 7 illustrate that the color filter 370 may be located (or arranged) in the second opening 360OP defined in the black matrix 360, but the disclosure is not limited thereto. For example, the reflection control layer may be located (or arranged) in the second opening 360OP defined in the black matrix 360.

For example, the reflection control layer may absorb a first wavelength band of about 490 nm to about 505 nm and a second wavelength band of about 585 nm to about 600 nm, so that light transmittance in the first wavelength band and the second wavelength band is about 40% or less. The reflection control layer may absorb light of wavelengths out of the wavelength ranges of red light, green light, and blue light respectively emitted from the first display element, the second display element, and the third display element. Because the reflection control layer absorbs light of wavelengths that do not belong to the wavelength ranges the red light, the green light, and the blue light emitted from the display elements, the reduction in the luminance of the display panel and/or the electronic device may be prevented or minimized. Also, the reduction in the luminescence efficiency of the display panel and/or the electronic device may be prevented or minimized, and the visibility of the display panel and/or the electronic device may be improved.

The reflection control layer may include an organic material layer including a dye, a pigment, and/or any combination thereof. The reflection control layer may include a tetraazaporphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, a xanthene-based compound, a diimmonium-based compound, a dipyrromethene-based compound, a cyanine-based compound, and/or any combination thereof.

In an embodiment, the reflection control layer may have a transmittance of about 64% to about 72%. The transmittance of the reflection control layer may be controlled according to the amount of the pigment and/or the dye included in the reflection control layer. The reflection control layer overlaps the display elements in a plan view, but does not overlap the transmission area BT in a plan view. In a plan view, the transmission area BT may overlap the overcoat layer 380 without overlapping the reflection control layer.

According to the embodiment including the reflection control layer, a capping layer and a low reflection layer may be additionally between the opposite electrode 333 and the thin film encapsulation layer 340.

Due to the principle of constructive interference, the capping layer may improve the luminescence efficiency of the display element. The capping layer may include, for example, a material having a refractive index of about 1.6 or greater for light having a wavelength of about 589 nm.

The capping layer may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, porphine derivatives, phthalocyanine derivatives, naphthalocyanine derivatives, an alkali metal complex, an alkaline earth metal complex, and/or any combination thereof. The carbocyclic compound, the heterocyclic compound, and the amine group-containing compound may optionally be substituted with substituents including O, N, S, Se, Si, F, Cl, Br, I, and/or any combination thereof.

The low reflection layer may be on the capping layer. The low reflection layer may include an inorganic material having low reflectance. In an embodiment, the low reflection layer may include a metal or a metal oxide. When the low reflection layer includes a metal, the low reflection layer may include, for example, ytterbium (Yb), bismuth (Bi), cobalt (Co), molybdenum (Mo), titanium (Ti), zirconium (Zr), aluminum (Al), chromium (Cr)), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and/or any combination thereof. Also, when the low reflection layer includes a metal oxide, the low reflection layer may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, and/or any combination.

In an embodiment, the inorganic material included in the low reflection layer may have an absorption coefficient (k) of greater than 0.5 and less than or equal to 4.0 (0.5<k≤4.0). Also, the inorganic material included in the low reflection layer may have a refractive index (n) of 1 or more (n>1.0).

The low reflection layer induces destructive interference between light incident on the display panel and/or the electronic device and light reflected from the metal below the low reflection layer, so that external light reflectance may be reduced. Therefore, the display quality and visibility of the display panel and/or the electronic device may be improved.

In some embodiments, the capping layer may be omitted and the low reflection layer may be in contact with the opposite electrode 333.

According to one or more embodiments, even in case that the electronic module is arranged or disposed to overlap the active area, the electronic device in which the performance of the electronic module is improved may be provided. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. An electronic device comprising:
a housing including a rear side and a lateral side;
a cover window disposed above the housing;
a display apparatus disposed below the cover window; and
a camera module disposed below the display apparatus,
wherein the display apparatus comprises:
  a substrate comprising a first area and a second area adjacent to the first area, the first area comprising a line area, a display area, and a transmission area, the line area comprising a first line area extending in a first direction and a second line area extending in a second direction intersecting the first direction;
  a pixel circuit disposed on the display area of the first area;
  a first signal line disposed on the display area of the first area and transmitting a first signal to the pixel circuit;
  a first connection line disposed on the first line area of the first area and electrically connected to the first signal line, the first connection line and the first signal line being disposed on different layers;
  a first bridge metal that electrically connects the first signal line to the first connection line;
  a second signal line disposed on the display area of the first area and transmitting a second signal to the pixel circuit;
  a second connection line disposed on the first line area of the first area and electrically connected to the second signal line, the second connection line and the second signal line being disposed on different layers; and
  a second bridge metal that electrically connects the second signal line to the second connection line,
wherein the first connection line and the second connection line at least partially overlap each other in a third direction perpendicular to the substrate.

2. The electronic device of claim 1, further comprising:
a third signal line disposed on the display area of the first area and transmitting a third signal to the pixel circuit; and
a third connection line disposed on the first line area of the first area and electrically connected to the third signal line, the third connection line and the third signal line being disposed on a same layer.

3. The electronic device of claim 1, further comprising:
a data line disposed on the display area of the first area and transmitting a data signal to the pixel circuit; and
a data connection line disposed on the second line area of the first area and electrically connected to the data line, the data connection line and the data line being disposed on different layers.

4. The electronic device of claim 3, wherein the data line and the data connection line are electrically connected to each other by a third bridge metal.

5. The electronic device of claim 3, further comprising:
a voltage line disposed on the display area of the first area and transmitting a voltage to the pixel circuit; and
a voltage connection line disposed on the second line area of the first area and electrically connected to the voltage line.

6. The electronic device of claim 5, wherein the data connection line and the voltage connection line at least partially overlap each other in the third direction.

7. The electronic device of claim 5, further comprising:
a first thin-film transistor disposed on the substrate, the first thin-film transistor comprising:
   a first semiconductor layer including a silicon semiconductor; and
   a first gate electrode insulated from the first semiconductor layer;
an upper electrode insulated from the first gate electrode;
an insulating layer overlapping the upper electrode in the third direction;
a second thin-film transistor disposed on the insulating layer, the second thin-film transistor comprising:
   a second semiconductor layer including an oxide semiconductor; and
   a second gate electrode insulated from the second semiconductor layer;
a first connection electrode disposed on the second gate electrode; and
a second connection electrode disposed on the first connection electrode.

8. The electronic device of claim 7, wherein the first signal line, the second signal line, and at least one of the first gate electrode, the upper electrode, and the second gate electrode are disposed on a same layer.

9. The electronic device of claim 7, wherein the data line, the voltage line, and at least one of the first connection electrode and the second connection electrode are disposed on a same layer.

10. The electronic device of claim 7, wherein
the first connection line and the second connection line extend in the first direction, and
the data connection line and the voltage connection line extend in the second direction.

11. The electronic device of claim 1, further comprising:
a light blocking layer disposed on the display area, the first line area, and the second line area of the first area, wherein the light blocking layer comprises a first hole corresponding to the transmission area.

12. The electronic device of claim 11, wherein an edge of the light blocking layer forming the first hole comprises concave portions.

13. The electronic device of claim 11, further comprising:
a light-emitting element disposed on the display area of the first area;
a pixel defining layer disposed on the display area of the first area and forming an emission area of the light-emitting element; and
a black matrix disposed on the display area, the first line area, and the second line area of the first area.

14. The electronic device of claim 13, wherein the black matrix comprises a second hole corresponding to the transmission area.

15. The electronic device of claim 13, wherein
the light blocking layer is disposed below the first connection line, and
the black matrix is disposed above the first connection line.

16. A display apparatus comprising:
a substrate comprising a first area and a second area adjacent to the first area, the first area comprising a line area, a display area, and a transmission area, the line area comprising a first line area extending in a first direction and a second line area extending in a second direction intersecting the first direction;
a pixel circuit disposed on the display area of the first area;
a first signal line disposed on the display area of the first area and transmitting a first signal to the pixel circuit;
a first connection line disposed on the first line area of the first area and electrically connected to the first signal line, the first connection line and the first signal line being disposed on different layers;
a first bridge metal that electrically connects the first signal line to the first connection line;
a second signal line disposed on the display area of the first area and transmitting a second signal to the pixel circuit;
a second connection line disposed on the first line area of the first area and electrically connected to the second signal line, the second connection line and the second signal line being disposed on different layers; and
a second bridge metal that electrically connects the second signal line to the second connection line,
wherein the first connection line and the second connection line at least partially overlap each other in a third direction perpendicular to the substrate.

17. The display apparatus of claim 16, further comprising:
a third signal line disposed on the display area of the first area and transmitting a third signal to the pixel circuit; and
a third connection line disposed on the first line area of the first area and electrically connected to the third signal line, the third connection line and the third signal line being disposed on a same layer.

18. The display apparatus of claim 16, further comprising:
a data line disposed on the display area of the first area and transmitting a data signal to the pixel circuit; and
a data connection line disposed on the second line area of the first area and electrically connected to the data line, the data connection line and the data line being disposed on different layers.

19. The display apparatus of claim 18, wherein the data line and the data connection line are electrically connected to each other by a third bridge metal.

20. The display apparatus of claim 18, further comprising:
a voltage line disposed on the display area of the first area and transmitting a voltage to the pixel circuit; and
a voltage connection line disposed on the second line area of the first area and electrically connected to the voltage line.

21. The display apparatus of claim 20, wherein the data connection line and the voltage connection line at least partially overlap each other in the third direction.

22. The display apparatus of claim 20, further comprising:
a first thin-film transistor disposed on the substrate, the first thin-film transistor comprising:
  a first semiconductor layer including a silicon semiconductor; and
  a first gate electrode insulated from the first semiconductor layer;
an upper electrode insulated from the first gate electrode;
an insulating layer overlapping the upper electrode in the third direction;
a second thin-film transistor disposed on the insulating layer, the second thin-film transistor comprising:
  a second semiconductor layer including an oxide semiconductor; and
  a second gate electrode insulated from the second semiconductor layer;
a first connection electrode disposed on the second gate electrode; and
a second connection electrode disposed on the first connection electrode.

23. The display apparatus of claim 22, wherein the first signal line, the second signal line, and at least one of one of the first gate electrode, the upper electrode, and the second gate electrode are disposed on a same layer.

24. The display apparatus of claim 22, wherein the data line, the voltage line, and at least one of the first connection electrode and the second connection electrode are disposed on a same layer.

25. The display apparatus of claim 22, wherein
the first connection line and the second connection line extend in the first direction, and
the data connection line and the voltage connection line extend in the second direction.

26. The display apparatus of claim 16, further comprising:
a light blocking layer disposed on the display area, the first line area, and the second line area of the first area,
wherein the light blocking layer comprises a first hole corresponding to the transmission area.

27. The display apparatus of claim 26, wherein an edge of the light blocking layer forming the first hole comprises convex portions.

28. The display apparatus of claim 27, further comprising:
a light-emitting element disposed on the display area of the first area;
a pixel defining layer disposed on the display area of the first area and forming an emission area of the light-emitting element; and
a black matrix disposed on the display area, the first line area, and the second line area of the first area.

29. The display apparatus of claim 28, wherein the black matrix comprises a second hole corresponding to the transmission area.

30. The display apparatus of claim 28, wherein
the light blocking layer is disposed below the first connection line, and
the black matrix is disposed above the first connection line.

* * * * *